(12) United States Patent
Shimaoka et al.

(10) Patent No.: US 7,697,317 B2
(45) Date of Patent: Apr. 13, 2010

(54) NONVOLATILE SEMICONDUCTOR MEMORY DEVICE

(75) Inventors: Atsushi Shimaoka, Kashihara (JP); Hidechika Kawazoe, Kitakatsuragi-gun (JP); Yukio Tamai, Tsuchiura (JP)

(73) Assignee: Sharp Kabushiki Kaisha, Osaka (JP)

( * ) Notice: Subject to any disclaimer, the term of this patent is extended or adjusted under 35 U.S.C. 154(b) by 131 days.

(21) Appl. No.: 11/913,490

(22) PCT Filed: Apr. 26, 2006

(86) PCT No.: PCT/JP2006/308730

§ 371 (c)(1),
(2), (4) Date: Nov. 2, 2007

(87) PCT Pub. No.: WO2006/120903

PCT Pub. Date: Nov. 16, 2006

(65) Prior Publication Data

US 2009/0046495 A1    Feb. 19, 2009

(30) Foreign Application Priority Data

May 11, 2005  (JP) .............................. 2005-138886
Mar. 6, 2006  (JP) .............................. 2006-059057

(51) Int. Cl.
*G11C 11/00* (2006.01)
*G11C 11/14* (2006.01)
*G11C 11/15* (2006.01)

(52) U.S. Cl. ...................... 365/148; 365/158; 365/163; 365/171; 365/173

(58) Field of Classification Search ................ 365/148, 365/158, 163, 171, 173
See application file for complete search history.

(56) References Cited

U.S. PATENT DOCUMENTS

| 6,204,139 B1 | 3/2001 | Liu et al. |
| 6,259,644 B1 | 7/2001 | Tran et al. |
| 6,888,773 B2 * | 5/2005 | Morimoto .................. 365/148 |

(Continued)

FOREIGN PATENT DOCUMENTS

JP    2002-8369    1/2002

(Continued)

OTHER PUBLICATIONS

International Search Report dated Jul. 11, 2006.

(Continued)

*Primary Examiner*—Trong Phan
(74) *Attorney, Agent, or Firm*—Nixon & Vanderhye P.C.

(57) ABSTRACT

A nonvolatile semiconductor storage device is provided with a memory cell selecting circuit which selects a selected memory cell from a memory cell array; and a write voltage applying circuit, which applies a row write voltage and a column write voltage to a selected word line and a selected bit line, respectively, and applies a row write blocking voltage and a column write blocking voltage to an unselected word line and an unselected bit line, respectively, and applies a write voltage sufficient for writing only on both ends of the selected memory cell. The write voltage applying circuit applies a write compensating voltage, which has a polarity opposite to that of the voltage applied on the both ends of the unselected memory cells other than the selected memory cell, on both ends of the unselected memory cells, while the write voltage is applied to the selected memory cell.

25 Claims, 28 Drawing Sheets

U.S. PATENT DOCUMENTS

| | | | |
|---|---|---|---|
| 6,995,999 B2 * | 2/2006 | Morimoto | 365/148 |
| 7,236,388 B2 * | 6/2007 | Hosoi et al. | 365/148 |
| 7,259,387 B2 * | 8/2007 | Kawazoe et al. | 365/148 |
| 7,433,222 B2 * | 10/2008 | Hosoi et al. | 365/148 |
| 7,511,986 B2 * | 3/2009 | Horii et al. | 365/148 |
| 2004/0257864 A1 | 12/2004 | Tamai et al. | |

FOREIGN PATENT DOCUMENTS

| | | |
|---|---|---|
| JP | 2005-032401 | 2/2005 |

OTHER PUBLICATIONS

Liu et al.: "Electric-pulse-induced reversible resistance change effect in magnetoresistive films," American Institute of Physics, Applied Physics Letters, vol. 76, No. 19, pp. 2749-2751, May 8, 2000.

Chen et al.: "An Access-Transistor-Free (0T/1R) Non-Volatile Resistance Random Access Memory (RRAM) Using a Novel Threshold Switching, Self-Rectifying Chalcogenide Device," IEEE, 4 pages, 2003.

* cited by examiner

NONVOLATILE SEMICONDUCTOR MEMORY DEVICE

CROSS-REFERENCE TO RELATED APPLICATIONS

This application is the U.S. national phase of international application PCT/JP2006/308730 filed on Apr. 26, 2006, which designated the U.S. and claims priority to JP 2005-138886 filed on May 11, 2005 and JP 2006-059057 filed on Mar. 6, 2006, the entire content of each of which is hereby incorporated by reference.

TECHNICAL FIELD

The present disclocure relates to a semiconductor memory device having a cross-point type memory cell array in which memory cells each having a variable resistance element storing information by the change of an electric resistance are arranged in a row direction and column direction, and more particularly to a technique for preventing and restricting stored data deterioration due to programming and erasing actions for the memory cell array.

BACKGROUND ART

Recently, as a next generation NVRAM (Nonvolatile Random Access Memory) capable of performing a high-speed operation to replace a flash memory, various devices such as a FeRAM (Ferroelectric RAM), an MRAM (Magnetic RAM), and an OUM (Ovonic Unified Memory) have been proposed and they are being developed competitively in view of implementing high performance, high reliability, low cost and process consistency.

In addition, based on these existing techniques, a method of changing electric resistance reversibly by applying a voltage pulse to the perovskite material known for a super colossal magnetoresistance effect is disclosed by Shangquing Liu, Alex Ignatiev et al. in University of Houston, in the following Patent Document 1 and Non-patent Document 1. This is extremely innovative because resistance change over several digits can be implemented at a room temperature without applying an electric field while using the perovskite material known for the super colossal magnetoresistance effect. A resistance nonvolatile RRAM (Resistance Random Access Memory: RRAM is a registered trademark of Sharp Corporation) using a variable resistance element and employing this phenomenon is extremely low in power consumption because it does not need a magnetic field at all unlike the MRAM and easy to be miniaturized and highly integrated and has a considerably large dynamic range of the resistance change as compared with the MRAM, so that it has excellent characteristics such that multilevel storage can be implemented. The basic structure in an actual device is considerably simple such that a lower electrode material, a perovskite-type metal oxide, and an upper electrode material are laminated in this order on a substrate in the vertical direction. In addition, according to the element structure illustrated in Patent Document 1, the lower electrode material is yttrium-barium-copper oxide $YBa_2Cu_3O_7$ (YBCO) film deposited on a single-crystal substrate of lanthanum-aluminum oxide $LaAlO_3$ (LAO), the Perovskite-type metal oxide is a crystalline praseodymium-calcium-manganese oxide $Pr_{1-x}Ca_xMnO_3$ (PCMO) film, and the upper electrode material is an Ag film deposited by sputtering. According to the action of the memory element, it is reported that the resistance can be reversibly changed by applying positive and negative voltage pulse of 51 volts between the upper and lower electrodes. The novel nonvolatile semiconductor memory device is implemented by reading the resistance value in this reversible resistance changing action (referred to as the "switching action" occasionally hereinafter).

A nonvolatile semiconductor memory device is constituted such that a memory cell array in which memory cells comprising a variable resistance element consisting of the PCMO film and the like and storing information by the change of the electric resistance of the variable resistance element are arranged in a row direction and column direction like a matrix is formed, and circuits for controlling data programming, erasing and reading for each memory cell in the memory cell array are disposed in the periphery of the memory cell array.

As the constitution of the memory cell comprising the variable resistance element, there is a case where each memory cell comprises a series circuit in which a variable resistance element and a selection transistor are connected in series, and a case where each memory cell comprises only a variable resistance element. The former memory cell is referred to as the 1T/1R type memory cell and the latter memory cell is referred to as the 1R type memory cell. In addition, the memory cell array comprising the 1R type memory cells is referred to as the cross-point type memory cell array.

A constitution example in which the cross-point type memory cell array is formed with the 1R type memory cells to provide a large capacity nonvolatile semiconductor memory device will be described with reference to the drawings hereinafter.

As shown in FIG. 1, a memory cell 2 comprises a variable resistance element 1 only and a cross-point type memory cell array 3 is constituted by arranging the 1R type memory cells 2 like a matrix, and this is the same constitution as disclosed in the following patent document 2. More specifically the memory cell array 3 is constituted such that (m×n) memory cells 2 are disposed at intersections of m (BL1 to BLm) bit lines extending in the column direction and n (WL1 to WLn) word lines extending in the row direction. According to each memory cell 2, the upper electrode of the variable resistance element 1 is connected to the word line, and the lower electrode of the variable resistance element 1 is connected to the bit line. In addition, the relation between the upper electrode and the lower electrode of the variable resistance element 1 may be reversed such that the lower electrode of the variable resistance element 1 is connected to the word line and the upper electrode of the variable resistance element 1 is connected to the bit line.

FIG. 2 shows one constitution example of a nonvolatile semiconductor memory device comprising the cross-point type memory cell array 3. A specific memory cell in the memory cell array 3 corresponding to an address inputted from an address line 9 to a control circuit 6 is selected by a bit line decoder 4 and a word line decoder 5 and each memory action such as data programming, erasing and reading is performed for the memory cell, so that data is stored in the selected memory cell and read from it. The data is inputted or outputted to and from an external device (not shown) through a data line 10.

The word line decoder 5 selects the word line of the memory cell array 3 according to a signal inputted to the address line 9. The bit line decoder 4 selects the bit line of the memory cell array 3 according to an address signal inputted to the address line 9. The control circuit 6 controls each memory action such as programming, erasing and reading for the memory cell array 3.

The control circuit 6 controls the word line decoder 5, the bit line decoder 4, a voltage switch circuit 7, and the programming, erasing and reading action of the memory cell array 3, based on the address signal inputted from the address line 9, a data input (at the time of programming) inputted from the data line 10, and a control input signal inputted from a control signal line 11. In the example shown in FIG. 2, the control circuit 6 is provided with a function as a general address buffer circuit, data input/output buffer circuit, and control input buffer circuit though they are not shown.

The voltage switch circuit 7 switches each voltage of the word line and bit line required for the reading action, programming action and erasing action of the memory cell array 3 according to an action mode and supplies it to the memory cell array 3. Here, reference character Vcc designates a power supply voltage of the nonvolatile semiconductor memory device of the present invention, reference character Vss designates the ground voltage, reference character Vr designates a reading voltage, reference character Vp designates a programming supply voltage (programming voltage) and reference character Ve designates an erasing supply voltage (erasing voltage is –Ve). In addition, the data reading is carried out from the memory cell array 3 through the bit line decoder 4 and the reading circuit 8. The reading circuit 8 determines the state of the data and transfers its result to the control circuit 6 to be outputted to the data line 10.

In the memory cell array comprising the 1T/1R type memory cells, when a memory cell for which the data reading, programming and erasing is performed is selected, a predetermined bias voltage is applied to a selected word line and a selected bit line to turn on the selection transistor in the selected memory cell connected to both selected word line and selected bit line, so that a reading and programming/erasing current flows in only the variable resistance element in the selected memory cell.

Meanwhile, according to the memory cell array 3 comprising the 1R type memory cells 2, when a memory cell for which the data reading is performed is selected, since the same bias voltage is applied also to memory cells connected to the word line and bit line shared with the memory cell to be read, the reading current flows in other memory cells. The reading current flowing in the selected memory cells selected by the row or column is detected as the reading current of the memory cell to be read by column selection or row selection. According to the memory cell array 3 comprising the 1R type memory cells 2, although the reading current also flows in the memory cells other than the memory cell to be read, it has advantages that its memory cell structure is simple and a memory cell area and memory cell array area are small.

FIGS. 1 and 3 show a conventional example of a process in which a voltage is applied to each part at the time of data reading action in the memory cell array 3 comprising the 1R type memory cells 2. When the data of the selected memory cell is read, the selected word line connected to the selected memory cell is kept at the ground potential Vss and a reading voltage Vr is applied to unselected word lines and all the bit lines during a reading period Tr. During the reading period Tr, since the voltage difference of the reading voltage Vr is generated between the selected word line and all the bit lines, a reading current corresponding to its electric resistance, that is, its memory state flows in the variable resistance element of the selected memory cell, so that the data stored in the selected memory cell can be read. In this case, since the reading current corresponding to the memory state of the selected memory cell connected to the selected word line flows in each bit line, when the reading current flowing in a certain selected bit line is selectively read on the bit line side, the data in the specific selected memory cell can be read. Here, the relation of the bit line and the word line may be switched such that the reading current flowing in each word line is selectively read on the word line side.

FIGS. 4 and 5 show a conventional example of a process in which a voltage is applied to each part in the memory cell array 3 comprising the 1R type memory cells 2 at the time of data programming action. In addition, FIGS. 6 and 7 show a conventional example of a process in which a voltage is applied to each part in the memory cell array 3 comprising the 1R type memory cells 2 at the time of data erasing action. In addition, the following non-patent document 2 discloses a specific voltage bias condition applied to the word line and bit line at the time of data reading action and data programming action for the cross-point type memory cell array.

As shown in FIGS. 4 and 5, when data is programmed in a selected memory cell M0, while the selected word line connected to the selected memory cell is kept at the ground potential Vss, a programming blocking voltage Vp/2 is applied to the unselected word lines and unselected bit lines and the programming voltage Vp is applied to the selected bit line in the programming period Tp.

In the programming period Tp, the voltage difference of the programming voltage Vp is generated between the selected bit line and the selected word line, so that the resistance of the variable resistance element of the selected memory cell is changed. In addition, at the time of programming action of the selected memory cell, the voltage Vp/2 that is the half of the programming voltage Vp is applied to each variable resistance element of the first unselected memory cells M1 connected to the word line shared with the selected memory cell, and the second unselected memory cells M2 connected to the bit line shared with the selected memory cell for the programming period Tp.

When data is erased from the selected memory cell M0, the voltage having the opposite polarity to that in the programming is applied to the variable resistance element of the selected memory cell M0. As shown in FIGS. 6 and 7, while the selected bit line connected to the selected memory cell is kept at the ground potential Vss, an erasing blocking voltage (–Ve/2) is applied to the unselected bit lines and the unselected word lines and the erasing voltage (–Ve) is applied to the selected word line in the erasing period Te.

In the erasing period Te, the voltage difference of the erasing voltage Ve is generated between the selected bit line and the selected word line, so that the resistance of the variable resistance element of the selected memory cell is changed. In addition, at the time of erasing action of the selected memory cell, the voltage (–Ve/2) that is the half of the erasing voltage (–Ve) is applied to each variable resistance element of the first unselected memory cells M1 connected to the word line shared with the selected memory cell, and the second unselected memory cells M2 connected to the bit line shared with the selected memory cell for the erasing period Te.

Here, the relation between the bit line and the word line may be exchanged in the programming action and the erasing action.

The variable resistance element constituting the 1R type memory cell includes a phase-change memory element in which a resistance value is changed by the change in crystalline/amorphous state of chalcogenide compound, an MRAM element using a resistance change by a tunnel magnetic resistance effect, a memory element of a polymer ferroelectric RAM (PFRAM) in which a resistance element is formed of a conductive polymer, a RRAM element causing a resistance change by an electric pulse application and the like.

Patent document 1 U.S. Pat. No. 6,204,139

Patent document 2 Japanese Unexamined Patent Publication No. 2002-8369

Non-patent document 1: Liu, S. Q. et al. "Electric-pulse-induced reversible Resistance change effect in magnetoresistive films", Applied Physics Letter, Vol. 76, pp. 2749-2751, in 2000.

Non-patent document 2: Y. Chen et al. "An Access-Transistor-Free (0T/1R) Non-Volatile Resistance Random Access Memory (RRAM) Using a Novel Threshold Switching, Self-Rectifying Chalcogenide Device", IEDM Technical Digest, Session 37, in 2003.

When data programming or erasing is performed for the cross-point type memory cell array comprising the 1R type memory cell having the variable resistance element, a bias voltage is applied to the variable resistance element of the selected memory cell to change its resistance to perform the programming or erasing. In this case, the voltage that is the half of the programming voltage or erasing voltage is applied to each variable resistance element of the unselected memory cells connected to the bit line shared with the selected memory cell and the unselected memory cells connected to the word line shared with the selected memory cell. The voltage that is the half of the programming voltage or erasing voltage is generated when the programming blocking voltage or the erasing blocking voltage is applied to the unselected word lines and unselected bit lines so that the programming voltage or erasing voltage is not directly applied to the unselected memory cells in order to prevent programming or erasing in the unselected memory cells for which the programming or erasing is not to be performed. That is, in order to prevent programming or erasing in the unselected memory cells, a low voltage that is insufficient for the programming or erasing action is applied.

However, the inventors of this disclosure have found that in the case where the PCMO film ($Pr_{1-x}Ca_xMnO_3$) that is one of the Perovskite type metal oxide is used as the variable resistance element, when a voltage pulse having a voltage magnitude that is not more than the half of the programming voltage and the same polarity as the programming voltage is continuously applied to the variable resistance elements of the unselected memory cells, as the number of applications is increased, the resistance value of the variable resistance element is gradually changed. That is, it means that while the programming action or the erasing action is repeated in the cross-point type memory cell array unexpected error programming or error erasing is generated (this phenomenon is referred to as the "programming disturbance" or "erasing disturbance" hereinafter) in the unselected memory cells other than the memory cell in which the programming or erasing is performed.

FIG. 8 shows the behavior of the resistance change when five kinds of voltage pulses having different voltage magnitudes, voltage polarities, applying methods are applied to the variable resistance element whose initial state is in a high resistance state. As shown in FIG. 8, when a voltage pulse having a positive polarity (whose pulse width is 100 ns) is continuously applied to the upper electrode of the variable resistance element (shown by a curved line pointed by arrow A), the resistance value of the variable resistance element whose initial state was in the high resistance state is reduced as the number of pulse applications is increased. In addition, when a voltage pulse having a negative polarity (whose pulse width is 100 ns) is continuously applied (shown by a curved line pointed by arrow B), the resistance value of the variable resistance element whose initial state was in the high resistance state is increased as the number of pulse applications is increased. In addition, as for the voltage pulse having the negative polarity, although the resistance value tends to be increased as the number of pulse applications is increased, since the fact that the high resistance state further becomes high resistance state means that the difference from the low resistance state becomes great, this is no problem in view of characteristics. Meanwhile, the problem is that the resistance value is decreased when the voltage pulse having the positive polarity is applied. In FIG. 8, the curved line A designates the application of the voltage pulse having the positive polarity whose voltage magnitude is the half of the programming voltage, and the curved line B designates the application of the voltage pulse having the negative polarity whose voltage magnitude is the half of the programming voltage.

Here, the voltage pulse having the positive polarity means the state in which the reference ground voltage is applied to the lower electrode and a positive voltage pulse (having a voltage magnitude of 1V, for example) is applied to the upper electrode. In addition, the voltage pulse having the negative polarity means the state in which the reference ground voltage is applied to the upper electrode and a positive voltage pulse (having a voltage magnitude of 1V, for example) is applied to the lower electrode. Furthermore, the measuring condition of the resistance value shown in FIG. 8 has been calculated from a current value when the reference ground voltage is applied to the lower electrode and 0.5V is applied to the upper electrode. In addition, the horizontal axis in FIG. 8 designates the relative number of applications of the voltage pulse in a logarithmic manner.

FIG. 9 shows the behavior of the resistance change when six kinds of voltage pulses having different voltage magnitudes, voltage polarities, and application methods are applied to the variable resistance element whose initial state is in the low resistance state. In addition, the measuring condition of the resistance value shown in FIG. 9 has been calculated from the current value when the reference ground voltage is applied to the lower electrode and 0.5V is applied to the upper electrode. In addition, the horizontal axis in FIG. 9 designates the relative number of applications of the voltage pulse in a logarithmic manner. As shown in FIG. 9, it can be seen that when the initial state is the low resistance state, the resistance change is small as compared with the case where the initial state is the high resistance state. In FIG. 9, a curved line A designates the application of a voltage pulse having a positive polarity whose voltage magnitude is one fourth of the programming voltage, and a curved line B designates the application of a voltage pulse having a positive polarity whose voltage magnitude is the half of the programming voltage.

As a result, it has become clear that the programming disturbance phenomenon in which the resistance state is changed from the initial state in accordance with the number of applications is caused because the voltage pulse whose voltage magnitude is the half of the programming voltage or less and polarity is the same is applied to each variable resistance element of the unselected memory cells connected to the bit line shared with the selected memory cell, and the unselected memory cells connected to the word line shared with the selected memory cell during the programming period for the selected memory cell. Especially, since the programming disturbance phenomenon is obvious on the variable resistance element whose initial state is high resistance state, the problem that the resistance value of the variable resistance element is decreased and the resistance difference between the high resistance state and the low resistance state becomes small and its reading margin is lowered is raised. In addition, since the repeating frequency of the programming actions at the low voltage for the unselected memory cells is increased in the large capacity memory cell array having many word lines and bit lines, the disturbance is caused frequently, and as the worst case, the stored data is completely erased and it cannot be read. In addition, the same is true in the erasing action.

Especially, when the programming blocking voltage that is the half of the programming voltage or the erasing blocking voltage that is the half of the erasing voltage is applied to the unselected word lines and the unselected bit lines during the programming period or erasing period, since the voltage whose voltage magnitude is the half of the programming voltage or erasing voltage and polarity is the same is applied to each variable resistance element of the unselected memory cells connected to the bit line shared with the selected memory cell, and the unselected memory cells connected to the word line shared with the selected memory cell, the programming disturbance phenomenon becomes more obvious.

In addition, when two kinds of programming blocking voltages that are one third and two thirds of the programming voltage, or two kinds of erasing blocking voltages that are one third and two thirds of the erasing voltage are applied to each of the unselected word lines and unselected bit lines during the programming period or the erasing period, the voltage whose voltage magnitude is one third of the programming voltage or erasing voltage and polarity is the same is applied to each variable resistance element of the unselected memory cells connected to the bit line shared with the selected memory cell, and the unselected memory cells connected to the word line shared with the selected memory cell, and the voltage whose voltage magnitude is one third of the programming voltage or erasing voltage and polarity is opposite is applied to each variable resistance element of the unselected memory cells connected to the word lines and bit lines that are not connected to the selected memory cell. In this case, since the number of third unselected memory cells, to which the voltage having the opposite polarity is applied, is huge in the large capacity memory cell array having many word lines or bit lines, when the programming disturbance phenomenon or the erasing disturbance phenomenon due to the application of the voltage having the opposite polarity could be generated, care should be taken because the application number is large although the applied voltage is as low as one third of the programming voltage or erasing voltage as compared with the case the applied voltage is the half thereof. In addition, the polarity in programming and erasing is changed due to the material, film quality, composition, temperature, structure, programming/erasing time and the like of the variable resistance element in some cases.

One or more aspects of the present invention has been made in view of the above problems and it is an object of one or more aspects to provide a nonvolatile semiconductor memory device in which resistance change in the unselected memory cells due to the programming or erasing action for the cross-point type memory cell array comprising the variable resistance elements is prevented and the reading margin is large.

SUMMARY

A nonvolatile semiconductor memory device according to an embodiment of the present invention to attain the above object has a memory cell array comprises memory cells each having a variable resistance element storing information by the change of an electric resistance and arranged in a row direction and a column direction, and a plurality of row selecting lines extending in the row direction and a plurality of column selecting lines extending in the column direction and provided such that the variable resistance element in each of the memory cells in the same row is connected at one end to the same row selecting line and the variable resistance element in each of the memory cells in the same column is connected at the other end to the same column selecting line, and it is characterized by comprising a memory cell selecting circuit for selecting at least one first row selecting line and at least one first column selecting line from the plurality of row selecting lines and the plurality of column selecting lines, and selecting at least one selected memory cell having one and the other ends connected to the first row selecting line and the first column selecting line, respectively from the memory cell array; and a programming voltage applying circuit for applying a row programming voltage and a column programming voltage to the first row selecting line and the first column selecting line, respectively and applying a row programming blocking voltage and a column programming blocking voltage to the second row selecting lines other than the first row selecting line among the plurality of row selecting lines and second column selecting lines other than the first column selecting line among the plurality of column selecting lines, respectively, to apply a programming voltage sufficient for programming to both ends of the selected memory cell only, wherein the programming voltage applying circuit applies a programming compensating voltage having an opposite polarity to that of a voltage applied to both ends of each of unselected memory cells other than the selected memory cell while the programming voltage is applied to the selected memory cell, to both ends of each of the unselected memory cells.

According to the above nonvolatile semiconductor memory device, since the programming voltage applying circuit can perform the data programming action by applying the programming voltage to the selected memory cell and apply the programming compensating voltage having the polarity opposite to that of the voltage causing programming disturbance and lower than the programming voltage applied at the time of the programming action, to the unselected memory cells, the resistance can be changed in the direction so as to offset the resistance change generated in the unselected memory cells due to the programming action for the selected memory cell and the programming disturbance can be suppressed or eliminated, so that even when the voltage causing the programming disturbance is applied repeatedly to the unselected memory cells, the programming disturbance is prevented from being accumulated and a reading margin is prevented from being reduced. Furthermore, the number of programming actions until the stored data is lost or reading cannot be performed can be considerably improved.

For example, according to the experimental result provided by measuring the resistance change due to the voltage pulse application to the variable resistance element shown in FIG. 8, when the case where only the positive voltage pulses (voltage magnitude: half of the programming voltage and pulse width: 100 ns) to the upper electrode of the variable resistance element continuously (shown by the curved line A) is compared with the case where the positive and negative voltage pulses (voltage magnitude: half of the programming voltage and pulse width: 100 ns) are alternately applied (shown by the curved line C), it can be clearly confirmed that the resistance change is considerably restricted in the case where the positive and negative voltage pulses (the former corresponds to the voltage application in the programming or erasing action, and the latter corresponds to the application of the programming compensating voltage or erasing compensating voltage) are applied, so that the above programming or erasing disturbance restricting effect has been confirmed.

Furthermore, a nonvolatile semiconductor memory device according to an embodiment of the present invention is characterized by comprising an erasing voltage applying circuit for applying a row erasing voltage and a column erasing voltage to the first row selecting line and the first column selecting line, respectively and applying a row erasing blocking voltage and a column erasing blocking voltage to the second row selecting lines and the second column selecting lines, respectively to apply an erasing voltage sufficient for erasing to both ends of the selected memory cell only, wherein the erasing voltage applying circuit applies an erasing compensating voltage having an opposite polarity to that of the voltage applied to both ends of each of unselected memory cells other than the selected memory cell while the erasing voltage is applied to the selected memory cell, to both ends of each of the unselected memory cells.

According to the above nonvolatile semiconductor memory device, since the erasing voltage applying circuit can perform the data erasing action by applying the erasing voltage to the selected memory cell and apply the erasing compensating voltage having the polarity opposite to that of the voltage causing erasing disturbance and lower than the erasing voltage applied at the time of the erasing action, to the unselected memory cells, the resistance can be changed in the direction so as to offset the resistance change generated in the unselected memory cells due to the erasing action for the selected memory cell and the erasing disturbance can be suppressed or eliminated, so that even when the voltage causing the erasing disturbance is applied repeatedly to the unselected memory cells, the erasing disturbance is prevented from being accumulated and the reading margin is prevented from being reduced. Furthermore, the number of erasing actions until the stored data is lost or reading cannot be performed can be considerably improved.

Furthermore, a nonvolatile semiconductor memory device according to an embodiment the present invention is characterized in that the programming voltage applying circuit applies the programming voltage to the selected memory cell and applies the programming compensating voltage to the unselected memory cells in a time-division manner or the erasing voltage applying circuit applies the erasing voltage to the selected memory cell and applies the erasing compensating voltage to the unselected memory cells in a time-division manner in one selected period until the memory cell selecting circuit switches the selection of the memory cell to another selected memory cell.

According to the above nonvolatile semiconductor memory device, since both application of the programming voltage or erasing voltage to the selected memory cell and application of the programming compensating voltage or erasing compensating voltage to the unselected memory cells are performed in the one selected period, the programming disturbance or the erasing disturbance can be surely restricted.

Furthermore, a nonvolatile semiconductor memory device according to an embodiment the present invention is characterized in that the programming voltage applying circuit applies the programming compensating voltage to the unselected memory cells in the one selected period in a time-division manner with respect to each section corresponding to the kind of the row selecting line and the column selecting line connected to the unselected memory cells, or the erasing voltage applying circuit applies the erasing compensating voltage to the unselected memory cells in the one selected period in a time-division manner with respect to each section corresponding to the kind of the row selecting line and the column selecting line connected to the unselected memory cells.

According to the above nonvolatile semiconductor memory device, the programming compensating voltage or the erasing compensating voltage can be effectively and surely applied to the unselected memory cells.

Furthermore, A nonvolatile semiconductor memory device according to an embodiment of the present invention is characterized in that the programming voltage applying circuit applies the programming voltage to the selected memory cell and applies the programming compensating voltage to the unselected memory cells with respect to each of the section in the one selected period by changing the voltages applied to the first row selecting line and the first column selecting line without changing the voltages applied to the second row selecting lines and the second column selecting lines, or the erasing voltage applying circuit applies the erasing voltage to the selected memory cell and applies the erasing compensating voltage to the unselected memory cells with respect to each of the section in the one selected period by changing the voltages applied to the first row selecting line and the first column selecting line without changing the voltages applied to the second row selecting lines and the second column selecting lines.

According to the above nonvolatile semiconductor memory device, since the programming compensating voltage or the erasing compensating voltage can be applied to the unselected memory cells by only changing the voltages applied to the first row selecting line and the first column selecting line, a circuit operation in applying the programming compensating voltage or the erasing compensating voltage can be simplified.

Furthermore, a nonvolatile semiconductor memory device according to an embodiment of the present invention is characterized in that the row programming blocking voltage and the column programming blocking voltage are the same voltage and the middle voltage of the row programming voltage and the column programming voltage, or the row erasing blocking voltage and the column erasing blocking voltage are the same voltage and the middle voltage of the row erasing voltage and the column erasing voltage.

Furthermore, a nonvolatile semiconductor memory device according to an embodiment of the present invention is characterized in that the programming voltage applying circuit executes the application of the programming compensating voltage to the unselected memory cells in the one selected period in a time-division manner by dividing it into the application to the first unselected memory cells each having one and the other ends connected to the first row selecting line and the second column selecting line, respectively, and the application to the second unselected memory cells each having one and the other ends connected to the second row selecting line and the first column selecting line, respectively, or the erasing voltage applying circuit executes the application of the erasing compensating voltage to the unselected memory cells in the one selected period in a time-division manner by dividing it into the application to the first unselected memory cells each having one and the other ends connected to the first row selecting line and the second column selecting line, respectively, and the application to the second unselected memory cells each having one and the other ends connected to the second row selecting line and the first column selecting line, respectively.

According to the above nonvolatile semiconductor memory device, although the voltage causing the programming disturbance or the erasing disturbance is applied to the first unselected memory cells each having one and the other ends connected to the first row selecting line and the second column selecting line, respectively and the second unselected memory cells each having one and the other ends connected to the second row selecting line and the first column selecting line, respectively at the time of programming action or the erasing action for the selected memory cell, since the voltage causing the programming disturbance or the erasing disturbance is not applied to the third unselected memory cells each having one and the other ends connected to the second row selecting line and the second column selecting line, it is not necessary to apply the programming compensating voltage or the erasing compensating voltage to the third unselected memory cells, and the circuit operation in applying the programming compensating voltage or the erasing compensating voltage can be simplified.

Furthermore, a nonvolatile semiconductor memory device according to an embodiment of the present invention is characterized in that the row programming blocking voltage and the column programming blocking voltage are different from each other and are between the row programming voltage and the column programming voltage, or the row erasing blocking voltage and the column erasing blocking voltage are different from each other and are between the row erasing voltage and the column erasing voltage. Especially, it is preferable that one of the row programming blocking voltage and the column programming blocking voltage is higher than the lower one of the row programming voltage and the column programming voltage by one third of the absolute value of the voltage difference between the row programming voltage and the column programming voltage, and the other one of the row programming blocking voltage and the column programming blocking voltage is lower than the higher one of the row programming voltage and the column programming voltage by one third of the absolute value of the voltage difference between the row programming voltage and the column programming voltage, or one of the row erasing blocking voltage and the column erasing blocking voltage is higher than the lower one of the row erasing voltage and the column erasing voltage by one third of the absolute value of the voltage difference between the row erasing voltage and the column erasing voltage, and the other one of the row erasing blocking voltage and the column erasing blocking voltage is lower than the higher one of the row erasing voltage and the column erasing voltage by one third of the absolute value of the voltage difference between the row erasing voltage and the column erasing voltage.

Furthermore, a nonvolatile semiconductor memory device according to an embodiment of the present invention is characterized in that the programming voltage applying circuit executes the application of the programming compensating voltage to the unselected memory cells in the one selected period in a time-division manner by dividing it into the application to the first unselected memory cells each having one and the other ends connected to the first row selecting line and the second column selecting line, respectively, the application to the second unselected memory cells each having one and the other ends connected to the second row selecting line and the first column selecting line, respectively, and the application to the third unselected memory cells each having one and the other ends connected to the second row selecting line and the second column selecting line, respectively, or the erasing voltage applying circuit executes the application of the erasing compensating voltage to the unselected memory cells in the one selected period in a time-division manner by dividing it into the application to the first unselected memory cells each having one and the other ends connected to the first row selecting line and the second column selecting line, respectively, the application to the second unselected memory cells each having one and the other ends connected to the second row selecting line and the first column selecting line, respectively, and the application to the third unselected memory cells each having one and the other ends connected to the second row selecting line and the second column selecting line, respectively.

According to the above nonvolatile semiconductor memory device, although the voltage causing the programming disturbance or the erasing disturbance is applied to all of the first unselected memory cells each having one and the other ends connected to the first row selecting line and the second column selecting line, respectively, the second unselected memory cells each having one and the other ends connected to the second row selecting line and the first column selecting line, respectively, and the third unselected memory cells each having one and the other ends connected to the second row selecting line and the second column selecting line, respectively, at the time of programming action or erasing action for the selected memory cell, since the voltage magnitude of the applied voltage is lowered, the degree of the programming disturbance or the erasing disturbance in the programming action or erasing action can be alleviated.

Furthermore, a nonvolatile semiconductor memory device according to an embodiment of the present invention is characterized in that the absolute value of the programming compensating voltage is the same as that of the voltage applied to both ends of each of the unselected memory cells in accordance with the application of the programming voltage to the selected memory cell and the applying period of the programming voltage to the selected memory cell is equal in length to that of the programming compensating voltage to each of the unselected memory cells, or the absolute value of the erasing compensating voltage is the same as that of the voltage applied to both ends of each of the unselected memory cells in accordance with the application of the erasing voltage to the selected memory cell and the applying period of the erasing voltage to the selected memory cell is equal in length to that of the erasing compensating voltage to each of the unselected memory cells.

Furthermore, a nonvolatile semiconductor memory device according to an embodiment of the present invention is characterized in that the absolute value of the programming compensating voltage is greater than that of the voltage applied to both ends of each of the unselected memory cells in accordance with the application of the programming voltage to the selected memory cell and the applying period of the programming voltage to the selected memory cell is longer than that of the programming compensating voltage to each of the unselected memory cells, or the absolute value of the erasing compensating voltage is greater than that of the voltage applied to both ends of each of the unselected memory cells in accordance with the application of the erasing voltage to the selected memory cell and an applying period of the erasing voltage to the selected memory cell is longer than that of the erasing compensating voltage to each of the unselected memory cells.

According to the above nonvolatile semiconductor memory device, since the cumulative applying time of the applying period of the programming compensating voltage or the erasing compensating voltage is shortened, the programming disturbance or erasing disturbance can be prevented.

Furthermore, a nonvolatile semiconductor memory device according to an embodiment of the present invention is characterized in that the programming voltage applying circuit applies the programming compensating voltage to the unselected memory cells each having one end connected to the first row selecting line and the unselected memory cells each having one end connected to the first column selecting line at the same time, or the erasing voltage applying circuit applies the erasing compensating voltage to the unselected memory cells each having one end connected to the first row selecting line and the unselected memory cells each having one end connected to the first column selecting line at the same time.

Furthermore, a nonvolatile semiconductor memory device according to an embodiment of the present invention is characterized in that the programming voltage applying circuit applies the programming compensating voltage to the unselected memory cells and then applies the programming voltage to the selected memory cell or the erasing voltage applying circuit applies the erasing compensating voltage to the unselected memory cells and then applies the erasing voltage to the selected memory cell in one selected period until the memory cell selecting circuit switches the selection of the selected memory cell to another selected memory cell.

According to the above nonvolatile semiconductor memory device, since the number of applications of the programming compensating voltage or the erasing compensating voltage to the unselected memory cells is reduced, the programming disturbance or the erasing disturbance can be prevented because the applying time is shortened.

Especially, when the row programming blocking voltage and the column programming blocking voltage are the same voltage and the middle voltage between the row programming voltage and the column programming voltage, the row programming blocking voltage applied to the second row selecting lines can be kept at the same voltage and the column programming blocking voltage applied to the second column selecting lines can be kept at the same voltage between the application of the programming compensating voltage and the application of the programming voltage, and when the row erasing blocking voltage and the column erasing blocking voltage are the same voltage and the middle voltage between the row erasing voltage and the column erasing voltage, the row erasing blocking voltage applied to the second row selecting lines can be kept at the same voltage and the column erasing blocking voltage applied to the second column selecting lines can be kept at the same voltage between the application of the erasing compensating voltage and the application of the erasing voltage, so that a circuit operation in applying the programming compensating voltage or the erasing compensating voltage can be simplified.

In addition, according to one or more embodiment of the present invention, when the reading voltage, programming or erasing voltage, or programming or erasing compensating voltage are applied to the variable resistance element, since a current flows in the variable resistance element for the voltage applying period unless the resistance value of the variable resistance element is in a high resistance state infinitely, that is, it is an insulator, the above each voltage application state may be regarded as a current application state.

EXPLANATION OF REFERENCES

Figure 1:
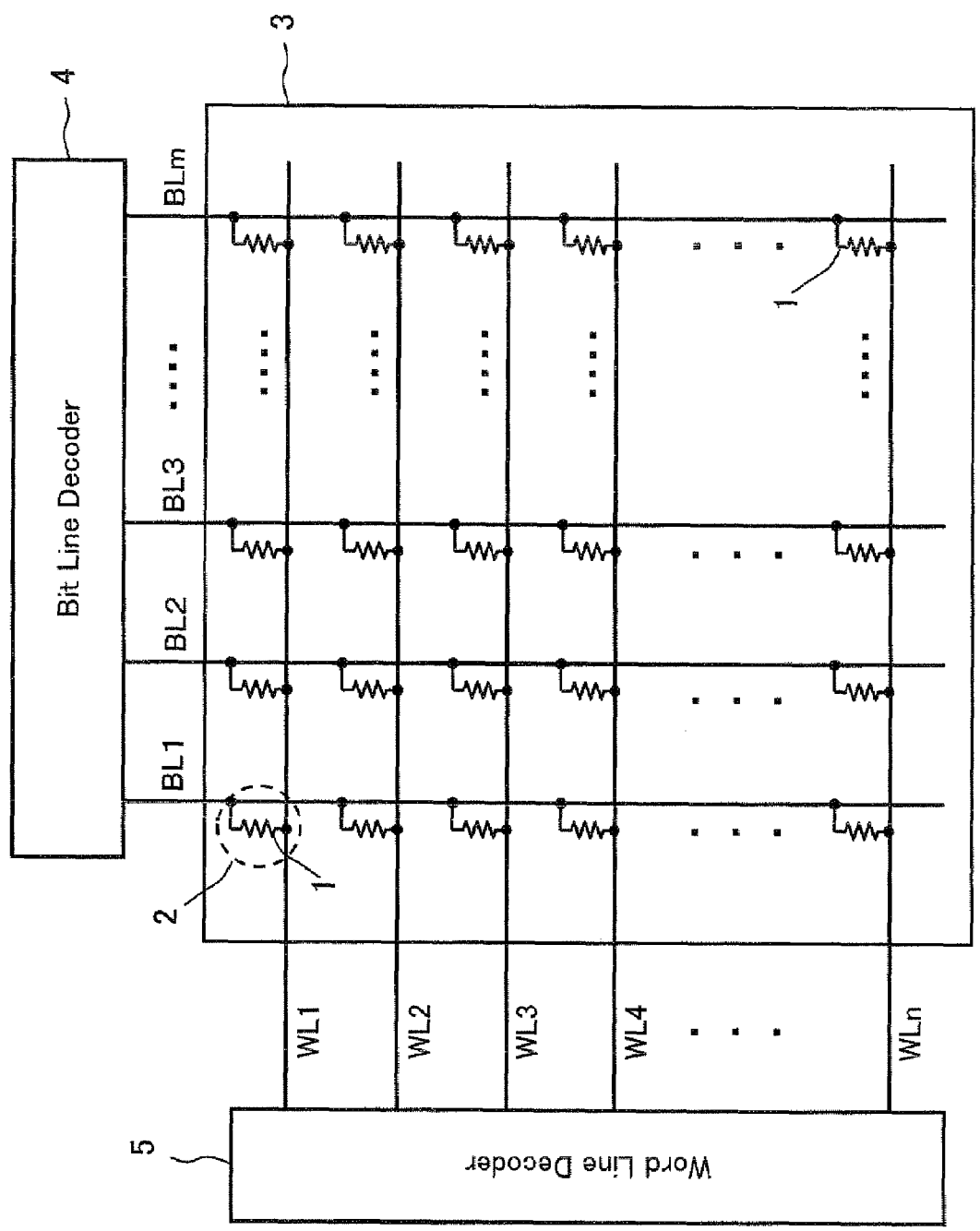
FIG. 1 is a circuit diagram schematically showing one constitution example of a memory cell array comprising a 1R type memory cell consisting of a variable resistance element only.

1: Variable resistance element
2: 1R type memory cell
3: Memory cell array
4: Bit line decoder
5: Word line decoder
6, 6a, 6b, 6c, 6d: Control circuit
7, 7a, 7b, 7c, 7d: Voltage switch circuit
8: Reading circuit
9: Address line
10: Data line
11: Control signal line
M0: Selected memory cell
M1: First unselected memory cells
M2: Second unselected memory cells
M3: Third unselected memory cells
BL1 to BLm: Bit lines (column selecting lines)
BLs: Selected bit line (first column selecting line)
BLu: Unselected bit line (second column selecting line)
WL1 to WLn: Word lines (row selecting lines)
WLs: Selected word line (first row selecting line)
WLu: Unselected word line (second row selecting line)
Vcc: Power supply voltage
Vss: Ground voltage
Vr: Reading voltage
Vp: Programming supply voltage, programming voltage
Ve: Erasing supply voltage, absolute value of erasing voltage
Vp1: Programming compensating supply voltage
Ve1: Erasing compensating supply voltage
Vpc, Vpc', Vpc": Programming compensating voltage
Vec, Vec', Vec": Erasing compensating voltage
Vbls: Voltage applied to selected bit line
Vblu: Voltage applied to unselected bit line
Vwls: Voltage applied to selected word line
Vwlu: Voltage applied to unselected word line
Vm0: Voltage applied to both ends of variable resistance element of selected memory cell
Vm1: Voltage applied to both ends of variable resistance element of first unselected memory cell
Vm2: Voltage applied to both ends of variable resistance element of second unselected memory cell
Vm3: Voltage applied to both ends of variable resistance element of third unselected memory cell
Tr: Reading period
Tp: Programming period
Te: Erasing period
Tpc: Programming compensating period
Tpc1: First programming compensating period
Tpc2: Second programming compensating period
Tpc3: Third programming compensating period
Tec: Erasing compensating period
Tec1: First erasing compensating period
Tec2: Second erasing compensating period
Tec3: Third erasing compensating period

DETAILED DESCRIPTION

Embodiments of a nonvolatile semiconductor memory device according to the present invention (referred to as the "device of the present invention" occasionally hereinafter) will be described with reference to the drawings hereinafter.

As each memory cell that constitutes a memory cell array is provided with a variable resistance element in which its resistance value is changed in response to electric pulse application and information is stored by the change in electric resistance, a three-layer structured RRAM element in which a PCMO ($Pr_{1-x}Ca_xMnO_3$) film is sandwiched between Pt electrodes is taken as one example of the variable resistance element in the following each embodiment. In addition, one or more embodiments of the present invention can be applied to any variable resistance element as long as its resistance is changed by electric pulse application (or current application). Even when a variable resistance element is formed of a metal oxide other than the PCMO film, one or more embodiments can be applied to it as long as its resistance is changed by the electric pulse application. In addition, one or more embodiments of the present invention can be applied to a variable resistance element as long as the variable resistance element is formed of a transition metal oxide and its resistance is changed by the electric pulse application.

The inventors of this application have found that when a variable resistance element comprising the PCMO film that is a kind of Perovskite-type metal oxide and Pt electrodes provided so as to sandwich the PCMO film is formed and voltage pulses flowing a current in a constant direction and having the same polarity are continuously applied to the variable resistance element, the resistance of the variable resistance element is changed as the number of pulse applications is increased. In addition, the PCMO film of the variable resistance element is formed by sputtering at 500° C.

Figure 8:
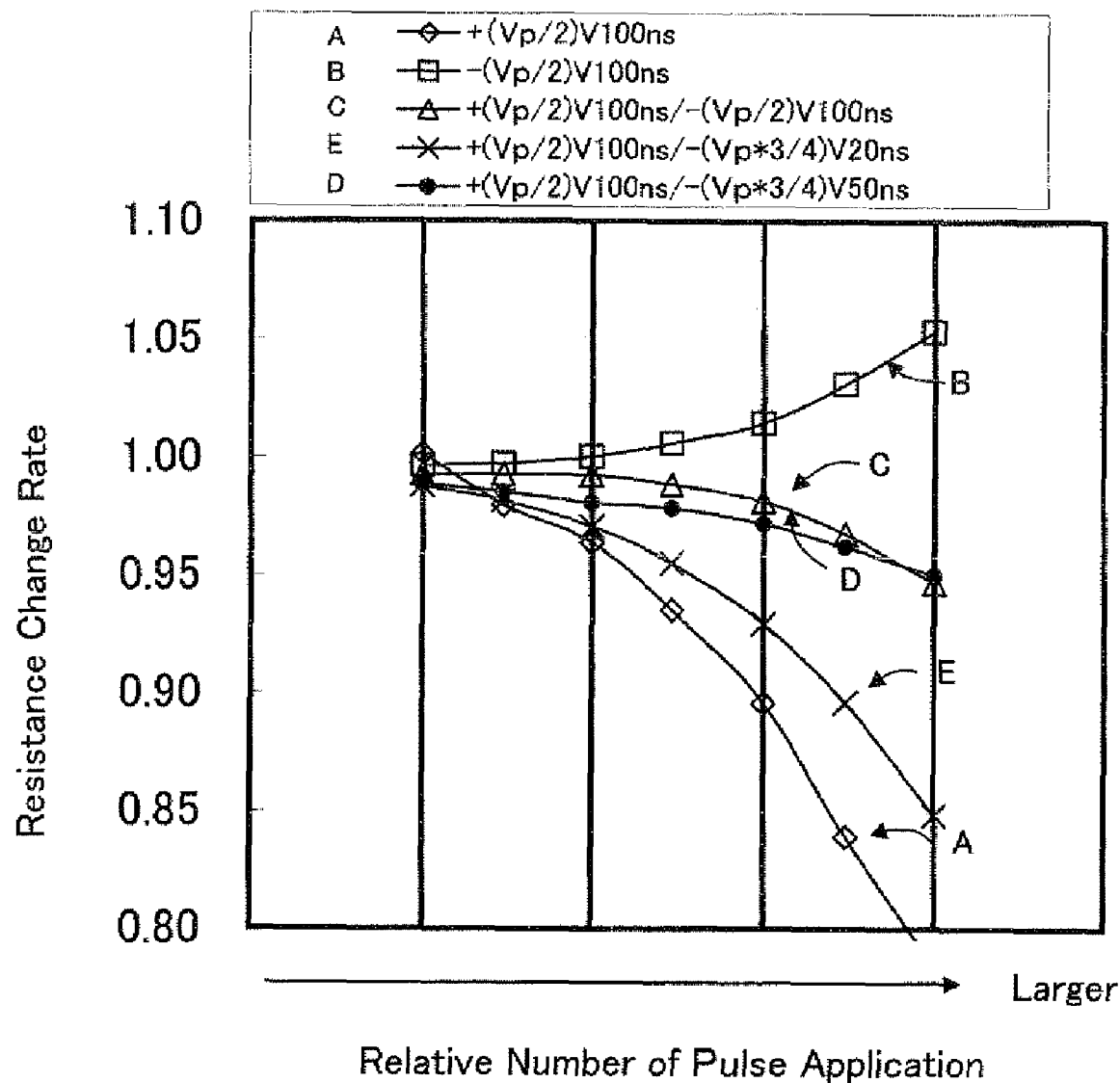
FIG. 8 is a view showing the relation between voltage pulse application to a variable resistance element whose initial state is high resistance state and resistance changes.
Figure 9:
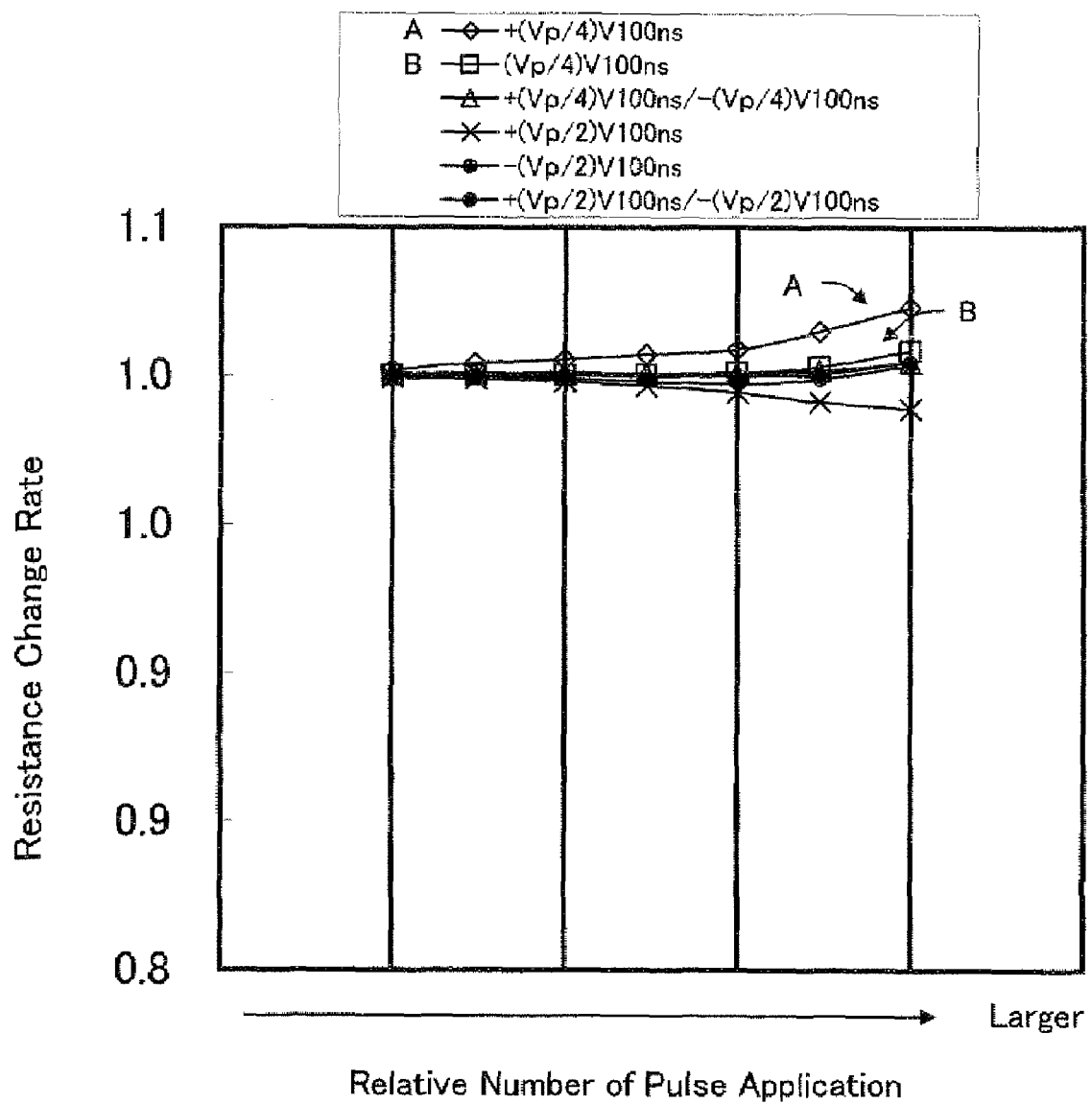
FIG. 9 is a view showing the relation between voltage pulse application to a variable resistance element whose initial state is low resistance state and resistance changes.

As shown in FIG. 8, when positive voltage pulses (pulse width is 100 ns) are applied to the variable resistance element continuously (shown by a curved line pointed by arrow A), the resistance value of the variable resistance element that has been in high resistance state as an initial state before the pulse application is lowered as the number of pulse applications is increased. The high resistance state as the initial state has been formed by applying a programming voltage pulse having a voltage magnitude of 4V and a pulse width of 3 μs to the lower electrode. The programming voltage pulse is a negative voltage pulse for the upper electrode.

When the negative voltage pulses (pulse width is 100 ns) having the same polarity as that of the programming voltage pulse are continuously applied, the resistance value is increased (as shown by a curved line pointed by arrow B) as the number of pulse applications is increased. In addition, it has been obvious from FIG. 8 that as the voltage magnitude of the applied voltage pulse is increased, that is, as the current flowing in the variable resistance element is increased, the degree of the resistance change is increased, and whether the resistance is increased or decreased depends on the direction of the current, that is, the polarity of the applied voltage pulse.

Focusing on the fact that the direction of the resistance change of the variable resistance element depends on the direction of the current flowing in the variable resistance element by the voltage pulse application, the inventors of this application has proposed a method in which the resistance change is offset by applying a voltage pulse having a polarity opposite to that of the applied voltage to the variable resistance element of an unselected memory cell at the time of programming action or erasing action, and tried alternately applying voltage pulses having different polarities, to the variable resistance element continuously.

FIG. 8 shows a typical example in which the behavior of the resistance change is examined by applying continuous voltage pulses by combining the positive pulse and the negative pulse to the variable resistance element whose initial state is the high resistance state. It has been confirmed that the resistance change is small in the case where the voltage pulses having different polarities are combined and alternately applied (refer to curved lines pointed by arrows C to E) as compared with the case where the voltage pulses having the same polarity are continuously applied (as shown by curved lines pointed by arrows A and B). In addition, the curved line C designates a case where the voltage magnitude (absolute value) and the pulse width of the positive pulse are the same as those of the negative pulse, the curved line D designates a case where the voltage magnitude of the negative pulse is three fourths of the positive pulse and the pulse width thereof is 50 ns (half), and curved line E designates a case where the voltage magnitude of the negative pulse is three fourths of the positive pulse and the pulse width thereof is 20 ns (one fifth). In this respect, it has been cleared that the resistance change of the variable resistance element of the unselected memory cell can be restricted and minimized by forcibly flowing a current whose direction is opposite to the current flowing when a voltage that cannot cause programming or erasing at the time of programming action or erasing action but could cause the programming disturbance or the erasing disturbance cumulatively is applied to the variable resistance element of the unselected memory cell when data is programmed or erased in the memory cell comprising the variable resistance element, by applying a programming compensating voltage or an erasing compensating voltage thereto, so that the number of programming or erasing actions until programming or erasing disturbance is generated can be increased.

Next, a description will be made of an embodiment of the device of the present invention capable of restricting the resistance change of the variable resistance element of the unselected memory cell in accordance with the programming and erasing actions, based on a new knowledge regarding the programming and erasing disturbance in the above variable resistance element.

First Embodiment

Figure 2:
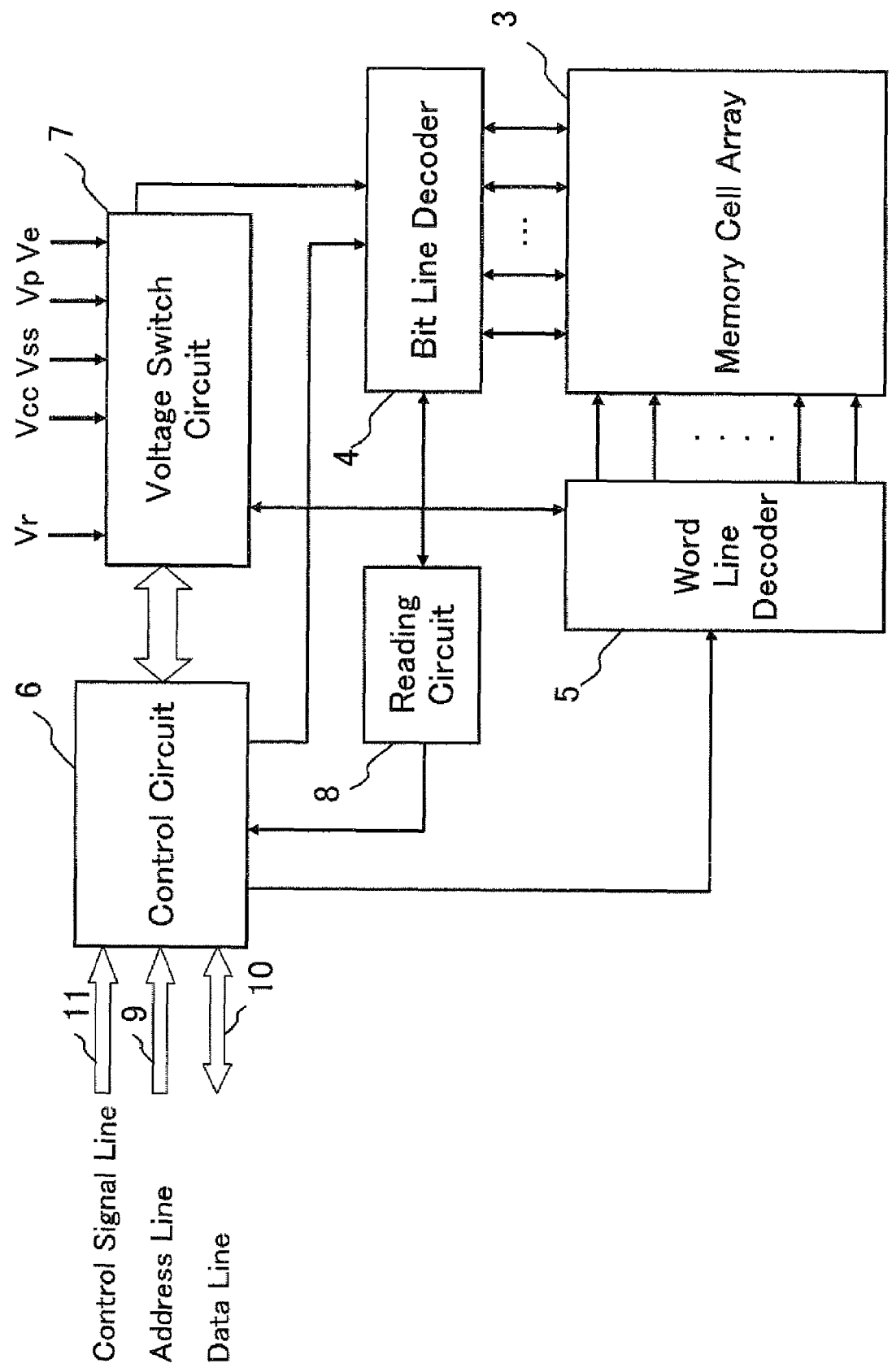
FIG. 2 is a block diagram showing one constitution example of a conventional nonvolatile semiconductor memory device comprising a memory cell array having a 1R type memory cell.
Figure 3:
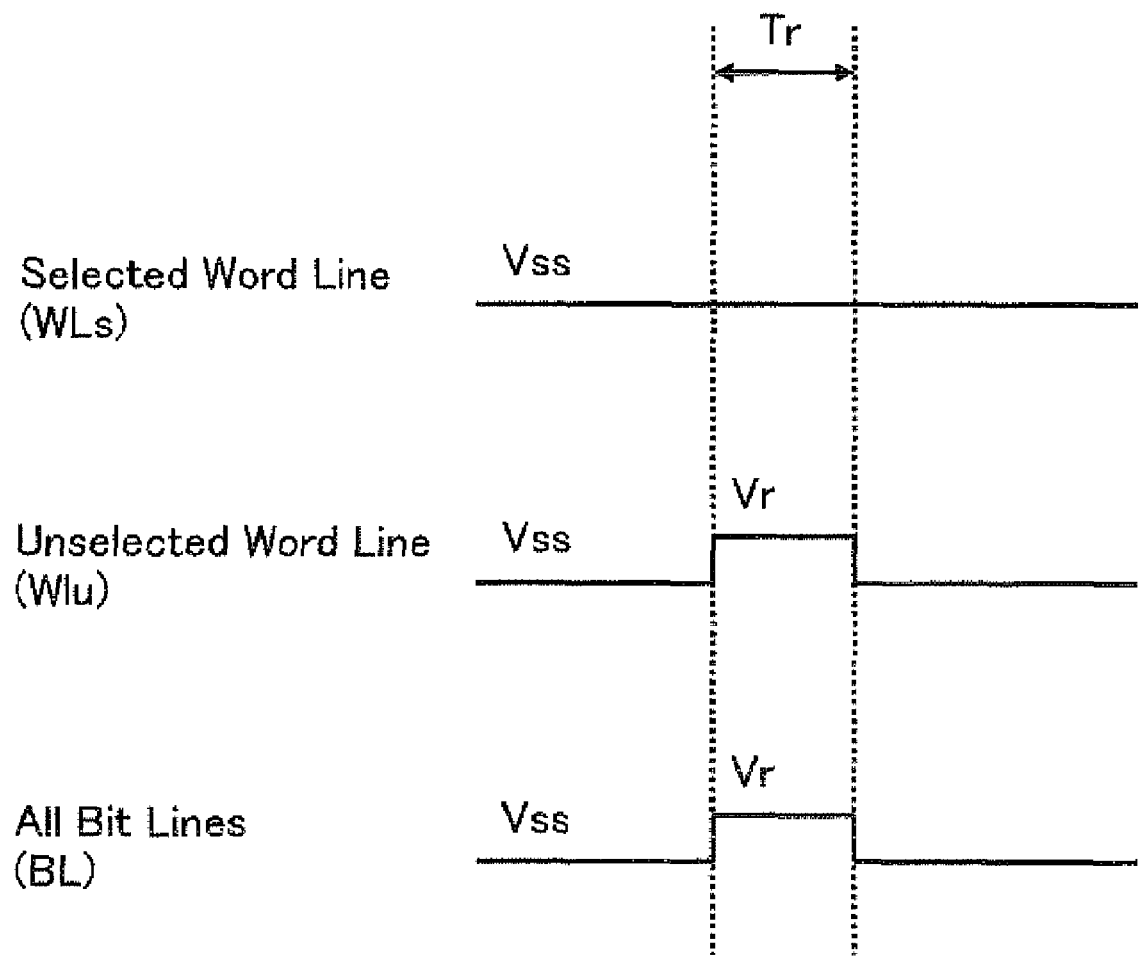
FIG. 3 is a timing chart showing a conventional example of a voltage applying process to each word line and each bit line at the time of a data reading action in the memory cell array comprising the 1R type memory cell.
Figure 10:
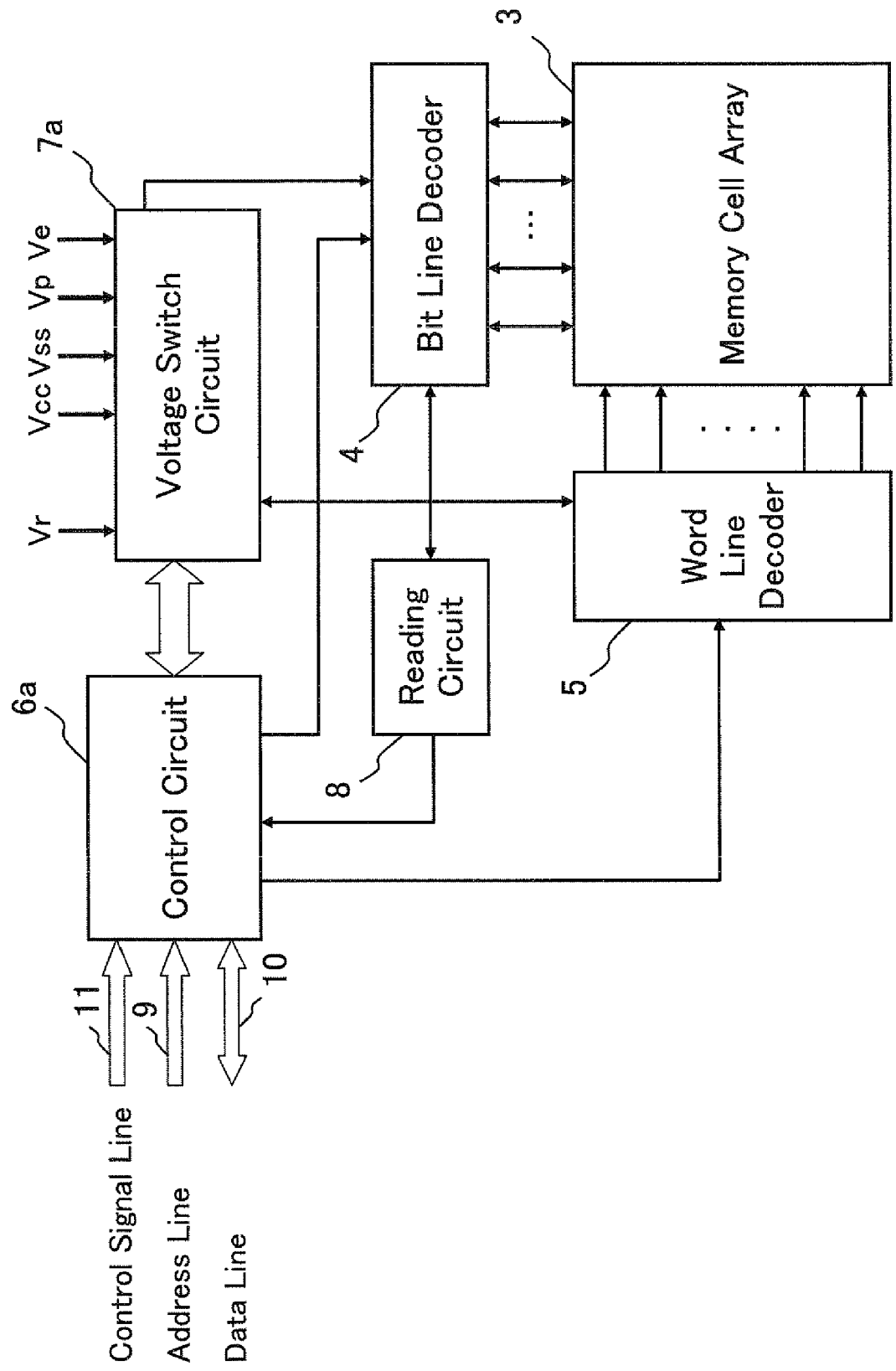
FIG. 10 is a block diagram schematically showing the constitution of a nonvolatile semiconductor memory device according to a first embodiment of the present invention.

FIG. 10 schematically shows one constitution example of the device of the present invention. In addition, in FIG. 10, the same references are allotted to the components common to those of the conventional nonvolatile semiconductor memory device in the following description. As shown in FIG. 10, the device comprises a bit line decoder 4, a word line decoder 5, a voltage switch circuit 7a, a reading circuit 8, and a control circuit 6a in the periphery of a cross-point type memory cell array 3 in which 1R type memory cells (not shown) are arranged in the form of a matrix. Basically, it has the same constitution as that of the conventional nonvolatile semiconductor memory device provided with the memory cell array comprising 1R type memory cells shown in FIG. 2. It is different from the conventional nonvolatile semiconductor memory device shown in FIG. 2 in a voltage applied from the voltage switch circuit 7a to the memory cell array 3, its timing action, and the operation of the control circuit 6a for controlling the operation of the voltage switch circuit 7a.

Figure 4:
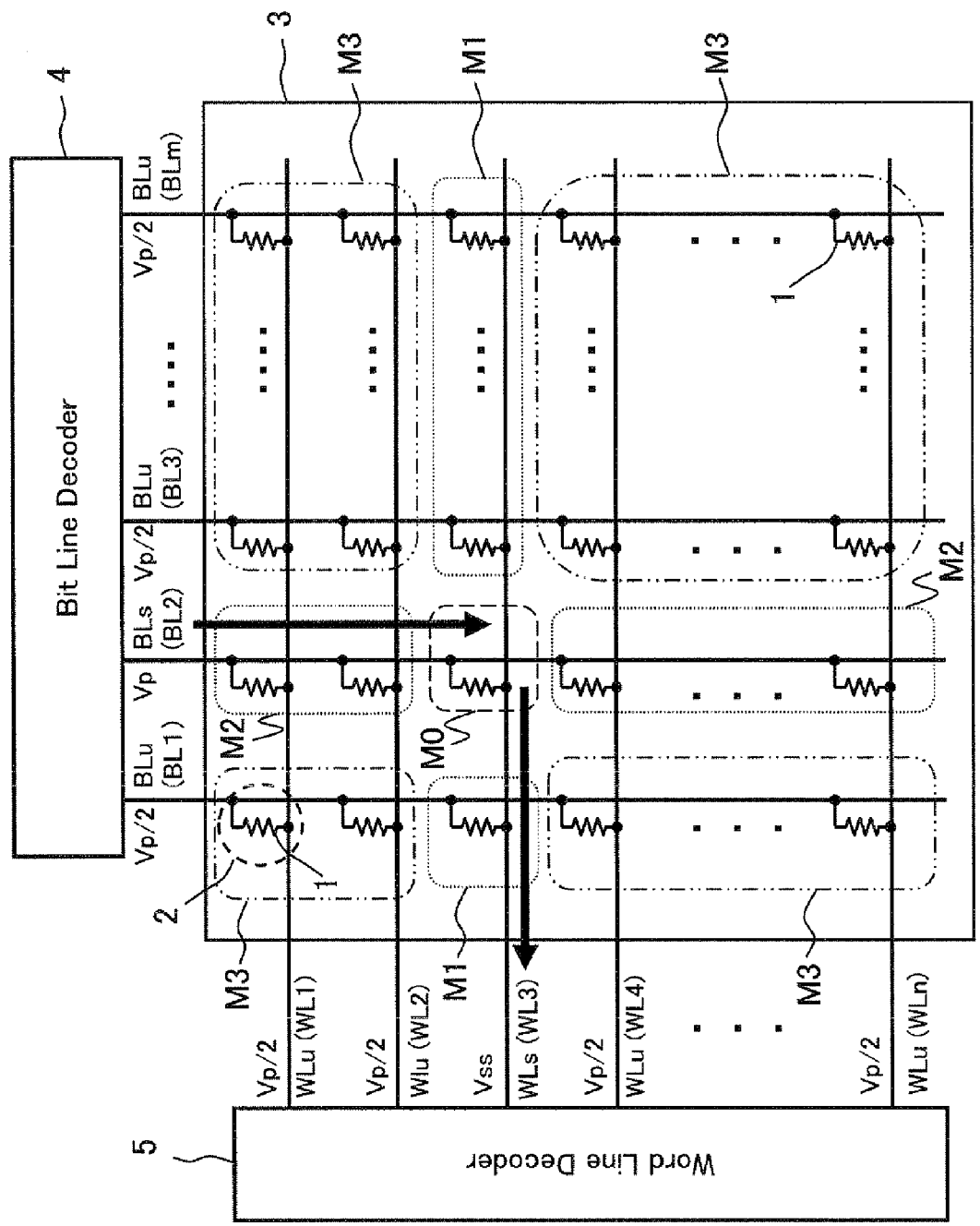
FIG. 4 is a circuit diagram showing a voltage application condition at the time of a data programming action in the memory cell array comprising the 1R type memory cell.
Figure 5:
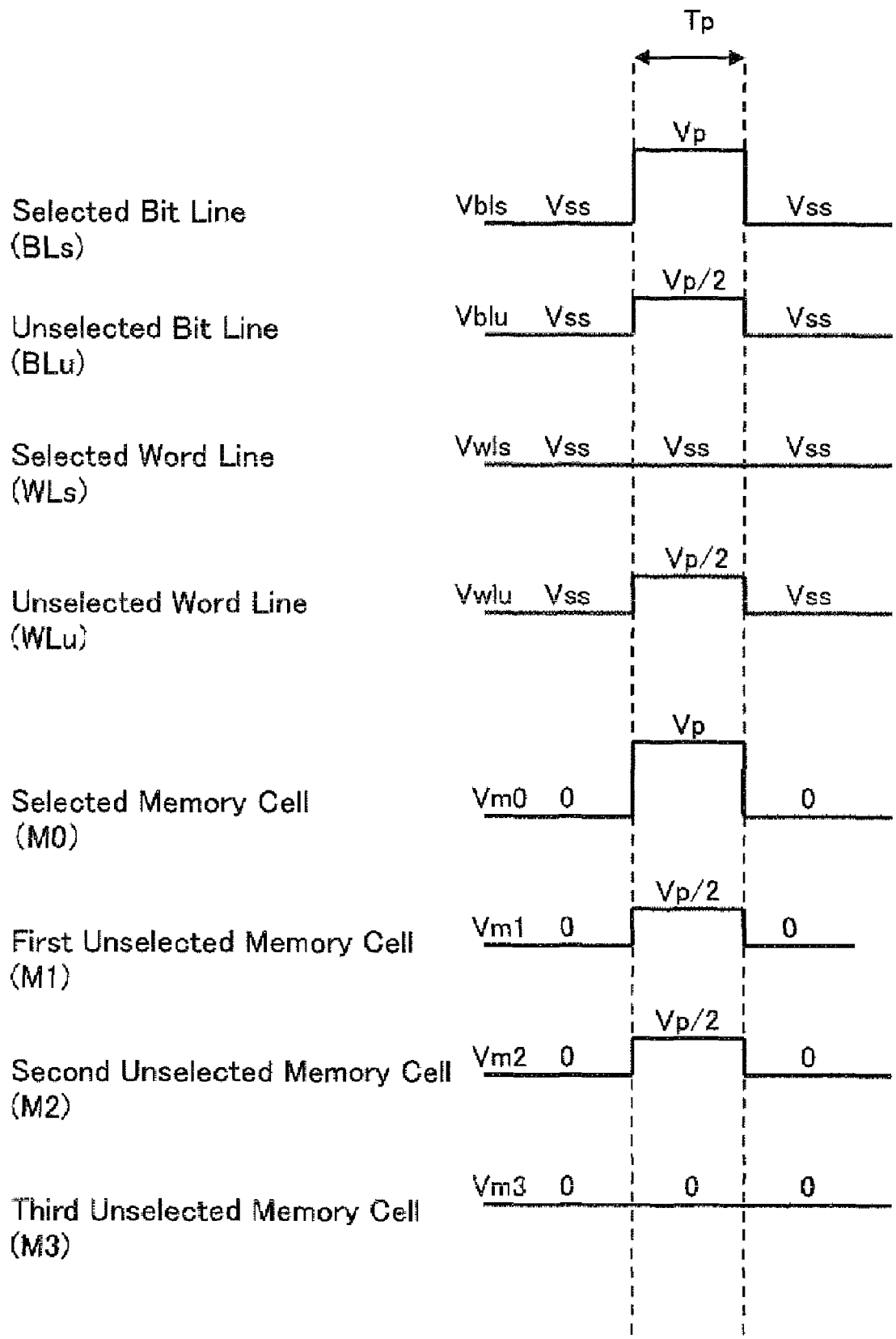
FIG. 5 is a timing chart showing a conventional example of a voltage applying process to each word line and each bit line at the time of a data programming action in the memory cell array comprising the 1R type memory cell.
Figure 6:
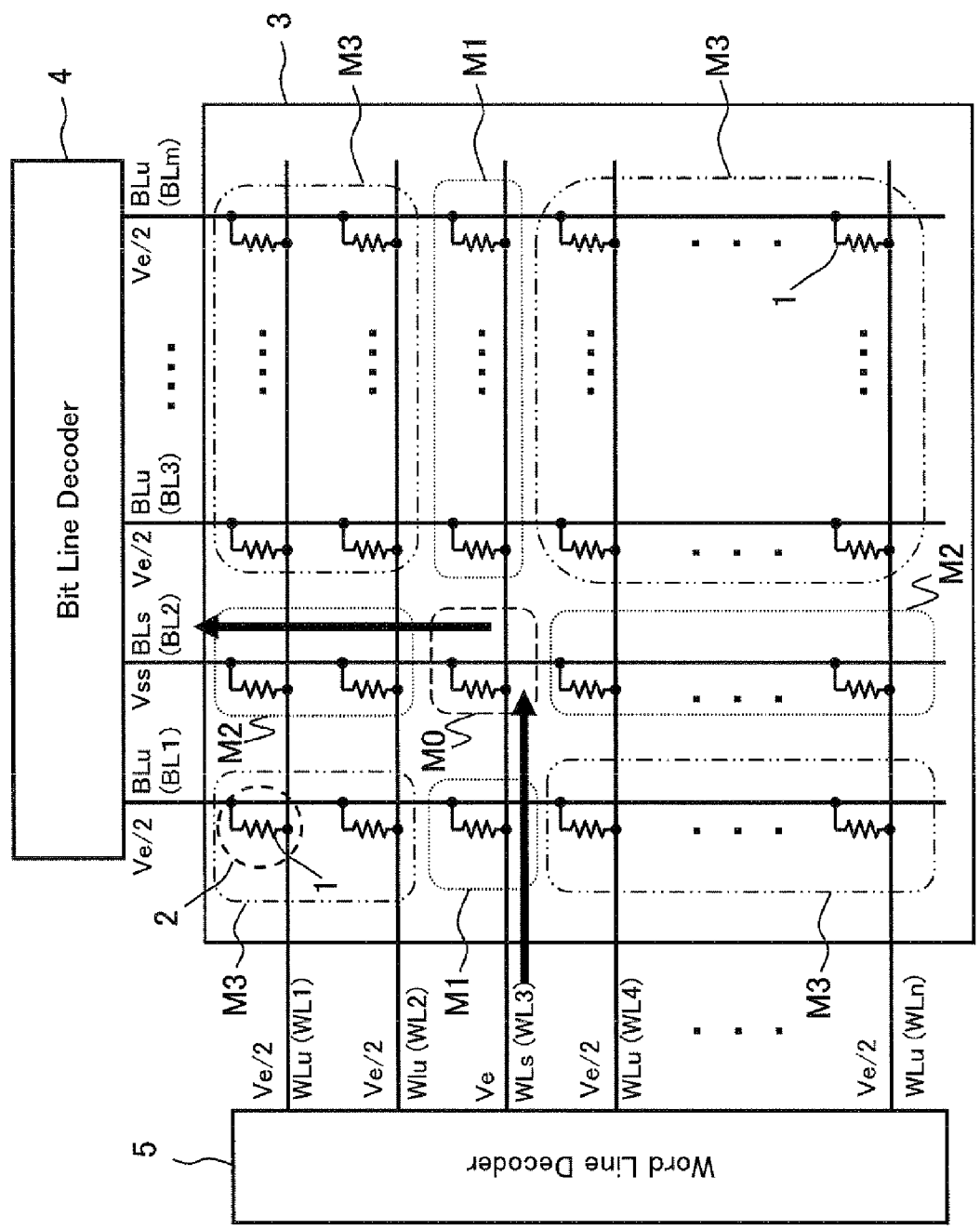
FIG. 6 is a circuit diagram showing a voltage application condition at the time of a data erasing action in the memory cell array comprising the 1R type memory cell.
Figure 7:
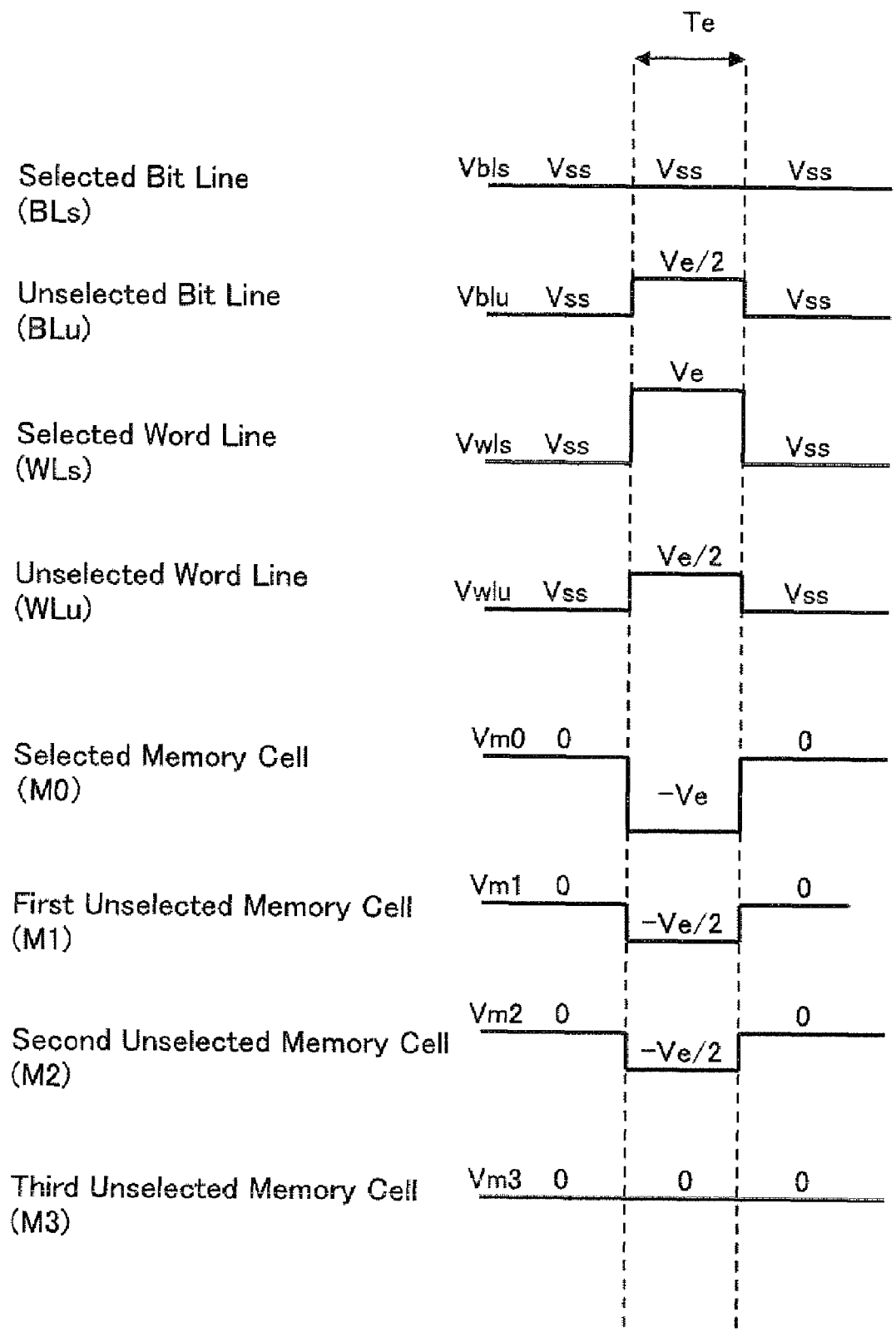
FIG. 7 is a timing chart showing a conventional example of a voltage applying process to each word line and each bit line at the time of a data erasing action in the memory cell array comprising the 1R type memory cell.
Figure 11:
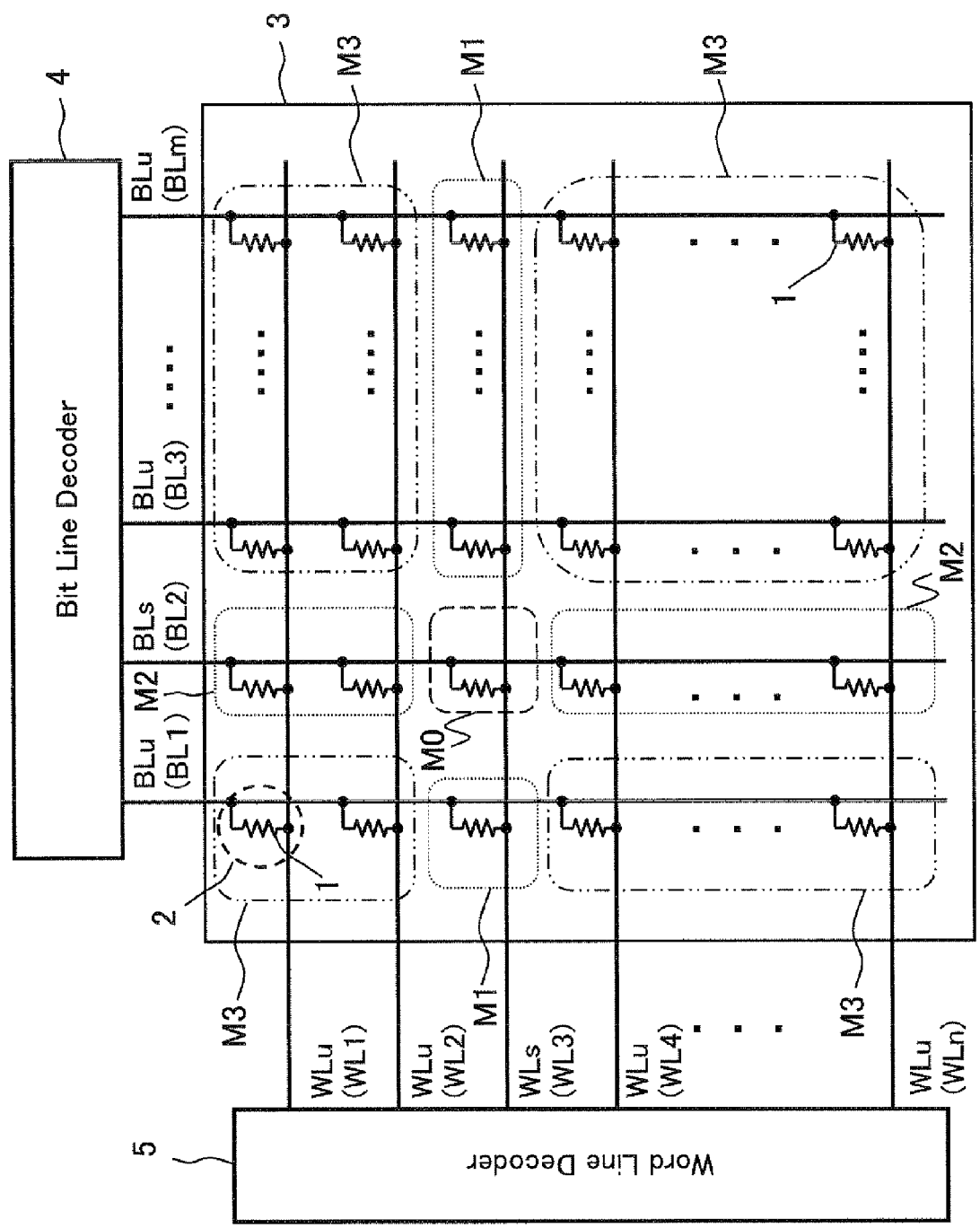
FIG. 11 is a circuit diagram schematically showing one constitution example of a memory cell array comprising a 1R type memory cell in the nonvolatile semiconductor memory device.

In addition, the constitution of the memory cell array 3 is the same as the constitution of the memory cell array 3 of the conventional nonvolatile semiconductor memory device shown in FIGS. 1, 4 and 6. More specifically, as shown in FIG. 11, the memory cell array 3 comprises m×n memory cells 2 at intersections of m bit lines (corresponding to column selecting lines) (BL1 to BLm) extending in a column direction and n word lines (corresponding to row selecting lines) (WL1 to WLn) extending in a row direction. According to each memory cell 2, the upper electrode of a variable resistance element 1 is connected to the word line, i.e. first or one end, and the lower electrode of the variable resistance element 1 is connected to the bit line, i.e. second or other end. In addition, the relation between the upper electrode and the lower electrode of the variable resistance element 1 may be reversed such that the lower electrode of the variable resistance element 1 is connected to the word line, and the upper electrode of the variable resistance element 1 is connected to the bit line.

The bit line decoder 4 and the word line decoder 5 select a memory cell to be read, programmed or erased, from the memory cell array 3, according to an address input inputted from an address line 9 to the control circuit 6a. The word line decoder 5 selects the word line of the memory cell array 3, in accordance with a signal inputted to the address line 9, and the bit line decoder 4 selects the bit line of the memory cell array 3, in accordance with an address signal inputted to the address line 9. As shown in FIG. 11, the memory cell in which one and the other ends of the variable resistance element 1 are connected to the selected word line WLs (corresponding to a first row selecting line) selected by the word line decoder 5 and the selected bit line BLs (corresponding to a first column selecting line) selected by the bit line decoder 4, respectively is selected as a selected memory cell M0. In addition, it is assumed in the following description that the memory cell in which one and the other ends of the variable resistance element 1 is connected to the selected word line WLs and the unselected bit line BLu (corresponding to a second column selecting line) not selected by the bit line decoder 4, respectively is a first unselected memory cell M1 and the memory cell in which one and the other ends of the variable resistance element 1 are connected to the unselected word line WLu (corresponding to a second row selecting line) not selected by the word line decoder 5 and the selected bit line BLs, respectively is a second unselected memory cell M2, and the memory cell in which one and the other ends of the variable resistance element 1 are connected to the unselected word line WLu and the unselected bit line BLu, respectively is a third unselected memory cell M3. In the example shown in FIG. 11, since there are one selected word line WLs and one selected bit line BLs, there are one selected memory cell M0, (m−1) first unselected memory cells M1, (n−1) second unselected memory cells M2 and {(m−1)×(n−1)} third unselected memory cells M3.

The control circuit 6a controls each action of programming, erasing and reading of the memory cell array 3. The control circuit 6a controls the word line decoder 5, the bit line decoder 4, the voltage switch circuit 7, and reading, programming and erasing actions of the memory cell array 3, based on the address signal inputted from the address line 9, a data input (at the time of programming) inputted from a data line 10 and a control input signal inputted from a control signal line 11. According to the example shown in FIG. 10, the control circuit 6a comprises functions as a general address buffer circuit, a data input/output buffer circuit and a control input buffer circuit although they are not shown.

The voltage switch circuit 7a switches voltages applied to the word lines (the selected word line WLs and the unselected word lines WLu) and the bit lines (the selected bit line BLs and the unselected bit lines BLu) required for each actions of reading, programming and erasing of the memory cell array 3, in accordance with its operation mode. In the drawing, reference character Vcc designates a power supply voltage of the device, reference character Vss designates the ground voltage, reference character Vr designates a reading voltage, reference character Vp designates a programming supply voltage (programming voltage), and reference character Ve designates an erasing supply voltage (erasing voltage is −Ve). Middle voltages such as a row programming blocking voltage applied to the unselected word lines WLu and a column programming blocking voltage applied to the unselected bit lines BLu at the time of programming, and a row erasing blocking voltage applied to the unselected word lines WLu and a column erasing blocking voltage applied to the unselected bit lines BLu at the time of erasing are made from the programming voltage Vp and the erasing voltage Ve and supplied to the memory cell array 3.

According to this embodiment, a programming voltage applying circuit for applying the programming voltage Vp sufficient for the programming action to both ends of the selected memory cell only and applying the programming blocking voltage (Vp/2) not sufficient for the programming action to the first unselected memory cells M1 and the second unselected memory cells M2 is implemented by the control circuit 6a and the voltage switch circuit 7a. In addition, an erasing voltage applying circuit for applying the erasing voltage (−Ve) sufficient for the erasing action to both ends of the selected memory cell only and applying the erasing blocking voltage (−Ve/2) not sufficient for the erasing action to the first unselected memory cells M1 and the second unselected memory cells M2 is implemented by the control circuit 6a and the voltage switch circuit 7a.

The reading circuit 8 converts a reading current flowing in the selected bit line selected by the bit line decoder 4 among reading currents flowing in the bit line connected to the selected memory cell, to a voltage to determine the state of the memory data of the memory cell to be read, connected to the selected bit line among the selected memory cells in one row, and transfers its result to the control circuit 6a to be outputted to the data line 10.

Next, a description will be made of a voltage pulse applying process from the voltage switch circuit 7a to each of word lines (the selected word line WLs and the unselected word lines WLu) and each of bit lines (the selected bit line BLs and unselected bit lines BLu) of the memory cell array 3, to apply the programming voltage Vp to the selected memory cell M0 and to apply a compensating voltage Vpc to the first and second unselected memory cells M1 and M2 at the time of programming using two following examples.

In addition, the description is made using the selected word line WLs, the unselected word lines WLu, selected bit line BLs and unselected bit lines BLu, selected memory cell M0 and first to third unselected memory cells M1, M2 and M3 of memory cell 3 as shown in FIG. 11, if not otherwise specified.

EXAMPLE 1

In an Example 1, a description will be made of a process in a case where the application of the programming voltage Vp to the selected memory cell M0 (programming period Tp), the application of the programming compensating voltage Vpc to the first unselected memory cells M1 (first programming compensating period Tpc1), the application of the programming compensating voltage Vpc to the second unselected memory cells M2 (second programming compensating period Tpc2) are performed in a time-division manner, at the time of programming action in one selected period until the selection of the selected memory cell is switched to another selected memory cell, with reference to FIG. 12. In addition, it is to be noted that in the example that the first programming compensating period Tpc1 and the second programming compensating period Tpc2 are the same or almost the same length as the programming period Tp. That is, Tp=Tpc1=Tpc2 or Tp≅Tpc1≅Tpc2.

Figure 12:
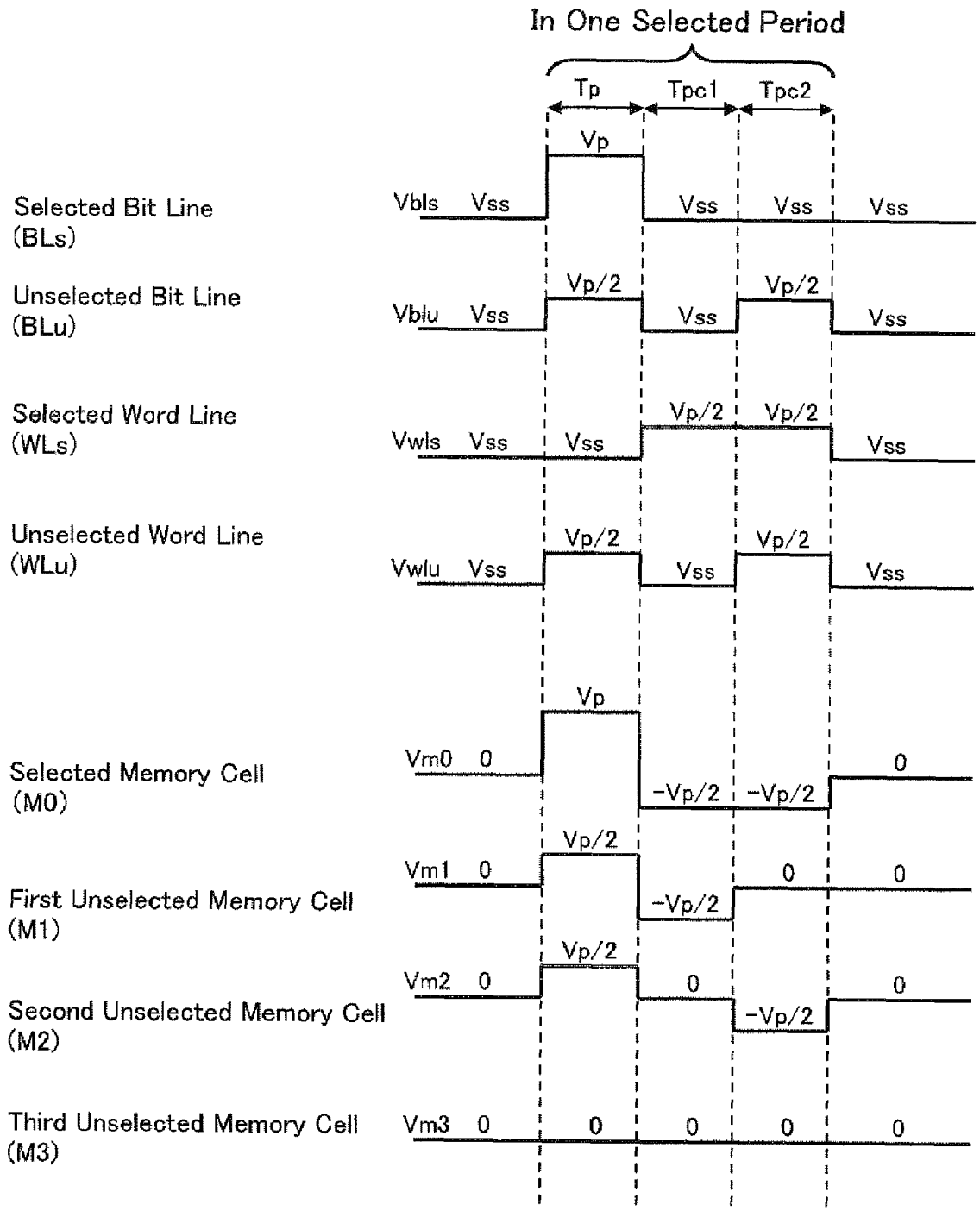
FIG. 12 is a timing chart showing one example of a voltage applying process to each word line and each bit line and a voltage applied state in each memory cell at the time of a data programming action in a nonvolatile semiconductor memory device according to an Example 1 of the present invention.

FIG. 12 shows voltage changes of a voltage Vbls applied to the selected bit line BLs, a voltage Vblu applied to the unselected bit lines BLu, a voltage Vwls applied to the selected word line WLs, a voltage Vwlu applied to the unselected word lines WLu, a voltage Vm0 applied across the variable resistance element of the selected memory cell M0, a voltage Vm1 applied across the variable resistance element of each first unselected memory cell M1, a voltage Vm2 applied across the variable resistance element of each second unselected memory cell M2, and a voltage Vm3 applied across the variable resistance element of each third unselected memory cell M3, in the programming period Tp, the first programming compensating period Tpc1, and the second programming compensating period Tpc2. In addition, the voltage applied to each memory cell is based on a terminal (0V) connected to the word line side.

First, as shown in FIG. 12, in the programming period Tp, the column programming voltage Vp having the same voltage as the programming voltage Vp is applied to the selected bit line BLs, the column programming blocking voltage Vp/2 that is the half of the programming voltage Vp is applied to the unselected bit lines BLu, the row programming voltage having the same voltage as the ground potential Vss is applied to the selected word line WLs, and the row programming blocking voltage Vp/2 that is the half of the programming voltage Vp is applied to the unselected word lines WLu. As a result, the programming voltage Vp that is the voltage difference (Vbls−Vwls) between the selected bit line BLs and the selected word line WLs is applied to the selected memory cell M0, the programming blocking voltage Vp/2 that is the half of the programming voltage Vp and the voltage difference (Vblu−Vwls) between the unselected bit lines BLu and the selected word line WLs is applied to the first unselected memory cells M1, the programming blocking voltage Vp/2 that is the half of the programming voltage Vp and the voltage difference (Vbls−Vwlu) between the selected bit line BLs and the unselected word lines WLu is applied to the second unselected memory cells M2, and 0V that is the voltage difference (Vblu−Vwlu) between the unselected bit lines BLu and the unselected word lines WLu is applied to the third unselected memory cells M3. These applied voltages in the programming period Tp are shown collectively in formulas 1.

As a result, in the programming period Tp, programming is performed in the selected memory cell M0 while programming is not performed for the first unselected memory cells M1 and the second unselected memory cells M2 because the programming blocking voltage insufficient for the programming action is applied to them but the programming disturbance is caused.

Formulas 1

$Vbls=Vp$(application of the column programming voltage $Vp$)

$Vblu=Vp/2$(application of the column programming blocking voltage $Vp/2$)

$Vwls=Vss$(application of the row programming voltage $Vss$)

$Vwlu=Vp/2$(application of the row programming blocking voltage $Vp/2$)

$Vm0=Vp$(programming in the selected memory cell $M0$)

$Vm1=Vp/2$(programming disturbance in the first unselected memory cells $M1$)

$Vm2=Vp/2$(programming disturbance in the second unselected memory cells $M2$)

$Vm3=0[V]$

Then, in the first programming compensating period Tpc1, the programming compensating voltage Vpc for compensating the programming disturbance in the first unselected memory cells M1 generated in the programming period Tp is applied to the first unselected memory cells M1. More specifically, as shown in FIG. 12, the ground potential Vss is applied to the selected bit line BLs, the ground potential Vss is applied to the unselected bit lines BLu, the row programming blocking voltage Vp/2 that is the half of the programming voltage Vp is applied to the selected word line WLs, and the ground potential Vss is applied to the unselected word lines WLu. As a result, the voltage difference (Vbls−Vwls=−Vp/2) between the selected bit line BLs and the selected word line WLs is applied to the selected memory cell M0, the programming compensating voltage (Vpc=−Vp/2) that is the voltage difference (Vblu−Vwls) between the unselected bit lines BLu and the selected word line WLs is applied to the first unselected memory cells M1, the voltage difference (Vbls−Vwlu=0V) between the selected bit line BLs and the unselected word lines WLu is applied to the second unselected memory cells M2, and the voltage difference (Vblu−Vwlu=0V) between the unselected bit lines BLu and the unselected word lines WLu is applied to the third unselected memory cells M3. These applied voltages in the first programming compensating period Tpc1 are shown in formulas 2 collectively.

As a result, in the first programming compensating period Tpc1, the programming compensating voltage (Vpc=−Vp/2) having the same voltage magnitude as the programming blocking voltage Vp/2 applied in the programming period Tp and an opposite polarity to it is applied to the first unselected memory cells M1, and its resistance changed in the programming period Tp is brought to its original resistance state, so that the degree of the programming disturbance generated in the first unselected memory cells M1 once can be reduced.

Formulas 2

$Vbls=Vss$ $Vblu=Vss$ $Vwls=Vp/2$ $Vwlu=Vss$ $Vm0=-Vp/2$ $Vm1=-Vp/2$(application of the programming compensating voltage to the first unselected memory cells $M1$)

$Vm2=0[V]$ $Vm3=0[V]$

Then, in the second programming compensating period Tpc2, the programming compensating voltage Vpc for compensating the programming disturbance in the second unselected memory cells M2 generated in the programming period Tp is applied to the second unselected memory cells M2. More specifically, as shown in FIG. 12, the ground potential Vss is applied to the selected bit line BLs, the column programming blocking voltage Vp/2 that is the half of the programming voltage Vp is applied to the unselected bit line BLu, the row programming blocking voltage Vp/2 that is the half of the programming voltage Vp is applied to the selected word line WLs, and the row programming blocking voltage Vp/2 that is the half of the programming voltage Vp is applied to the unselected word lines WLu. As a result, the voltage difference (Vbls−Vwls=−Vp/2) between the selected bit line BLs and the selected word line WLs is applied to the selected memory cell M0, the voltage difference (Vblu−Vwls=0V) between the unselected bit lines BLu and the selected word line WLs is applied to the first unselected memory cells M1, the programming compensating voltage (Vpc=−Vp/2) that is the voltage difference (Vbls−Vwlu) between the selected bit line BLs and the unselected word lines WLu is applied to the second unselected memory cells M2, and the voltage difference (Vblu−Vwlu=0V) between the unselected bit lines BLu and the unselected word lines WLu is applied to the third unselected memory cells M3. These applied voltages in the second programming compensating period Tpc2 are shown in formulas 3 collectively.

As a result, in the second programming compensating period Tpc2, the programming compensating voltage (Vpc=−Vp/2) having the same voltage magnitude as the programming blocking voltage Vp/2 applied in the programming period Tp and an opposite polarity to it is applied to the second unselected memory cells M2, and its resistance changed in the programming period Tp is brought to its original resistance state, so that the degree of the programming disturbance generated in the second unselected memory cells M2 once can be reduced.

Formulas 3

$$V_{bls} = V_{ss}$$

$$V_{blu} = V_p/2$$

$$V_{wls} = V_p/2$$

$$V_{wlu} = V_p/2$$

$$V_{m0} = -V_p/2$$

$$V_{m1} = 0 [V]$$

$$V_{m2} = -V_p/2 \text{(application of the programming compensating voltage to the second unselected memory cells M2)}$$

$$V_{m3} = 0 [V]$$

As described above, according to the example 1, since three periods such as the programming period Tp, the first programming compensating period Tpc1, and the second programming compensating period Tpc2 are provided in one selected period every time the programming action is generated, even when the programming action is repeated, the programming disturbance can be effectively prevented from being cumulatively progressed in the first and second unselected memory cells M1 and M2. In addition, although the programming compensating voltage (−Vp/2) is applied to the selected memory cell M0 in the first programming compensating period Tpc1 and the second programming compensating period Tpc2, since it is applied only two times for one programming action for the selected memory cell M0, that application is not accumulated, which is no problem.

In addition, according to the example 1, the order of the three periods of the programming period Tp, the first programming compensating period Tpc1, and the second programming compensating period Tpc2 may be arbitrary and it may be such that the programming period Tp is provided after the first programming compensating period Tpc1 and the second programming compensating period Tpc2, for example.

In addition, according to the example 1, when each length of the first programming compensating period Tpc1 and the second programming compensating period Tpc2 is adjusted such that the programming compensation can be most highly efficient, each length of the programming period Tp, the first programming compensating period Tpc1, and the second programming compensating period Tpc2 may not be always equal or the absolute values of the programming compensating voltage Vpc and the programming blocking voltage (Vp/2) may not be always equal.

EXAMPLE 2

In an Example 2, a description will be made of another process in a case where the application of the programming voltage Vp to the selected memory cell M0 (programming period Tp), the application of the programming compensating voltage Vpc to the first unselected memory cells M1 (first programming compensating period Tpc1), the application of the programming compensating voltage Vpc to the second unselected memory cells M2 (second programming compensating period Tpc2) are performed in a time-division manner, at the time of programming action in one selected period until the selection of the selected memory cell is switched to another selected memory cell, with reference to FIG. 13. In addition, it is to be noted that in the example 2 that the first programming compensating period Tpc1 and the second programming compensating period Tpc2 are the same or almost the same length as the programming period Tp. That is, Tp=Tpc1=Tpc2 or Tp≅Tpc1≅Tpc2.

Figure 13:
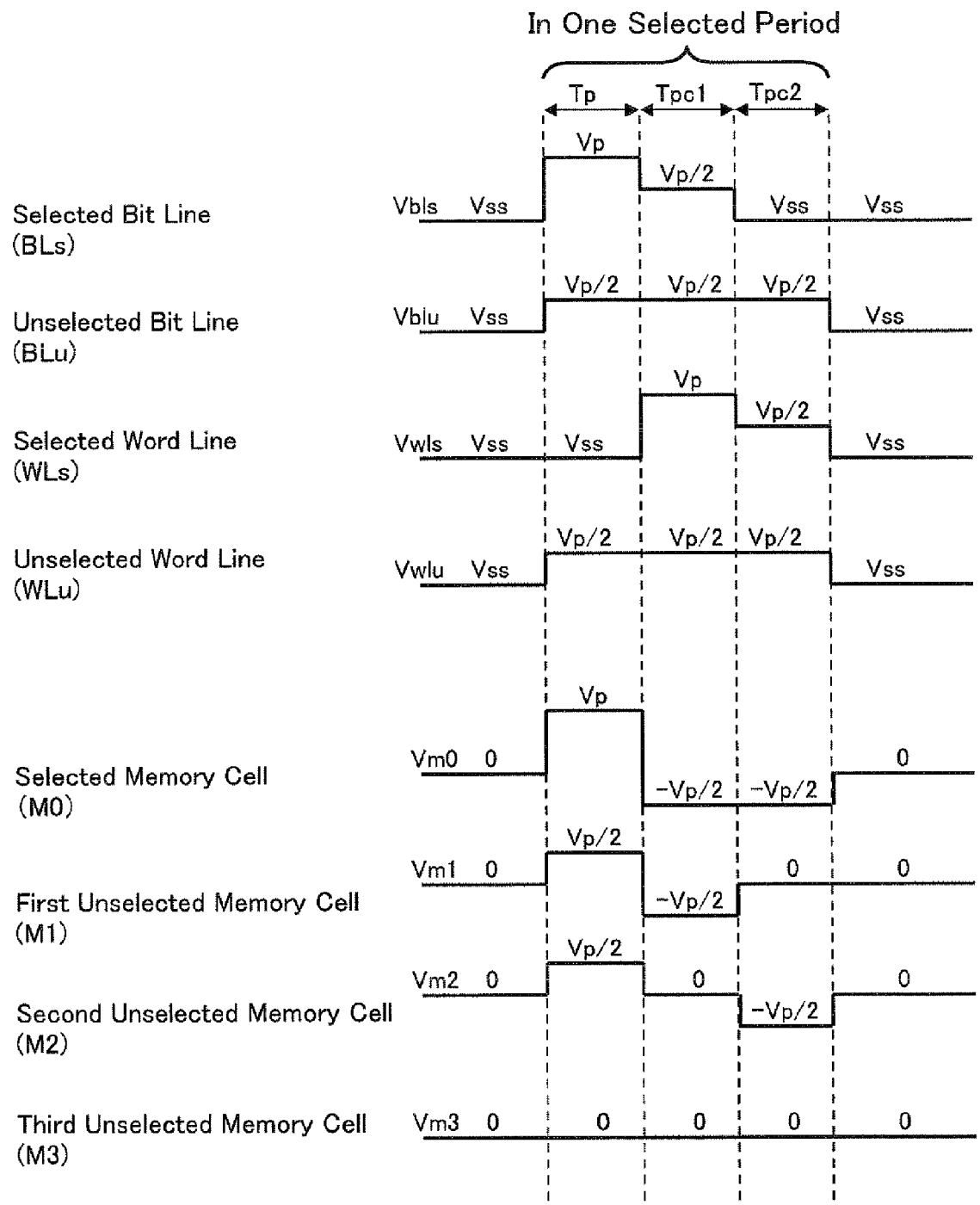
FIG. 13 is a timing chart showing one example of a voltage applying process to each word line and each bit line and a voltage applied state in each memory cell at the time of a data programming action in a nonvolatile semiconductor memory device according to an Example 2 of the present invention.

FIG. 13 shows voltage changes of the voltage Vbls applied to the selected bit line BLs, the voltage Vblu applied to the unselected bit lines BLu, the voltage Vwls applied to the selected word line WLs, the voltage Vwlu applied to the unselected word lines WLu, the voltage Vm0 applied across the variable resistance element of the selected memory cell M0, the voltage Vm1 applied across the variable resistance element of each of the first unselected memory cells M1, the voltage Vm2 applied across the variable resistance element of each of the second unselected memory cells M2, and the voltage Vm3 applied ACROSS the variable resistance element of each of the third unselected memory cells M3, in the programming period Tp, the first programming compensating period Tpc1, and the second programming compensating period Tpc2. In addition, the voltage applied to each memory cell is based on a terminal (0V) connected to the word line side.

First, as shown in FIG. 13, in the programming period Tp, the column programming voltage Vp having the same voltage as the programming voltage Vp is applied to the selected bit line BLs, the column programming blocking voltage Vp/2 that is the half of the programming voltage Vp is applied to the unselected bit lines BLu, the row programming voltage having the same voltage as the ground potential Vss is applied to the selected word line WLs, and the column programming blocking voltage Vp/2 that is the half of the programming voltage Vp is applied to the unselected word lines WLu. As a result, the programming voltage Vp that is the voltage difference (Vbls−Vwls) between the selected bit line BLs and the selected word line WLs is applied to the selected memory cell M0, the programming blocking voltage Vp/2 that is the half of the programming voltage Vp and the voltage difference (Vblu−Vwls) between the unselected bit lines BLu and the selected word line WLs is applied to the first unselected memory cells M1, the programming blocking voltage Vp/2 that is the half of the programming voltage Vp and the voltage difference (Vbls−Vwlu) between the selected bit line BLs and the unselected word lines WLu is applied to the second unselected memory cells M2, and 0V that is the voltage difference (Vblu−Vwlu) between the unselected bit lines BLu and the unselected word lines WLu is applied to the third unselected memory cells M3, which is totally the same as in the example 1 and these applied voltages in this programming period Tp are the same as shown in formulas 1.

As a result, in the programming period Tp, programming is performed in the selected memory cell M0 while programming is not performed for the first unselected memory cells M1 and the second unselected memory cells M2 because the programming blocking voltage insufficient for the programming action is applied to them but the programming disturbance is generated.

Then, in the first programming compensating period Tpc1, the programming compensating voltage Vpc for compensating the programming disturbance in the first unselected memory cells M1 generated in the programming period Tp is applied to the first unselected memory cells M1. More specifically, as shown in FIG. 13, the column programming voltage Vp/2 that is half of the programming voltage Vp is applied to the selected bit line BLs, the column programming voltage Vp/2 that is half of the programming voltage Vp is applied to the unselected bit lines BLu, the programming voltage Vp is applied to the selected word line WLs, and the row programming blocking voltage Vp/2 that is the half of the programming voltage Vp is applied to the unselected word lines WLu.

As a result, the voltage difference (Vbls−Vwls=−Vp/2) between the selected bit line BLs and the selected word line WLs is applied to the selected memory cell M0, the programming compensating voltage (Vpc=−Vp/2) that is the voltage difference (Vblu−Vwls) between the unselected bit lines BLu and the selected word line WLs is applied to the first unselected memory cells M1, the voltage difference (Vbls−Vwlu=0V) between the selected bit line BLs and the unselected word lines WLu is applied to the second unselected memory cells M2, and the voltage difference (Vblu−Vwlu=0V) between the unselected bit lines BLu and the unselected word lines WLu is applied to the third unselected memory cells M3. These applied voltages in the first programming compensating period Tpc1 are shown in formulas 4 collectively, in which the applied voltages to the selected bit line BLs, unselected bit lines BLu, selected word line WLs and selected word line WLs are shifted from the voltages applied in the example 1 toward the high voltage side by Vp/2, respectively.

As a result, in the first programming compensating period Tpc1, the programming compensating voltage (Vpc=−Vp/2) having the same voltage magnitude as the programming blocking voltage Vp/2 applied in the programming period Tp and opposite polarity to it is applied to the first unselected memory cells M1, and its resistance changed in the programming period Tp is brought to its original resistance state, so that the degree of the programming disturbance generated in the first unselected memory cells M1 once can be reduced.

Formulas 4

$Vbls = Vp/2$ $Vblu = Vp/2$ $Vwls = Vp$ $Vwlu = Vp/2$ $Vm0 = -Vp/2$ $Vm1 = -Vp/2$ (application of the programming compensating voltage to the first unselected memory cells M1)

$Vm2 = 0 [V]$ $Vm3 = 0 [V]$

Then, in the second programming compensating period Tpc2, the programming compensating voltage Vpc for compensating the programming disturbance in the second unselected memory cells M2 generated in the programming period Tp is applied to the second unselected memory cells M2. More specifically, as shown in FIG. 13, the ground potential Vss is applied to the selected bit line BLs, the column programming blocking voltage Vp/2 that is the half of the programming voltage Vp is applied to the unselected bit lines BLu, the row programming blocking voltage Vp/2 that is the half of the programming voltage Vp is applied to the selected word line WLs, and the row programming blocking voltage Vp/2 that is the half of the programming voltage Vp is applied to the unselected word lines WLu. As a result, the voltage difference (Vbls−Vwls=−Vp/2) between the selected bit line BLs and the selected word line WLs is applied to the selected memory cell M0, the voltage difference (Vblu−Vwls=0V) between the unselected bit lines BLu and the selected word line WLs is applied to the first unselected memory cells M1, the programming compensating voltage (Vpc=−Vp/2) that is the voltage difference (Vbls−Vwlu) between the selected bit line BLs and the unselected word lines WLu is applied to the second unselected memory cells M2, and the voltage difference (Vblu−Vwlu=0V) between the unselected bit lines BLu and the unselected word lines WLu is applied to the third unselected memory cells M3, which is totally the same as in the example 1 and these applied voltages in the second programming compensating period Tpc2 are the same as those shown in formulas 3.

As a result, in the second programming compensating period Tpc2, the programming compensating voltage (Vpc=−Vp/2) having the same voltage magnitude as the programming blocking voltage Vp/2 applied in the programming period Tp and an opposite polarity to it is applied to the second unselected memory cells M2, and its resistance changed in the programming period Tp is brought to its original resistance state, so that the degree of the programming disturbance generated in the second unselected memory cells M2 once can be reduced.

As described above, according to the example 2, since three periods such as the programming period Tp, the first programming compensating period Tpc1, and the second programming compensating period Tpc2 are provided in one selected period every time the programming action is generated, even when the programming action is repeated, the programming disturbance can be effectively prevented from being cumulatively progressed in the first and second unselected memory cells M1 and M2. In addition, although the programming compensating voltage (−Vp/2) is applied to the selected memory cell M0 in the first programming compensating period Tpc1 and the second programming compensating period Tpc2, since it is applied only two times for one programming to the selected memory cell M0, that application is not accumulated, which is no problem.

In addition, according to the example 2, the order of the three periods of the programming period Tp, the first programming compensating period Tpc1, and the second programming compensating period Tpc2 may be arbitrary and it may be such that the programming period Tp is provided after the first programming compensating period Tpc1 and the second programming compensating period Tpc2, for example.

In addition, according to the example 2, as shown in FIG. 13, since the column programming blocking voltage Vp/2 that is the half of the programming voltage Vp is applied to the unselected bit lines BLu, the column programming blocking voltage Vp/2 that is the half of the programming voltage Vp is applied to the unselected word lines Wlu, and it is not necessary to change the applied voltage of the (m−1) unselected bit lines BLu and the (n−1) unselected word lines WLu over the three periods of the programming period Tp, the first programming compensating period Tpc1 and the second programming compensating period Tpc2, the driving control of the word line and the bit line can be simplified.

In addition, according to the example 2, when each length of the first programming compensating period Tpc1, and the second programming compensating period Tpc2 is adjusted such that the programming compensation can be most highly efficient, each length of the programming period Tp, the first programming compensating period Tpc1, and the second programming compensating period Tpc2 may not be always equal or the absolute values of the programming compensating voltage Vpc and the programming blocking voltage (Vp/2) may not be always equal.

Next, a description will be made of a voltage pulse applying process from the voltage switch circuit 7a to each of word lines (the selected word line WLs and the unselected word lines WLu) and each of bit lines (the selected bit line BLs and unselected bit lines BLu) of the memory cell array 3, to apply the erasing voltage (−Ve) to the selected memory cell M0 and to apply an erasing compensating voltage Vec to the first and second unselected memory cells M1 and M2 at the time of erasing action using two following examples.

EXAMPLE 3

In an Example 3, a description will be made of a process in a case where the application of the erasing voltage (−Ve) to the selected memory cell M0 (erasing period Te), the application of the erasing compensating voltage Vec to the first unselected memory cells M1 (first erasing compensating period Tec1), the application of the erasing compensating voltage Vec to the second unselected memory cells M2 (second erasing compensating period Tec2) are performed in a time-division manner, at the time of erasing action in one selected period until the selection of the selected memory cell is switched to another selected memory cell, with reference to FIG. 14. In addition, it is to be noted that in the example 3 that the first erasing compensating period Tec1 and the second erasing compensating period Tec2 are the same or almost the same length as the erasing period Te. That is, Te=Te1=Tec2 or Te≅Tec1≅Tec2.

Figure 14:
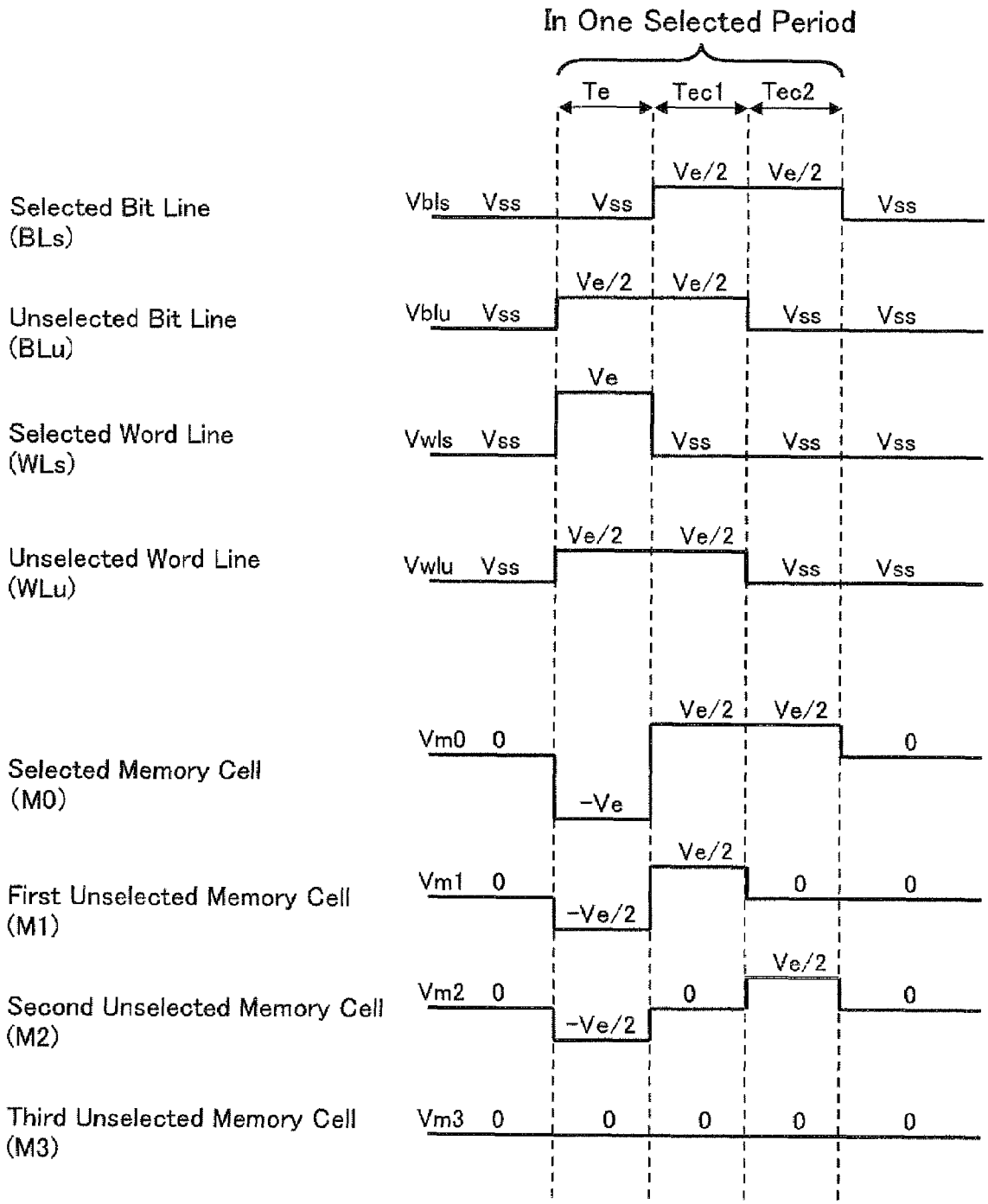
FIG. 14 is a timing chart showing one example of a voltage applying process to each word line and each bit line and a voltage applied state in each memory cell at the time of a data erasing action in a nonvolatile semiconductor memory device according to an Example 3 of the present invention.

FIG. 14 shows voltage changes of the voltage Vbls applied to the selected bit line BLs, the voltage Vblu applied to the unselected bit lines BLu, the voltage Vwls applied to the selected word line WLs, the voltage Vwlu applied to the unselected word lines WLu, the voltage Vm0 applied across the variable resistance element of the selected memory cell M0, the voltage Vm1 applied across the variable resistance element of each of the first unselected memory cells M1, the voltage Vm2 applied across the variable resistance element of each of the second unselected memory cells M2, and the voltage Vm3 applied across the variable resistance element of each of the third unselected memory cells M3, in the erasing period Te, the first erasing compensating period Tec1, and the second erasing compensating period Tec2. In addition, the voltage applied to each memory cell is based on a terminal (0V) connected to the word line side.

First, as shown in FIG. 14, in the erasing period Te, a column erasing voltage having the same voltage as the ground potential Vss is applied to the selected bit line BLs, the column erasing blocking voltage Ve/2 that is the half of the erasing supply voltage Ve is applied to the unselected bit lines BLu, the row erasing voltage Ve having the same voltage as the erasing supply voltage Ve is applied to the selected word line WLs, and the row erasing blocking voltage Ve/2 that is the half of the erasing supply voltage Ve is applied to the unselected word lines WLu. As a result, the erasing voltage (−Ve) that is the voltage difference (Vbls−Vwls) between the selected bit line BLs and the selected word line WLs is applied to the selected memory cell M0, the erasing blocking voltage (−Ve/2) that is the half of the erasing voltage (−Ve) and the voltage difference (Vblu−Vwls) between the unselected bit lines BLu and the selected word line WLs is applied to the first unselected memory cells M1, the erasing blocking voltage (−Ve/2) that is the half of the erasing voltage (−Ve) and the voltage difference (Vbls−Vwlu) between the selected bit line BLs and the unselected word lines WLu is applied to the second unselected memory cells M2, and 0V that is the voltage difference (Vblu−Vwlu) between the unselected bit lines BLu and the unselected word lines WLu is applied to the third unselected memory cells M3. These applied voltages in the erasing period Te are shown collectively in formulas 5.

As a result, in the erasing period Te, erasing is performed in the selected memory cell M0 while erasing is not performed for the first unselected memory cells M1 and the second unselected memory cells M2 because the erasing blocking voltage insufficient for the erasing action is applied to them but the erasing disturbance is caused.

Formulas 5

$Vbls=Vss$ (application of the column erasing voltage $Vss$)

$Vblu=Ve/2$ (application of the column erasing blocking voltage $Ve/2$)

$Vwls=Ve$ (application of the row erasing voltage $Ve$)

$Vwlu=Ve/2$ (application of the row erasing blocking voltage $Ve/2$)

$Vm0=-Ve$ (erasing of the selected memory cell $M0$)

$Vm1=-Ve/2$ (erasing disturbance in the first unselected memory cells $M1$)

$Vm2=-Ve/2$ (erasing disturbance in the second unselected memory cells $M2$)

$Vm3=0\ [V]$

Then, in the first erasing compensating period Tec1, the erasing compensating voltage Vec for compensating the erasing disturbance in the first unselected memory cells M1 generated in the erasing period Te is applied to the first unselected memory cells M1. More specifically, as shown in FIG. 14, the column erasing blocking voltage Ve/2 that is the half of the erasing supply voltage Ve is applied to the selected bit line BLs, the column erasing blocking voltage Ve/2 that is the half of the erasing supply voltage Ve is applied to the unselected bit lines BLu, the ground potential Vss is applied to the selected word line WLs, and the row erasing blocking voltage Ve/2 that is the half of the erasing supply voltage Ve is applied to the unselected word lines WLu. As a result, the voltage difference (Vbls−Vwls=Ve/2) between the selected bit line BLs and the selected word line WLs is applied to the selected memory cell M0, the erasing compensating voltage (Vec=Ve/2) that is the voltage difference (Vblu−Vwls) between the unselected bit lines BLu and the selected word line WLs is applied to the first unselected memory cells M1, the voltage difference (Vbls−Vwlu=0V) between the selected bit line BLs and the unselected word lines WLu is applied to the second unselected memory cells M2, and the voltage difference (Vblu−Vwlu=0V) between the unselected bit lines BLu and the unselected word lines WLu is applied to the third unselected memory cells M3. These applied voltages in the first erasing compensating period Tec1 are shown in formulas 6 collectively.

As a result, in the first erasing compensating period Tec1, the erasing compensating voltage (Vec=Ve/2) having the same voltage magnitude as the erasing blocking voltage (−Ve/2) applied in the erasing period Te and an opposite polarity to it is applied to the first unselected memory cells M1, and its resistance changed in the erasing period Te is brought to its original resistance state, so that the degree of the erasing disturbance generated in the first unselected memory cells M1 once can be reduced.

Formulas 6

$Vbls=Ve/2$ $Vblu=Ve/2$ $Vwls=Vss$ $Vwlu = Ve/2$ $Vm0 = Ve/2$ $Vm1 = Ve/2$ (application of the erasing compensating voltage to the first unselected memory cells $M1$)

$Vm2 = 0 [V]$ $Vm3 = 0 [V]$

Then, in the second erasing compensating period Tec2, the erasing compensating voltage Vec for compensating the erasing disturbance in the second unselected memory cells M2 generated in the erasing period Te is applied to the second unselected memory cells M2. More specifically, as shown in FIG. 14, the column erasing blocking voltage Ve/2 that is the half of the erasing supply voltage Ve is applied to the selected bit line BLs, the ground potential Vss is applied to the unselected bit lines BLu, the ground potential Vss is applied to the selected word line WLs, and the ground potential Vss is applied to the unselected word lines WLu. As a result, the voltage difference (Vbls−Vwls=Ve/2) between the selected bit line BLs and the selected word line WLs is applied to the selected memory cell M0, the voltage difference (Vblu−Vwls) between the unselected bit lines BLu and the selected word line WLs is applied to the first unselected memory cells M1, the erasing compensating voltage (Vec=Ve/2) that is the voltage difference (Vbls−Vwlu) between the selected bit line BLs and the unselected word lines WLu is applied to the second unselected memory cells M2, and the voltage difference (Vblu−Vwlu=0V) between the unselected bit lines BLu and the unselected word lines WLu is applied to the third unselected memory cells M3. These applied voltages in the second erasing compensating period Tec2 are shown in formulas 7 collectively.

As a result, in the second erasing compensating period Tec2, the erasing compensating voltage (Vec=Ve/2) having the same voltage magnitude as the erasing blocking voltage (−Ve/2) applied in the erasing period Te and an opposite polarity to it is applied to the second unselected memory cells M2, and its resistance changed in the erasing period Te is brought to its original resistance state, so that the degree of the erasing disturbance generated in the second unselected memory cells M2 once can be reduced.

Formulas 7

$Vbls = Ve/2$ $Vblu = Vss$ $Vwls = Vss$ $Vwlu = Vss$ $Vm0 = Ve/2$ $Vm1 = 0 [V]$ $Vm2 = Ve/2$ (application of the erasing compensating voltage to the second unselected memory cells $M2$)

$Vm3 = 0 [V]$

As described above, according to the example 3, since three periods such as the erasing period Te, the first erasing compensating period Tec1, and the second erasing compensating period Tec2 are provided in one selected period every time the erasing action is generated, even when the erasing action is repeated, the erasing disturbance can be effectively prevented from being cumulatively progressed in the first and second unselected memory cells M1 and M2. In addition, although the erasing compensating voltage (Ve/2) is applied to the selected memory cell M0 in the first erasing compensating period Tec1 and the second erasing compensating period Tec2, since it is applied only two times for one erasing action to the selected memory cell M0, that application is not accumulated, which is no problem.

In addition, according to the example 3, the order of the three periods of the erasing period Te, the first erasing compensating period Tec1, and the second erasing compensating period Tec2 may be arbitrary and it may be such that the erasing period Te is provided after the first erasing compensating period Tec1 and the second erasing compensating period Tec2, for example.

In addition, according to the example 3, when each length of the first erasing compensating period Tec1, and the second erasing compensating period Tec2 is adjusted such that the programming compensation can be most highly efficient, each length of the erasing period Te, the first erasing compensating period Tec1, and the second erasing compensating period Tec2 may not be always equal or the absolute values of the erasing compensating voltage Vec and the erasing blocking voltage (−Ve/2) may not be always equal.

EXAMPLE 4

In an Example 4, a description will be made of another process in a case where the application of the erasing voltage (−Ve) to the selected memory cell M0 (erasing period Te), the application of the erasing compensating voltage Vec to the first unselected memory cells M1 (first erasing compensating period Tec1), the application of the erasing compensating voltage Vec to the second unselected memory cells M2 (second erasing compensating period Tec2) are performed in a time-division manner, at the time of erasing action in one selected period until the selection of the selected memory cell is switched to another selected memory cell, with reference to FIG. 15. In addition, it is to be noted that in the example 4 that the first erasing compensating period Tec1 and the second erasing compensating period Tec2 are the same or almost the same length as the erasing period Te. That is, Te=Tec1=Tec2 or Te≅Tec1≅Tec2.

Figure 15:
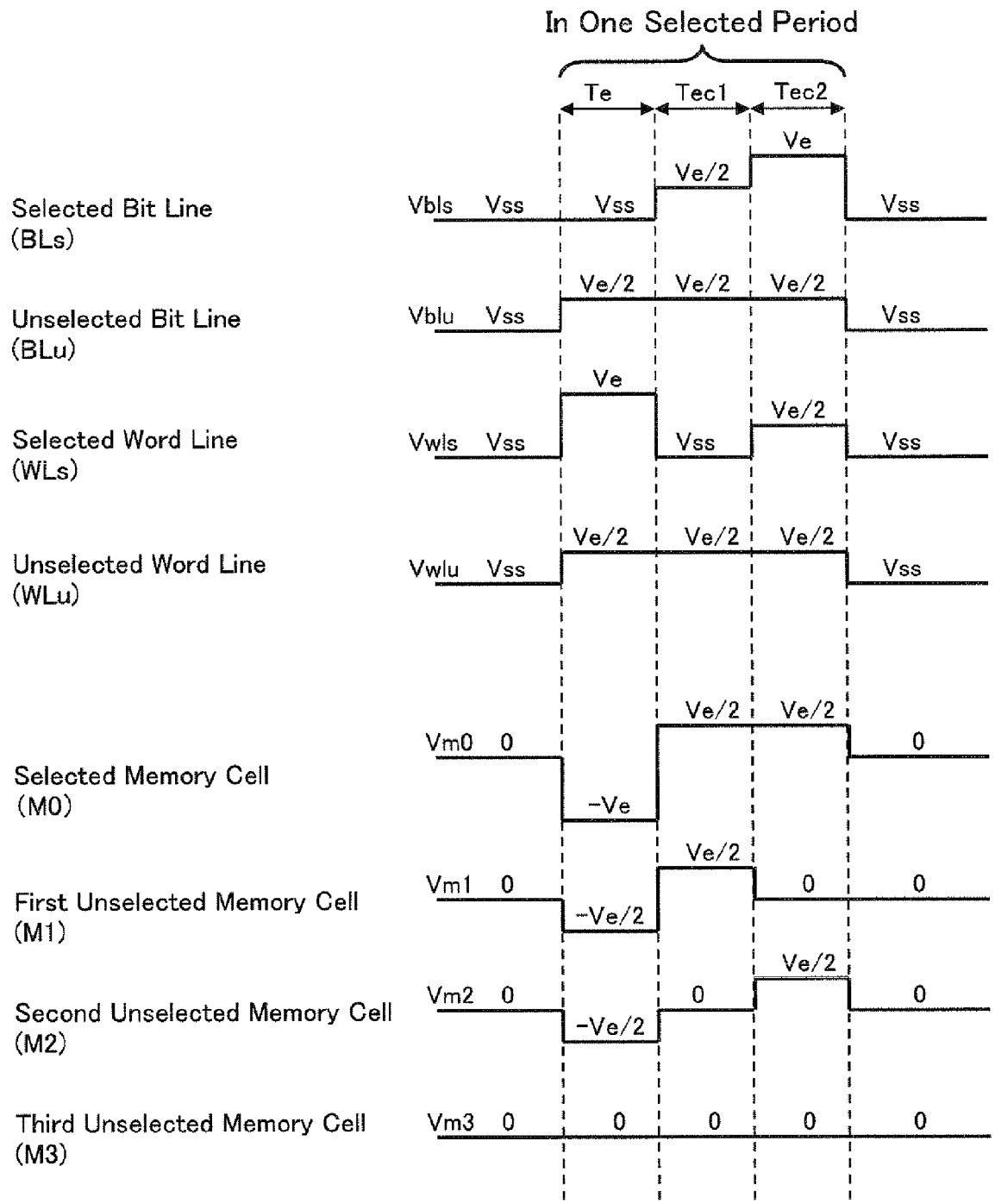
FIG. 15 is a timing chart showing one example of a voltage applying process to each word line and each bit line and a voltage applied state in each memory cell at the time of a data erasing action in a nonvolatile semiconductor memory device according to an Example 4 of the present invention.

FIG. 15 shows voltage changes of the voltage Vbls applied to the selected bit line BLs, the voltage Vblu applied to the unselected bit lines BLu, the voltage Vwls applied to the selected word line WLs, the voltage Vwlu applied to the unselected word lines WLu, the voltage Vm0 applied across the variable resistance element of the selected memory cell M0, the voltage Vm1 applied across the variable resistance element of each of the first unselected memory cells M1, the voltage Vm2 applied across the variable resistance element of each of the second unselected memory cells M2, and the voltage Vm3 applied across the variable resistance element of each of the third unselected memory cells M3, in the erasing period Te, the first erasing compensating period Tec1, and the second erasing compensating period Tec2. In addition, the voltage applied to each memory cell is based on a terminal (0V) connected to the word line side.

First, as shown in FIG. 15, in the erasing period Te, the column erasing voltage having the same voltage as the ground potential Vss is applied to the selected bit line BLs, the column erasing blocking voltage Ve/2 that is the half of the erasing supply voltage Ve is applied to the unselected bit lines BLu, the row erasing voltage Ve having the same voltage as the erasing supply voltage Ve is applied to the selected word line WLs, and the row erasing blocking voltage Ve/2 that is the half of the erasing supply voltage Ve is applied to the unselected word lines WLu. As a result, the erasing voltage (−Ve) that is the voltage difference (Vbls−Vwls) between the selected bit line BLs and the selected word line WLs is applied to the selected memory cell M0, the erasing blocking voltage (−Ve/2) that is the half of the erasing voltage (−Ve) and the voltage difference (Vblu−Vwls) between the unselected bit lines BLu and the selected word line WLs is applied to the first unselected memory cells M1, the erasing blocking voltage (−Ve/2) that is the half of the erasing voltage (−Ve) and the voltage difference (Vbls−Vwlu) between the selected bit line BLs and the unselected word lines WLu is applied to the second unselected memory cells M2, and 0V that is the voltage difference (Vblu−Vwlu) between the unselected bit lines BLu and the unselected word lines WLu is applied to the third unselected memory cells M3, which is totally the same as in the example 3 and these applied voltages in the erasing period Te are the same as shown in formulas 5.

As a result, in the erasing period Te, erasing is performed in the selected memory cell M0 while erasing is not performed for the first unselected memory cells M1 and the second unselected memory cells M2 because the erasing blocking voltage insufficient for the erasing action is applied to them but the erasing disturbance is generated.

Then, in the first erasing compensating period Tec1, the erasing compensating voltage Vec for compensating the erasing disturbance in the first unselected memory cells M1 generated in the erasing period Te is applied to the first unselected memory cells M1. More specifically, as shown in FIG. 15, the column erasing blocking voltage Ve/2 that is the half of the erasing supply voltage Ve is applied to the selected bit line BLs, the column erasing blocking voltage Ve/2 that is the half of the erasing supply voltage Ve is applied to the unselected bit lines BLu, the ground potential Vss is applied to the selected word line WLs, and the row erasing blocking voltage Ve/2 that is the half of the erasing supply voltage Ve is applied to the unselected word lines WLu. As a result, the voltage difference (Vbls−Vwls=Ve/2) between the selected bit line BLs and the selected word line WLs is applied to the selected memory cell M0, the erasing compensating voltage (Vec=Ve/2) that is the voltage difference (Vblu−Vwls) between the unselected bit lines BLu and the selected word line WLs is applied to the first unselected memory cells M1, the voltage difference (Vbls−Vwlu=0V) between the selected bit line BLs and the unselected word lines WLu is applied to the second unselected memory cells M2, and the voltage difference (Vblu−Vwlu=0V) between the unselected bit lines BLu and the unselected word lines WLu is applied to the third unselected memory cells M3, which is totally the same as in the example 3 and these applied voltages in the first erasing compensating period Tec1 are the same as those shown in formulas 6.

As a result, in the first erasing compensating period Tec1, the erasing compensating voltage (Vec=Ve/2) having the same voltage magnitude as the erasing blocking voltage (−Ve/2) applied in the erasing period Te and an opposite polarity to it is applied to the first unselected memory cells M1, and its resistance changed in the erasing period Te is brought to its original resistance state, so that the degree of the erasing disturbance generated in the first unselected memory cells M1 once can be reduced.

Then, in the second erasing compensating period Tec2, the erasing compensating voltage Vec for compensating the erasing disturbance in the second unselected memory cells M2 generated in the erasing period Te is applied to the second unselected memory cells M2. More specifically, as shown in FIG. 15, the column erasing voltage Ve having the same voltage as the erasing supply voltage Ve is applied to the selected bit line BLs, the row erasing blocking voltage Ve/2 that is the half of the erasing supply voltage Ve is applied to the unselected bit lines BLu, the row erasing blocking voltage Ve/2 that is the half of the erasing supply voltage Ve is applied to the selected word line WLs, and the row erasing blocking voltage Ve/2 that is the half of the erasing supply voltage Ve is applied to the unselected word lines WLu. As a result, the voltage difference (Vbls−Vwls=Ve/2) between the selected bit line BLs and the selected word line WLs is applied to the selected memory cell M0, the voltage difference (Vblu−Vwls=0V) between the unselected bit lines BLu and the selected word line WLs is applied to the first unselected memory cells M1, the erasing compensating voltage (Vec=Ve/2) that is the voltage difference (Vbls−Vwlu) between the selected bit line BLs and the unselected word lines WLu is applied to the second unselected memory cells M2, and the voltage difference (Vblu−Vwlu=0V) between the unselected bit lines BLu and the unselected word lines WLu is applied to the third unselected memory cells M3. These applied voltages in the second erasing compensating period Tec2 are shown in formulas 8 collectively, in which the applied voltages to the selected bit line BLs, unselected bit lines BLu, selected word line WLs and selected word line WLs are shifted from the voltages applied in the example 3 toward the high voltage side by Ve/2, respectively.

As a result, in the second erasing compensating period Tec2, the erasing compensating voltage (Vec=Ve/2) having the same voltage magnitude as the erasing blocking voltage (−Ve/2) applied in the erasing period Te and an opposite polarity to it is applied to the second unselected memory cells M2, and its resistance changed in the erasing period Te is brought to its original resistance state, so that the degree of the erasing disturbance generated in the second unselected memory cells M2 once can be reduced.

Formulas 8

$Vbls = Ve$ $Vblu = Ve/2$ $Vwls = Ve/2$ $Vwlu = Ve/2$ $Vm0 = Ve/2$ $Vm1 = 0\,[V]$ $Vm2 = Ve/2$ (application of the erasing compensating voltage to the second unselected memory cells M2)

$Vm3 = 0\,[V]$

As described above, according to the example 4, since three periods such as the erasing period Te, the first erasing compensating period Tec1, and the second erasing compensating period Tec2 are provided in one selected period every time the erasing action is generated, even when the erasing action is repeated, the erasing disturbance can be prevented from being cumulatively progressed in the first and second unselected memory cells M1 and M2. In addition, although the erasing compensating voltage (Ve/2) is applied to the selected memory cell M0 in the first erasing compensating period Tec1 and the second erasing compensating period Tec2, since it is applied only two times for one erasing action to the selected memory cell M0, that application is not accumulated, which is no problem.

In addition, according to the example 4, the order of the three periods of the erasing period Te, the first erasing compensating period Tec1, and the second erasing compensating period Tec2 may be arbitrary and it may be such that the erasing period Te is provided after the first erasing compensating period Tec1 and the second erasing compensating period Tec2, for example.

In addition, according to the example 4, as shown in FIG. 15, since the column erasing blocking voltage Ve/2 that is the half of the erasing supply voltage Ve is applied to the unselected bit lines BLu, the row erasing blocking voltage Ve/2 that is the half of the erasing supply voltage Ve is applied to the unselected word lines Wlu, and it is not necessary to change the applied voltage of the (m−1) unselected bit lines BLu and the (n−1) unselected word lines WLu over the three periods of the erasing period Te, the first erasing compensating period Tec1 and the second erasing compensating period Tec2, the driving control of the word line and the bit line can be simplified.

In addition, when each length of the first erasing compensating period Tec1, and the second erasing compensating period Tec2 is adjusted such that the erasing compensation can be most highly efficient, each length of the erasing period Te, the first erasing compensating period Tec1, and the second erasing compensating period Tec2 may not be always equal or the absolute values of the erasing compensating voltage Vec and the erasing blocking voltage (−Ve/2) may not be always equal.

Second Embodiment

Figure 16:
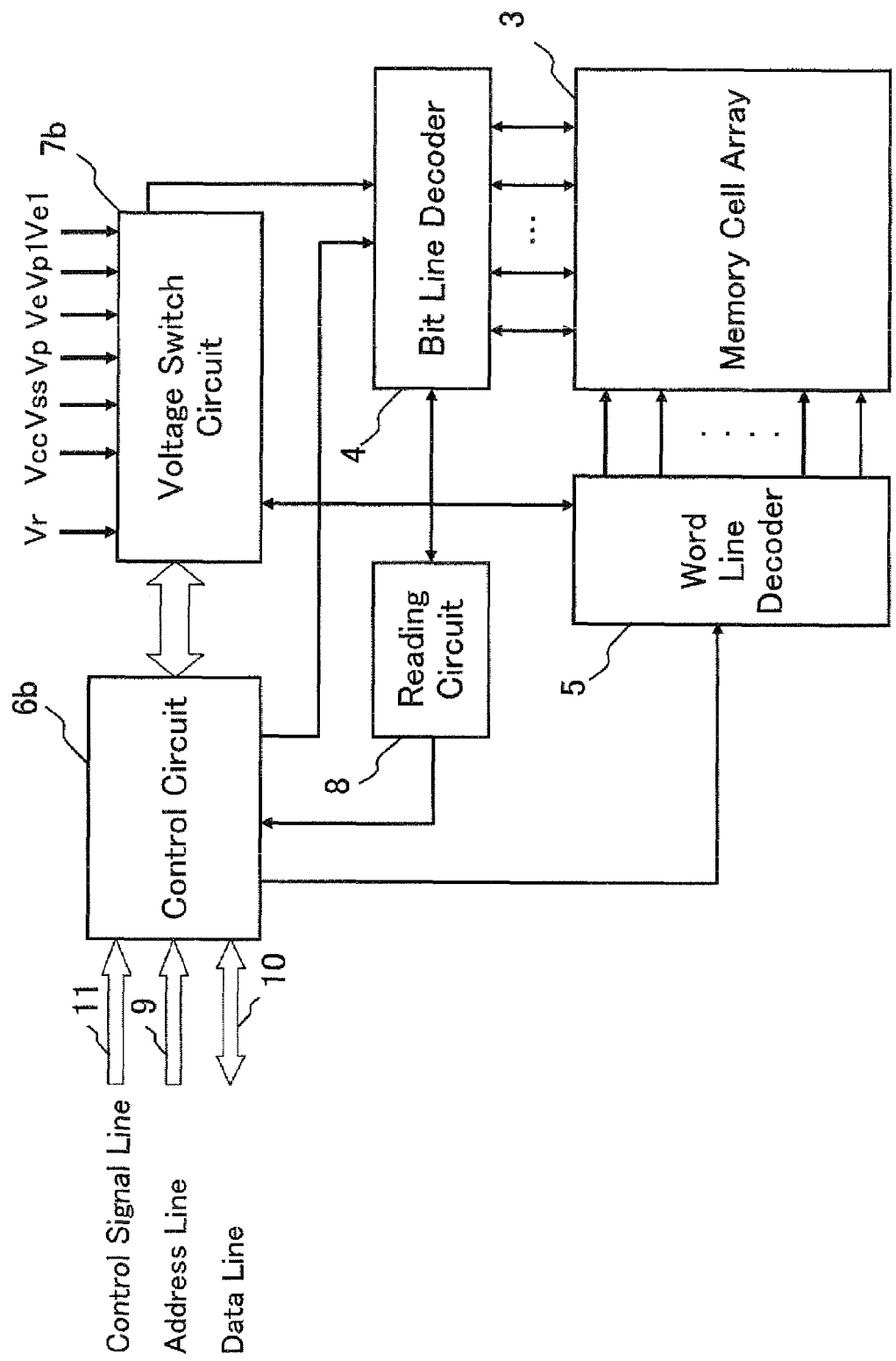
FIG. 16 is a block diagram schematically showing the constitution of a nonvolatile semiconductor memory device according to a second embodiment of the present invention.

FIG. 16 schematically shows one constitution example of the device of the present invention in a second embodiment. In addition, in FIG. 16, the same references are allotted to the components common to those in the device in the first embodiment and in the conventional nonvolatile semiconductor memory device in the following description. As shown in FIG. 16, the device comprises a bit line decoder 4, a word line decoder 5, a voltage switch circuit 7b, a reading circuit 8, and a control circuit 6b in the periphery of a cross-point type memory cell array 3 in which 1R type memory cells (not shown) are arranged in the form of a matrix. Basically, it has the same constitution as in the device of the present invention in the first embodiment provided with the memory cell array comprising 1R type memory cells shown in FIG. 10. In addition, the constitution of the memory cell array 3 is also the same as that of the memory cell array 3 in the device of the present invention in the first embodiment. The part overlapping with the part in the first embodiment will not be described in detail.

This embodiment is different from the first embodiment in a voltage applied from the voltage switch circuit 7b to the memory cell array 3 and its timing action, and the operation of the control circuit 6b for controlling the operation of the voltage switch circuit 7b. More specifically, it is different from the first embodiment in the fact that independent programming compensating supply voltage Vp1 and an erasing compensating supply voltage Ve1 are provided as inputs to the voltage switch circuit 7b, and in applied voltages and their applying times to the selected word line WLs and the unselected word lines WLu, and the selected bit line BLs and the unselected bit lines BLu in the first programming compensating period Tpc1 and the second programming compensating period Tpc2 at the time of programming, and in the first erasing compensating period Tec1 and the second erasing compensating period Tec2 at the time of erasing. The programming compensating supply voltage Vp1 is lower than the programming voltage Vp and higher than the programming blocking voltage Vp/2 that is the half of the programming voltage Vp (Vp>Vp1>Vp/2). In addition, the erasing compensating supply voltage Ve1 is lower than the erasing supply voltage Ve and higher than the voltage Ve/2 that is the half of the erasing supply voltage Ve (Ve>Ve1>Ve/2).

Next, a description will be made of a voltage pulse applying process from the voltage switch circuit 7b to each of word lines (the selected word line WLs and the unselected word lines WLu) and each of bit lines (the selected bit line BLs and unselected bit lines BLu) of the memory cell array 3, to apply the programming voltage Vp to the selected memory cell M0 and to apply a programming compensating voltage Vpc' to the first and second unselected memory cells M1 and M2 using one following example.

EXAMPLE 5

In an Example 5, a description will be made of a process in a case where the application of the programming voltage Vp to the selected memory cell M0 (programming period Tp), the application of the programming compensating voltage Vpc' to the first unselected memory cells M1 (first programming compensating period Tpc1), the application of the programming compensating voltage Vpc' to the second unselected memory cells M2 (second programming compensating period Tpc2) are performed in a time-division manner, at the time of programming action in one selected period until the selection of the selected memory cell is switched to another selected memory cell, with reference to FIG. 17. In addition, in the example 5, it is to be noted that the first programming compensating period Tpc1 and the second programming compensating period Tpc2 are set shorter than the programming period Tp. That is, Tp>Tpc1 and Tp>Tpc2.

Figure 17:
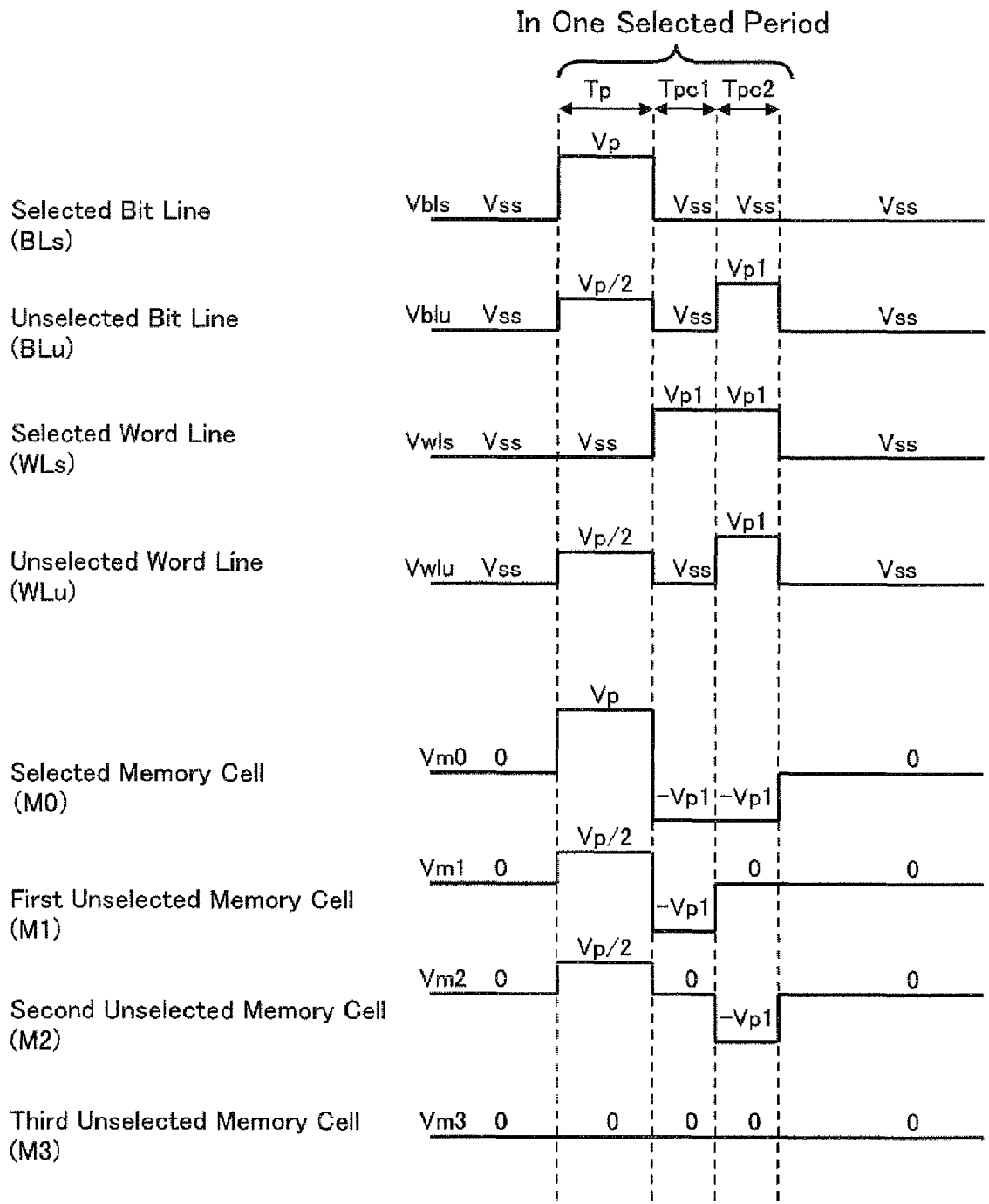
FIG. 17 is a timing chart showing one example of a voltage applying process to each word line and each bit line and a voltage applied state in each memory cell at the time of a data programming action in a nonvolatile semiconductor memory device according to an Example 5 of the present invention.

FIG. 17 shows voltage changes of a voltage Vbls applied to the selected bit line BLs, a voltage Vblu applied to the unselected bit lines BLu, a voltage Vwls applied to the selected word line WLs, a voltage Vwlu applied to the unselected word lines WLu, a voltage Vm0 applied across the variable resistance element of the selected memory cell M0, a voltage Vm1 applied across the variable resistance element of each of the first unselected memory cells M1, a voltage Vm2 applied across the variable resistance element of each of the second unselected memory cells M2, and a voltage Vm3 applied across the variable resistance element of each of the third unselected memory cells M3, in the programming period Tp, the first programming compensating period Tpc1, and the second programming compensating period Tpc2. In addition, the voltage applied to each memory cell is based on a terminal (0V) connected to the word line side.

First, as shown in FIG. 17, in the programming period Tp, a column programming voltage Vp having the same voltage as the programming voltage Vp is applied to the selected bit line BLs, a column programming blocking voltage Vp/2 that is half of the programming voltage Vp is applied to the unselected bit lines BLu, a row programming voltage having the same voltage as the ground potential Vss is applied to the selected word line WLs, and a row programming blocking voltage Vp/2 that is half of the programming voltage Vp is applied to the unselected word lines WLu. As a result, the programming voltage Vp that is the voltage difference (Vbls−Vwls) between the selected bit line BLs and the selected word line WLs is applied to the selected memory cell M0, the programming blocking voltage Vp/2 that is the half of the programming voltage Vp and the voltage difference (Vblu−Vwls) between the unselected bit lines BLu and the selected word line WLs is applied to the first unselected memory cells M1, the programming blocking voltage Vp/2 that is the half of the programming voltage Vp and the voltage difference (Vbls−Vwlu) between the selected bit line BLs and the unselected word lines WLu is applied to the second unselected memory cells M2, and 0V that is the voltage difference (Vblu−Vwlu) between the unselected bit lines BLu and the unselected word lines WLu is applied to the third unselected memory cells M3, which is totally the same as that in the example 1 in the first embodiment and these applied voltages in the programming period Tp are the same as shown in formulas 1.

As a result, in the programming period Tp, programming is performed in the selected memory cell M0 while programming is not performed for the first unselected memory cells M1 and the second unselected memory cells M2 because the programming blocking voltage insufficient for the programming action is applied to them but programming disturbance is caused.

Then, in the first programming compensating period Tpc1, the programming compensating voltage Vpc' (=−Vp1) for compensating the programming disturbance in the first unselected memory cells M1 generated in the programming period Tp is applied to the first unselected memory cells M1. More specifically, as shown in FIG. 17, the ground potential Vss is applied to the selected bit line BLs, the ground potential Vss is applied to the unselected bit lines BLu, the programming compensating supply voltage Vp1 (=−Vpc') having the same voltage magnitude as the programming compensating voltage Vpc' and an opposite polarity to it is applied to the selected word line WLs, and the ground potential Vss is applied to the unselected word lines WLu. As a result, the voltage difference (Vbls−Vwls=−Vp1) between the selected bit line BLs and the selected word line WLs is applied to the selected memory cell M0, the programming compensating voltage (Vpc'=−Vp1) that is the voltage difference (Vblu−Vwls) between the unselected bit lines BLu and the selected word line WLs is applied to the first unselected memory cells M1, the voltage difference (Vbls−Vwlu=0V) between the selected bit line BLs and the unselected word lines WLu is applied to the second unselected memory cells M2, and the voltage difference (Vblu−Vwlu=0V) between the unselected bit lines BLu and the unselected word lines WLu is applied to the third unselected memory cells M3. These applied voltages in the first programming compensating period Tpc1 are shown in formulas 9 collectively.

As a result, in the first programming compensating period Tpc1, the programming compensating voltage (Vpc'=−Vp1) whose absolute value is higher than the programming blocking voltage Vp/2 applied in the programming period Tp and polarity is opposite to it is applied to the first unselected memory cells M1, and its resistance changed in the programming period Tp is brought to its original resistance state, so that the degree of the programming disturbance generated in the first unselected memory cells M1 once can be reduced.

Formulas 9

$Vbls = Vss$ $Vblu = Vss$ $Vwls = Vp1$ $Vwlu = Vss$ $Vm0 = -Vp1$ $Vm1 = -Vp1$ (application of the programming compensating voltage to the first unselected memory cells M1)

$Vm2 = 0 [V]$ $Vm3 = 0 [V]$

Then, in the second programming compensating period Tpc2, the programming compensating voltage Vpc' (=−Vp1) for compensating the programming disturbance in the second unselected memory cells M2 generated in the programming period Tp is applied to the second unselected memory cells M2. More specifically, as shown in FIG. 17, the ground potential Vss is applied to the selected bit line BLs, the programming compensating supply voltage Vp1 (=−Vpc') having the same voltage magnitude as the programming compensating voltage Vpc' and an opposite polarity to it is applied to the unselected bit lines BLu, the programming compensating supply voltage Vp1 (=−Vpc') having the same voltage magnitude as the programming compensating voltage Vpc' and the opposite polarity to it is applied to the selected word line WLs, and the programming compensating supply voltage Vp1 (=−Vpc') having the same voltage magnitude as the programming compensating voltage Vpc' and the opposite polarity to it is applied to the unselected word lines WLu. As a result, the voltage difference (Vbls−Vwls=−Vp1) between the selected bit line BLs and the selected word line WLs is applied to the selected memory cell M0, the voltage difference (Vblu−Vwls=0V) between the unselected bit lines BLu and the selected word line WLs is applied to the first unselected memory cells M1, the programming compensating voltage (Vpc'=−Vp1) that is the voltage difference (Vbls−Vwlu) between the selected bit line BLs and the unselected word lines WLu is applied to the second unselected memory cells M2, and the voltage difference (Vblu−Vwlu=0V) between the unselected bit lines BLu and the unselected word lines WLu is applied to the third unselected memory cells M3. These applied voltages in the second programming compensating period Tpc2 are shown in formulas 10 collectively.

As a result, in the second programming compensating period Tpc2, the programming compensating voltage (Vpc=−Vp/2) whose absolute value is higher than the programming blocking voltage Vp/2 applied in the programming period Tp and polarity is opposite to it is applied to the second unselected memory cells M2, and its resistance changed in the programming period Tp is brought to its original resistance state, so that the degree of the programming disturbance generated in the second unselected memory cells M2 once can be reduced.

Formulas 10

$Vbls = Vss$ $Vblu = Vp1$ $Vwls = Vp1$ $Vwlu = Vp1$ $Vm0 = -Vp1$ $Vm1 = 0 [V]$ $Vm2 = -Vp1$ (application of the programming compensating voltage to the second unselected memory cells M2)

$Vm3 = 0 [V]$

As described above, according to the example 5, since three periods such as the programming period Tp, the first programming compensating period Tpc1, and the second programming compensating period Tpc2 are provided in one selected period every time the programming action is generated, even when the programming action is repeated, the programming disturbance can be effectively prevented from being cumulatively progressed in the first and second unselected memory cells M1 and M2. This embodiment is different from the first embodiment in that the absolute value of the programming compensating voltage (Vpc'=−Vp1) is higher than the programming compensating voltage (Vpc=−Vp/2) in the first embodiment and the first programming compensating periods Tpc1 and the second programming compensating period Tpc2 are shorter than the programming period Tp. Although there is such different point, it is clear from curved lines C to E in FIG. 8 that the programming disturbance can be compensated. That is, although the effect to bring the resistance change generated at the time of programming to its original value is lowered when the first programming compensating period Tpc1 and the second programming compensating period Tpc2 are shortened, since the effect to bring the resistance change generated at the time of programming to its original value is increased by increasing the absolute value of the programming compensating voltage, so that the same effect as that in the example 1 in the first embodiment can be provided.

In addition, although the programming compensating voltage (−Vp1) is applied to the selected memory cell M0 in the first programming compensating period Tpc1 and the second programming compensating period Tpc2, since it is applied only two times for one programming action to the selected memory cell M0, that application is not accumulated, which is no problem.

In addition, according to the example 5, the order of the three periods of the programming period Tp, the first programming compensating period Tpc1, and the second programming compensating period Tpc2 may be arbitrary and it may be such that the programming period Tp is provided after the first programming compensating period Tpc1 and the second programming compensating period Tpc2, for example.

In addition, according to the second embodiment, since the first programming compensating period Tpc1 and the second programming compensating period Tpc2 are shorter than those in the first embodiment, its one selected period can be short, so that its total programming time required for the programming action including programming compensation can be shortened.

Next, a description will be made of a voltage pulse applying process from the voltage switch circuit 7a to each of word lines (the selected word line WLs and the unselected word lines WLu) and each of bit lines (the selected bit line BLs and the unselected bit lines BLu) of the memory cell array 3, to apply the erasing voltage (−Ve) to the selected memory cell M0 and to apply an erasing compensating voltage Vec' to the first and second unselected memory cells M1 and M2 with one following example.

EXAMPLE 6

In an Example 6, a description will be made of a process in a case where the application of the erasing voltage (−Ve) to the selected memory cell M0 (erasing period Te), the application of the erasing compensating voltage Vec' to the first unselected memory cells M1 (first erasing compensating period Tec1), the application of the erasing compensating voltage Vec' to the second unselected memory cells M2 (second erasing compensating period Tec2) are performed in a time-division manner, at the time of erasing action in one selected period until the selection of the selected memory cell is switched to another selected memory cell, with reference to FIG. 18. In addition, in the example 6, it is to be noted that the first erasing compensating period Tec1 and the second erasing compensating period Tec2 are set shorter than the erasing period Te. That is, Te>Tec1 and Te>Tec2.

Figure 18:
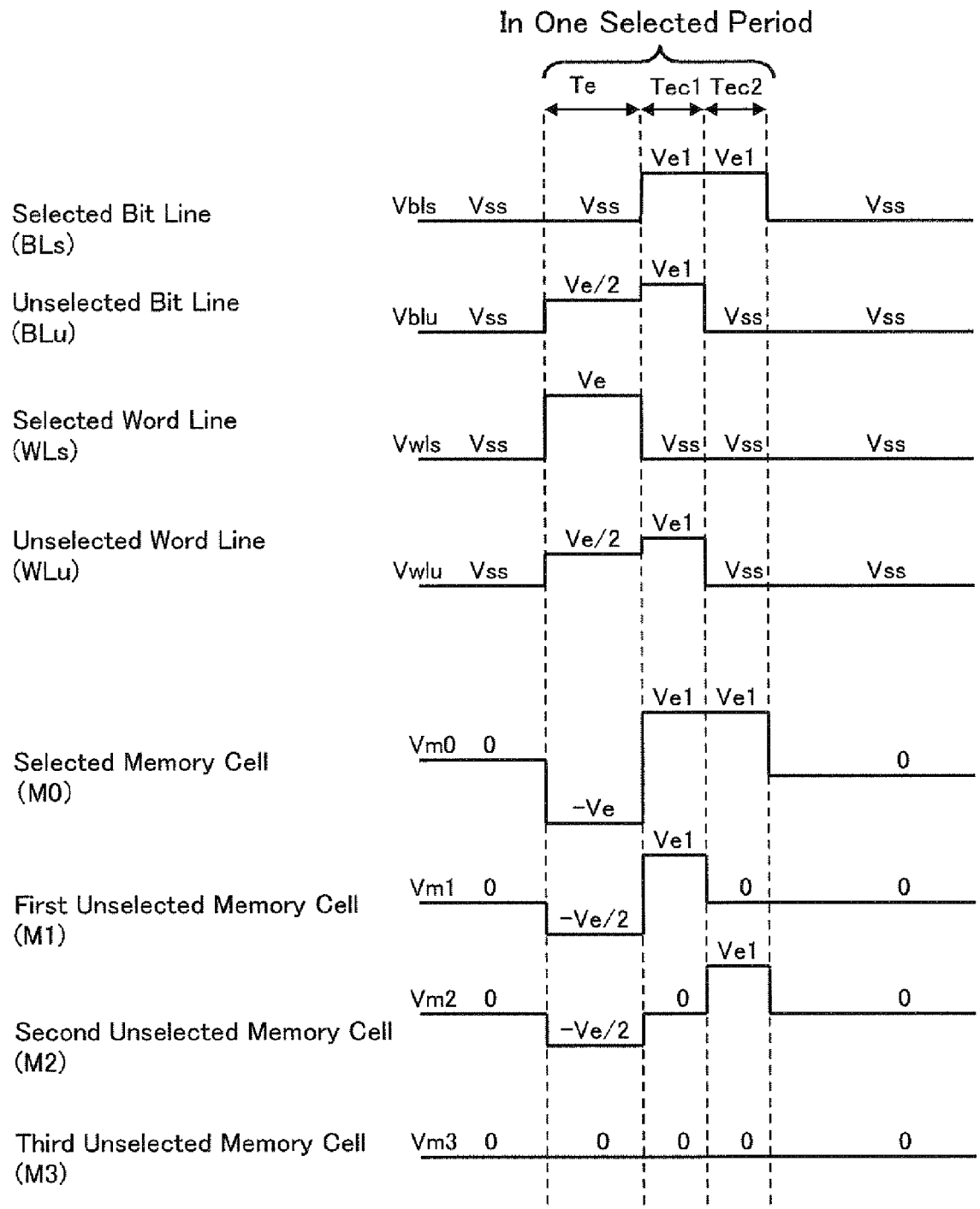
FIG. 18 is a timing chart showing one example of a voltage applying process to each word line and each bit line and a voltage applied state in each memory cell at the time of a data erasing action in a nonvolatile semiconductor memory device according to an Example 6 of the present invention.

FIG. 18 shows voltage changes of the voltage Vbls applied to the selected bit line BLs, the voltage Vblu applied to the unselected bit lines BLu, the voltage Vwls applied to the selected word line WLs, the voltage Vwlu applied to the unselected word lines WLu, the voltage Vm0 applied across the variable resistance element of the selected memory cell M0, the voltage Vm1 applied across the variable resistance element of the first unselected memory cells M1, the voltage Vm2 applied across the variable resistance element of the second unselected memory cells M2, and the voltage Vm3 applied across the variable resistance element of the third unselected memory cells M3, in the erasing period Te, the first erasing compensating period Tec1, and the second erasing compensating period Tec2. In addition, the voltage applied to each memory cell is based on a terminal (0V) connected to the word line side.

First, as shown in FIG. 18, in the erasing period Te, the column erasing voltage having the same voltage as the ground potential Vss is applied to the selected bit line BLs, the column erasing blocking voltage Ve/2 that is the half of the erasing supply voltage Ve is applied to the unselected bit lines BLu, the row erasing voltage Ve having the same voltage as the erasing supply voltage Ve is applied to the selected word line WLs, and the row programming blocking voltage Ve/2 that is the half of the erasing supply voltage Ve is applied to the unselected word lines WLu. As a result, the erasing voltage (−Ve) that is the voltage difference (Vbls−Vwls) between the selected bit line BLs and the selected word line WLs is applied to the selected memory cell M0, the erasing blocking voltage (−Ve/2) that is the half of the erasing voltage (−Ve) that is the voltage difference (Vblu−Vwls) between the unselected bit lines BLu and the selected word line WLs is applied to the first unselected memory cells M1, the erasing blocking voltage (−Ve/2) that is the half of the erasing voltage (−Ve) that is the voltage difference (Vbls−Vwlu) between the selected bit line BLs and the unselected word lines WLu is applied to the second unselected memory cells M2, and 0V that is the voltage difference (Vblu−Vwlu) between the unselected bit lines BLu and the unselected word lines WLu is applied to the third unselected memory cells M3, which is totally the same as that in the example 3 in the first embodiment and these applied voltages in the erasing period Te are the same as shown in formulas 5.

As a result, in the erasing period Te, erasing is performed in the selected memory cell M0 while erasing is not performed for the first unselected memory cells M1 and the second unselected memory cells M2 because the erasing blocking voltage insufficient for the erasing action is applied to them but erasing disturbance is caused.

Then, in the first erasing compensating period Tec1, the erasing compensating voltage Vec' (=Ve1) for compensating the erasing disturbance in the first unselected memory cells M1 generated in the erasing period Te is applied to the first unselected memory cells M1. More specifically, as shown in FIG. 18, the erasing compensating supply voltage Ve1 having the same voltage as the erasing compensating voltage Vec' is applied to the selected bit line BLs, the erasing compensating supply voltage Ve1 having the same voltage as the erasing compensating voltage Vec' is applied to the unselected bit lines BLu, the ground potential Vss is applied to the selected word line WLs, and the erasing compensating supply voltage Ve1 having the same voltage as the erasing compensating voltage Vec' is applied to the unselected word lines WLu. As a result, the voltage difference (Vbls−Vwls=Ve1) between the selected bit line BLs and the selected word line WLs is applied to the selected memory cell M0, the erasing compensating voltage (Vec'=Ve1) that is the voltage difference (Vblu−Vwls) between the unselected bit lines BLu and the selected word line WLs is applied to the first unselected memory cells M1, the voltage difference (Vbls−Vwlu=0V) between the selected bit line BLs and the unselected word lines WLu is applied to the second unselected memory cells M2, and the voltage difference (Vblu−Vwlu=0V) between the unselected bit lines BLu and the unselected word lines WLu is applied to the third unselected memory cells M3. These applied voltages in the first erasing compensating period Tec1 are shown in formulas 11 collectively.

As a result, in the first erasing compensating period Tec1, the erasing compensating voltage (Vec'=Ve1) whose absolute value is higher than the erasing blocking voltage (−Ve/2) applied in the erasing period Te and polarity is opposite to it is applied to the first unselected memory cells M1, and its resistance changed in the erasing period Te is brought to its original resistance state, so that the degree of the erasing disturbance generated in the first unselected memory cells M1 once can be reduced.

Formulas 11

$$Vbls = Ve1$$

$$Vblu = Ve1$$

$$Vwls = Vss$$

$$Vwlu = Ve1$$

$$Vm0 = Ve1$$

$$Vm1 = Ve1 \text{(application of the erasing compensating voltage to the first unselected memory cells } M1)$$

$$Vm2 = 0[V]$$

$$Vm3 = 0[V]$$

Then, in the second erasing compensating period Tec2, the erasing compensating voltage Vec' (=Ve1) for compensating the erasing disturbance in the second unselected memory cells M2 generated in the erasing period Te is applied to the second unselected memory cells M2. More specifically, as shown in FIG. 18, the erasing compensating supply voltage Ve1 having the same voltage as the erasing compensating voltage Vec' is applied to the selected bit line BLs, the ground potential Vss is applied to the unselected bit lines BLu, the ground potential Vss is applied to the selected word line WLs, and the ground potential Vss is applied to the unselected word lines WLu. As a result, the voltage difference (Vbls−Vwls=Ve1) between the selected bit line BLs and the selected word line WLs is applied to the selected memory cell M0, the voltage difference (Vblu−Vwls=0V) between the unselected bit lines BLu and the selected word line WLs is applied to the first unselected memory cells M1, the erasing compensating voltage (Vec'=Ve1) that is the voltage difference (Vbls−Vwlu) between the selected bit line BLs and the unselected word lines WLu is applied to the second unselected memory cells M2, and the voltage difference (Vblu−Vwlu=0V) between the unselected bit lines BLu and the unselected word lines WLu is applied to the third unselected memory cells M3. These applied voltages in the second erasing compensating period Tec2 are shown in formulas 12 collectively.

As a result, in the second erasing compensating period Tec2, the erasing compensating voltage (Vec'=Ve1) whose absolute value is higher than the erasing blocking voltage (−Ve/2) applied in the erasing period Te and polarity is opposite to it is applied to the second unselected memory cells M2, and its resistance changed in the erasing period Te is brought to its original resistance state, so that the degree of the erasing disturbance generated in the second unselected memory cells M2 once can be reduced.

Formulas 12

$$Vbls = Ve1$$

$$Vblu = Vss$$

$$Vwls = Vss$$

$$Vwlu = Vss$$

$$Vm0 = Ve1$$

$$Vm1 = 0[V]$$

$$Vm2 = Ve1 \text{(application of the erasing compensating voltage to the second unselected memory cells } M2)$$

$$Vm3 = 0[V]$$

As described above, according to the example 6, since three periods such as the erasing period Te, the first erasing compensating period Tec1, and the second erasing compensating period Tec2 are provided in one selected period every time the erasing action is generated, even when the erasing action is repeated, the erasing disturbance can be effectively prevented from being cumulatively progressed in the first and second unselected memory cells M1 and M2. This embodiment is different from the third example in the first embodiment in that the absolute value of the erasing compensating voltage (Vec'=Ve1) is higher than the erasing compensating voltage (Vec=Ve/2) in the first embodiment and the first erasing compensating periods Tec1 and the second erasing compensating period Tec2 are shorter than the erasing period Te. Although there is such different point, it is clear from curved lines C to E in FIG. 8 that the erasing disturbance can be compensated similar to the programming disturbance described in the example 5.

In addition, although the erasing compensating voltage (Ve1) is applied to the selected memory cell M0 in the first erasing compensating period Tec1 and the second erasing compensating period Tec2, since it is applied only two times for one erasing action to the selected memory cell M0, that application is not accumulated, which is no problem.

In addition, according to the example 6, the order of the three periods of the erasing period Te, the first erasing compensating period Tec1, and the second erasing compensating period Tec2 may be arbitrary and it may be such that the erasing period Te is provided after the first erasing compensating period Tec1 and the second erasing compensating period Tec2, for example.

In addition, according to the second embodiment, since the first erasing compensating period Tec1 and the second erasing compensating period Tec2 are shorter than those in the first embodiment, its one selected period can be short, so that its total erasing time required for the erasing action including erasing compensation can be shortened.

Third Embodiment

Figure 19:
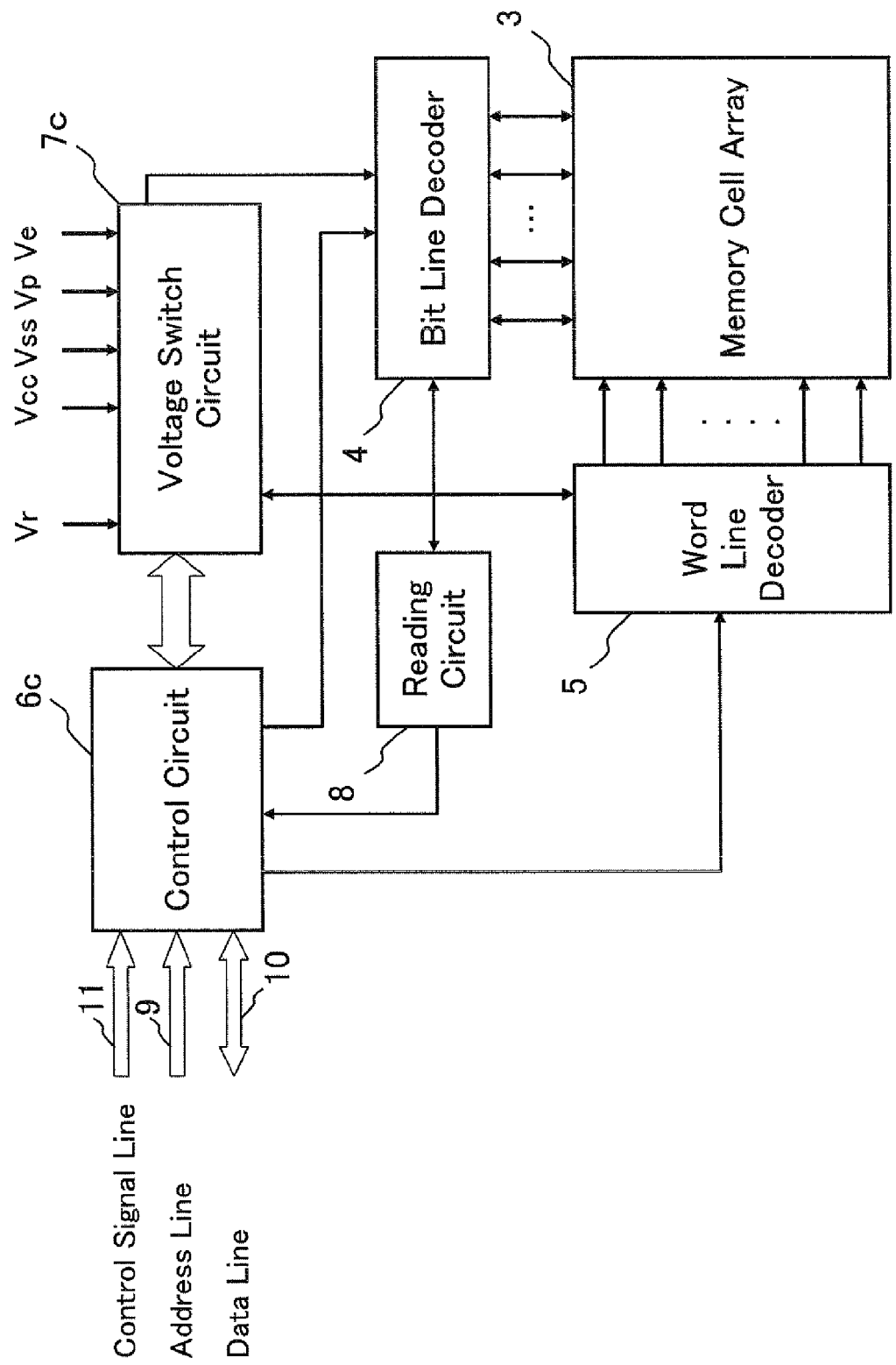
FIG. 19 is a block diagram schematically showing the constitution of a nonvolatile semiconductor memory device according to a third embodiment of the present invention.

FIG. 19 schematically shows one constitution example of the device of the present invention in a third embodiment. In addition, in FIG. 19, the same references are allotted to the components common to those in the device in the first and second embodiments and in the conventional nonvolatile semiconductor memory device in the following description. As shown in FIG. 19, the device comprises a bit line decoder 4, a word line decoder 5, a voltage switch circuit 7c, a reading circuit 8, and a control circuit 6c in the periphery of a cross-point type memory cell array 3 in which 1R type memory cells (not shown) are arranged in the form of a matrix. Basically, it has the same constitution of the device of the present invention in the first embodiment provided with the memory cell array comprising 1R type memory cells shown in FIG. 10. In addition, the constitution of the memory cell array 3 is also the same as the part of the memory cell array 3 in the device of the present invention in the first embodiment. The part overlapping with the part in the first embodiment will not be described in detail.

This embodiment is different from the first embodiment in a voltage applied from the voltage switch circuit 7c to the memory cell array 3 and its timing action, and the operation of the control circuit 6c for controlling the operation of the voltage switch circuit 7c. More specifically, the values of middle voltages such as a row programming blocking voltage, a column programming blocking voltage, a row erasing blocking voltage, and a column erasing blocking voltage outputted from the voltage switch circuit 7c are different from the first embodiment. In addition, it is different from the first embodiment in that a third programming compensating period Tpc3 is provided at the time of programming action and a third erasing compensating period Tec3 is provided at the time of erasing action. Furthermore, voltages applied to the selected word line WLs and the unselected word lines WLu, and the selected bit line BLs and the unselected bit lines BLu in a programming period Tp, a first programming compensating period Tpc1, a second programming compensating period Tpc2, the third programming compensating period Tpc3, at the time of programming action, and an erasing period Te, a first erasing compensating period Tec1, a second erasing compensating period Tec2, the third erasing compensating period Tec3 at the time of erasing action are different from the first embodiment.

According to this embodiment, a programming voltage applying circuit for applying a programming voltage Vp sufficient for the programming action to both ends of the selected memory cell only, a programming blocking voltage (Vp/3) insufficient for the programming action to the first unselected memory cells M1 and the second unselected memory cells M2, and a programming blocking voltage (−Vp/3) insufficient for the programming action to the third unselected memory cells M3 is implemented by the control circuit 6a and the voltage switch circuit 7a. In addition, an erasing voltage applying circuit for applying an erasing voltage (−Ve) sufficient for the erasing action to both ends of the selected memory cell only, an erasing blocking voltage (−Ve/3) insufficient for the erasing action to the first unselected memory cells M1 and the second unselected memory cells M2, and an erasing blocking voltage (Ve/3) insufficient for the erasing action to the third unselected memory cells M3 is implemented by the control circuit 6a and the voltage switch circuit 7a.

Next, a description will be made of a voltage pulse applying process from the voltage switch circuit 7c to each of word lines (the selected word line WLs and the unselected word lines WLu) and each of bit lines (the selected bit line BLs and the unselected bit lines BLu) of the memory cell array 3, in order to apply the programming voltage Vp to the selected memory cell M0 and to apply a programming compensating voltage Vpc" to the first and second unselected memory cells M1 and M2 and apply a programming compensating voltage (−Vpc") to the third unselected memory cells M3 using one following example.

EXAMPLE 7

In an Example 7, a description will be made of a process in a case where the application of the programming voltage Vp to the selected memory cell M0 (programming period Tp), the application of the programming compensating voltage Vpc" to the first unselected memory cells M1 (first programming compensating period Tpc1), the application of the programming compensating voltage Vpc" to the second unselected memory cells M2 (second programming compensating period Tpc2), and the application of the programming compensating voltage (−Vpc") to the third unselected memory cells M3 (third programming compensating period Tpc3) are performed in a time-division manner, at the time of programming action in one selected period until the selection of the selected memory cell is switched to another selected memory cell, with reference to FIG. 20. In addition, it is to be noted that in the example 7 that the first programming compensating period Tpc1, the second programming compensating period Tpc2 and the third programming compensating period Tpc3 are the same or almost the same length as the programming period Tp. That is, $Tp=Tpc1=Tpc2=Tpc3$ or $Tp \cong Tpc1 \cong Tpc2 \cong Tpc3$.

Figure 20:
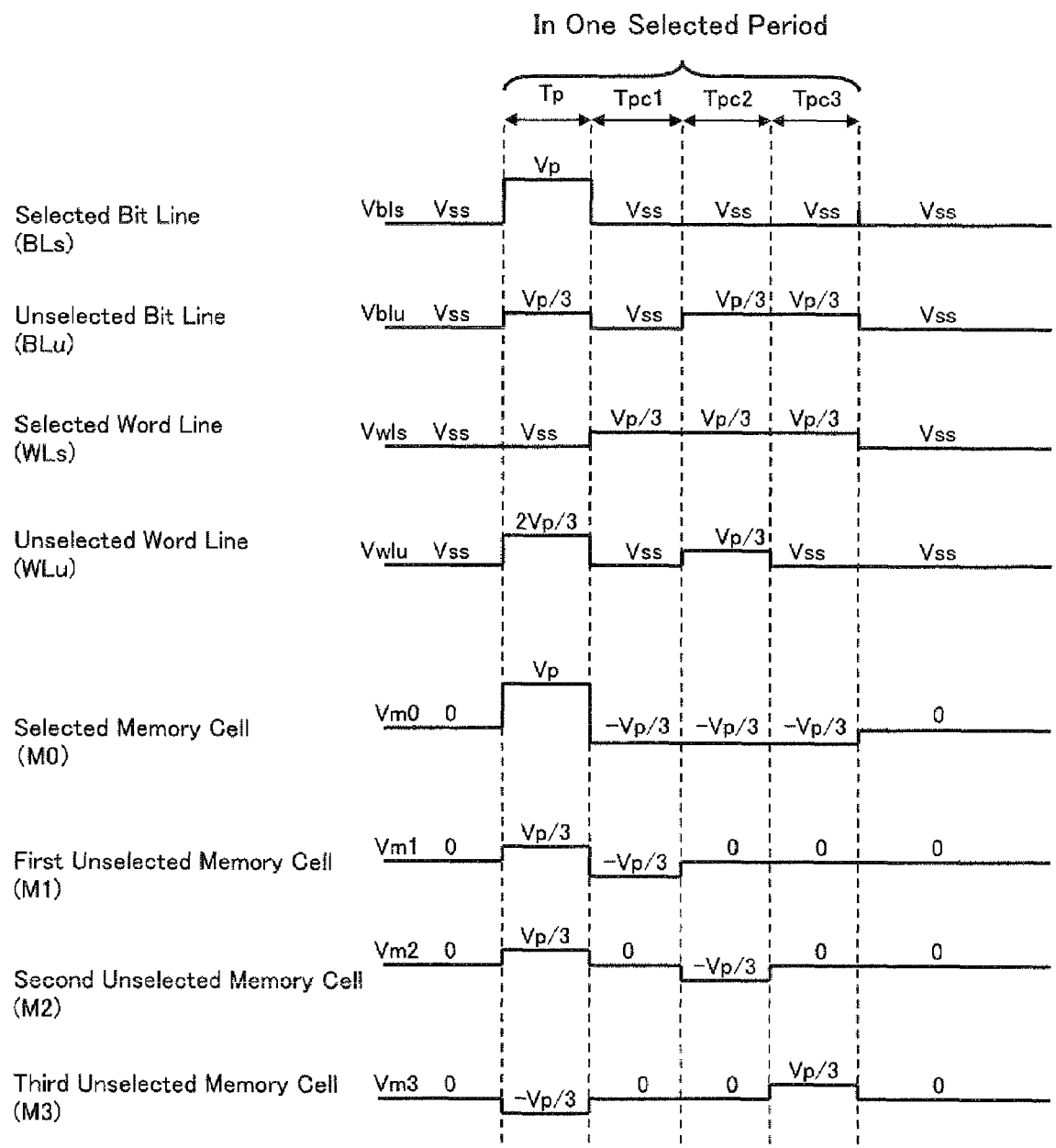
FIG. 20 is a timing chart showing one example of a voltage applying process to each word line and each bit line and a voltage applied state in each memory cell at the time of a data programming action in a nonvolatile semiconductor memory device according to an Example 7 of the present invention.

FIG. 20 shows voltage changes of a voltage Vbls applied to the selected bit line BLs, a voltage Vblu applied to the unselected bit lines BLu, a voltage Vwls applied to the selected word line WLs, a voltage Vwlu applied to the unselected word lines WLu, a voltage Vm0 applied across the variable resistance element of the selected memory cell M0, a voltage Vm1 applied across the variable resistance element of the first unselected memory cells M1, a voltage Vm2 applied across the variable resistance element of the second unselected memory cells M2, and a voltage Vm3 applied across the variable resistance element of the third unselected memory cells M3, in the programming period Tp, the first programming compensating period Tpc1, the second programming compensating period Tpc2, and the third programming compensating period Tpc3. In addition, the voltage applied to each memory cell is based on a terminal (0V) connected to the word line side.

First, as shown in FIG. 20, in the programming period Tp, a column programming voltage Vp having the same voltage as the programming voltage Vp is applied to the selected bit line BLs, a column programming blocking voltage Vp/3 that is one third of the programming voltage Vp is applied to the unselected bit lines BLu, a row programming voltage having the same voltage as the ground potential Vss is applied to the selected word line WLs, and a row programming blocking voltage 2Vp/3 that is two thirds of the programming voltage Vp is applied to the unselected word lines WLu. As a result, the programming voltage Vp that is the voltage difference (Vbls−Vwls) between the selected bit line BLs and the selected word line WLs is applied to the selected memory cell M0, the programming blocking voltage Vp/3 that is one third of the programming voltage Vp and the voltage difference (Vblu−Vwls) between the unselected bit lines BLu and the selected word line WLs is applied to the first unselected memory cells M1, the programming blocking voltage Vp/3 that is one third of the programming voltage Vp and the voltage difference (Vbls−Vwlu) between the selected bit line BLs and the unselected word lines WLu is applied to the second unselected memory cells M2, and a negative programming blocking voltage (−Vp/3) that is the voltage difference (Vblu−Vwlu) between the unselected bit lines BLu and the unselected word lines WLu is applied to the third unselected memory cells M3. These applied voltages in the programming period Tp are shown in formulas 13 collectively.

As a result, in the programming period Tp, programming is performed in the selected memory cell M0 while programming is not performed for the first unselected memory cells M1 and the second unselected memory cells M2 and the third unselected memory cells M3 because the programming blocking voltage insufficient for the programming action is applied to them but the programming disturbance is generated.

Formulas 13

$Vbls=Vp$(application of the column programming voltage $Vp$)

$Vblu=Vp/3$(application of the column programming blocking voltage $Vp/3$)

$Vwls=Vss$(application of the row programming voltage $Vss$)

$Vwlu=2Vp/3$(application of the row programming blocking voltage $2Vp/3$)

$Vm0=Vp$(programming of the selected memory cell $M0$)

$Vm1=Vp/3$(programming disturbance in the first unselected memory cells $M1$)

$Vm2=Vp/3$(programming disturbance in the second unselected memory cells $M2$)

$Vm3=-Vp/3$(programming disturbance in the third unselected memory cells $M3$)

Then, in the first programming compensating period Tpc1, the programming compensating voltage Vpc" for compensating the programming disturbance in the first unselected memory cells M1 generated in the programming period Tp is applied to the first unselected memory cells M1. More specifically, as shown in FIG. 20, the ground potential Vss is applied to the selected bit line BLs, and the ground potential Vss is applied to the unselected bit lines BLu, the voltage Vp/3 that is one third of the programming voltage Vp is applied to the selected word line WLs, and the ground potential Vss is applied to the unselected word lines WLu. As a result, the voltage difference (Vbls−Vwls=−Vp/3) between the selected bit line BLs and the selected word line WLs is applied to the selected memory cell M0, the programming compensating voltage (Vpc"=−Vp/3) that is the voltage difference (Vblu−Vwls) between the unselected bit lines BLu and the selected word line WLs is applied to the first unselected memory cells M1, the voltage difference (Vbls−Vwlu=0V) between the selected bit line BLs and the unselected word lines WLu is applied to the second unselected memory cells M2, and the voltage difference (Vblu−Vwlu=0V) between the unselected bit lines BLu and the unselected word lines WLu is applied to the third unselected memory cells M3. These applied voltages in the first programming compensating period Tpc1 are shown in formulas 14 collectively.

As a result, in the first programming compensating period Tpc1, the programming compensating voltage (Vpc"=−Vp/3) having the same voltage magnitude as the voltage Vp/3 applied in the programming period Tp and an opposite polarity to it is applied to the first unselected memory cells M1, and its resistance changed in the programming period Tp is brought to its original resistance state, so that the degree of the programming disturbance generated in the first unselected memory cells M1 once can be reduced.

Formulas 14

$Vbls=Vss$ $Vblu=Vss$ $Vwls=Vp/3$ $Vwlu=Vss$ $Vm0=-Vp/3$ $Vm1=-Vp/3$(application of the programming compensating voltage to the first unselected memory cells $M1$)

$Vm2=0[V]$ $Vm3=0[V]$

Then, in the second programming compensating period Tpc2, the programming compensating voltage Vpc for compensating the programming disturbance in the second unselected memory cells M2 generated in the programming period Tp is applied to the second unselected memory cells M2. More specifically, as shown in FIG. 20, the ground potential Vss is applied to the selected bit line BLs, the column programming blocking voltage Vp/3 that is one third of the programming voltage Vp is applied to the unselected bit lines BLu, the voltage Vp/3 that is one third of the programming voltage Vp is applied to the selected word line WLs, and the voltage Vp/3 that is one third of the programming voltage Vp is applied to the unselected word lines WLu. As a result, the voltage difference (Vbls−Vwls=−Vp/3) between the selected bit line BLs and the selected word line WLs is applied to the selected memory cell M0, the voltage difference (Vblu−Vwls=0V) between the unselected bit lines BLu and the selected word line WLs is applied to the first unselected memory cells M1, the programming compensating voltage (Vpc"=−Vp/3) that is the voltage difference (Vbls−Vwlu) between the selected bit line BLs and the unselected word lines WLu is applied to the second unselected memory cells M2, and the voltage difference (Vblu−Vwlu=0V) between the unselected bit lines BLu and the unselected word lines WLu is applied to the third unselected memory cells M3. These applied voltages in the second programming compensating period Tpc2 are shown in formulas 15 collectively.

As a result, in the second programming compensating period Tpc2, the programming compensating voltage (Vpc"=−Vp/3) having the same voltage magnitude as the programming blocking voltage Vp/3 applied in the programming period Tp and an opposite polarity to it is applied to the second unselected memory cells M2, and its resistance changed in the programming period Tp is brought to its original resistance state, so that the degree of the programming disturbance generated in the second unselected memory cells M2 once can be reduced Formulas 15

$Vbls=Vss$ $Vblu=Vp/3$ $Vwls=Vp/3$ $Vwlu=Vp/3$ $Vm0 = -Vp/3$ $Vm1 = 0 [V]$ $Vm2 = -Vp/3$ (application of the programming compensating voltage to the second unselected memory cells M2)

$Vm3 = 0 [V]$

Then, in the third programming compensating period Tpc3, the programming compensating voltage (−Vpc″) for compensating the programming disturbance in the third unselected memory cells M3 generated in the programming period Tp is applied to the third unselected memory cells M3. More specifically, as shown in FIG. 20, the ground potential Vss is applied to the selected bit line BLs, the column programming blocking voltage Vp/3 that is one third of the programming voltage Vp is applied to the unselected bit lines BLu, the voltage Vp/3 that is one third of the programming voltage Vp is applied to the selected word line WLs, and the ground potential Vss is applied to the unselected word lines WLu. As a result, the voltage difference (Vbls−Vwls=−Vp/3) between the selected bit line BLs and the selected word line WLs is applied to the selected memory cell M0, the voltage difference (Vblu−Vwls=0V) between the unselected bit lines BLu and the selected word line WLs is applied to the first unselected memory cells M1, the voltage difference (Vbls−Vwlu=0V) between the selected bit line BLs and the unselected word lines WLu is applied to the second unselected memory cells M2, and the programming compensating voltage (−Vpc″=Vp/3) that is the voltage difference (Vblu−Vwlu) between the unselected bit lines BLu and the unselected word lines WLu is applied to the third unselected memory cells M3. These applied voltages in the third programming compensating period Tpc3 are shown in formulas 16 collectively.

As a result, in the third programming compensating period Tpc3, the programming compensating voltage (−Vpc″=Vp/3) having the same voltage magnitude as the programming blocking voltage (−Vp/3) applied in the programming period Tp and an opposite polarity to it is applied to the third unselected memory cells M3, and its resistance changed in the programming period Tp is brought to its original resistance state, so that the degree of the programming disturbance generated in the third unselected memory cells M3 once can be reduced.

Formulas 16

$Vbls = Vss$ $Vblu = Vp/3$ $Vwls = Vp/3$ $Vwlu = Vss$ $Vm0 = -Vp/3$ $Vm1 = 0 [V]$ $Vm2 = 0 [V]$ $Vm3 = Vp/3$ (application of the programming compensating voltage to the third unselected memory cells M3)

As described above, according to the example 7, since four periods such as the programming period Tp, the first programming compensating period Tpc1, the second programming compensating period Tpc2, and the third programming compensating period Tpc3 are provided in one selected period every time the programming action is generated, even when the programming action is repeated, the programming disturbance can be effectively prevented from being cumulatively progressed in the first to third unselected memory cells M1, M2 and M3. In addition, although the programming compensating voltage (−Vp/3) is applied to the selected memory cell M0 in the first to third programming compensating periods Tpc1 to Tpc3, since it is applied only three times for one programming action to the selected memory cell M0, that application is not accumulated, which is no problem.

In addition, according to the third embodiment, since the absolute value of the programming blocking voltage applied to the first to third unselected memory cells M1, M2 and M3 in the programming period Tp is one third of the programming voltage Vp which is smaller than the programming blocking voltage (the half of the programming voltage Vp) in the first and second embodiments, the degree of programming disturbance generated in the one programming period Tp in the first to third unselected memory cells M1, M2 and M3 can be reduced.

In addition, according to the example 7, the order of the four periods of the programming period Tp, the first programming compensating period Tpc1, the second programming compensating period Tpc2 and the third programming compensating period Tpc3 may be arbitrary. The programming period Tp may be provided after the first to third programming compensating periods Tpc1 to 3 or among them. In addition, the order of the first programming compensating period Tpc1, the second programming compensating period Tpc2 and the third programming compensating period Tpc3 may be changed occasionally.

In addition, in the example 7, when each length of the first programming compensating period Tpc1, the second programming compensating period Tpc2 and the third programming compensating period Tpc3 is adjusted such that the programming compensation can be most highly efficient, each length of the programming period Tp, the first programming compensating period Tpc1, the second programming compensating period Tpc2 and the third programming compensating period Tpc3 may not be always equal and the absolute values of the programming compensating voltage Vpc and the programming blocking voltage (Vp/3) may not be always equal.

Next, a description will be made of a voltage pulse applying process from the voltage switch circuit 7a to each of word lines (the selected word line WLs and the unselected word lines WLu) and each of bit lines (the selected bit line BLs and the unselected bit lines BLu) of the memory cell array 3, to apply the erasing voltage (−Ve) to the selected memory cell M0, to apply the erasing compensating voltage Vec″ to the first and second unselected memory cells M1 and M2 and to apply the erasing compensating voltage (−Vec″) to the third unselected memory cells M3 using one following example.

EXAMPLE 8

In an Example 8, a description will be made of a process in a case where the application of the erasing voltage (−Ve) to the selected memory cell M0 (erasing period Te), the application of the erasing compensating voltage Vec″ to the first unselected memory cells M1 (first erasing compensating period Tec1), the application of the erasing compensating voltage Vec″ to the second unselected memory cells M2 (second erasing compensating period Tec2), and the application of the erasing compensating voltage (−Vec″) to the third unselected memory cells M3 (third erasing compensating period Tec3) are performed in a time-division manner, at the time of erasing action in one selected period until the selection of the selected memory cell is switched to another selected memory cell, with reference to FIG. 21. In addition, it is to be noted that in the example 8 that the first erasing compensating period Tec1, the second erasing compensating period Tec2 and the third erasing compensating period Tec3 are the same or almost the same length as the erasing period Te. That is, Te=Tec1=Tec2=Tec3 or Te≅Tec1≅Tec2≅Tec3.

Figure 21:
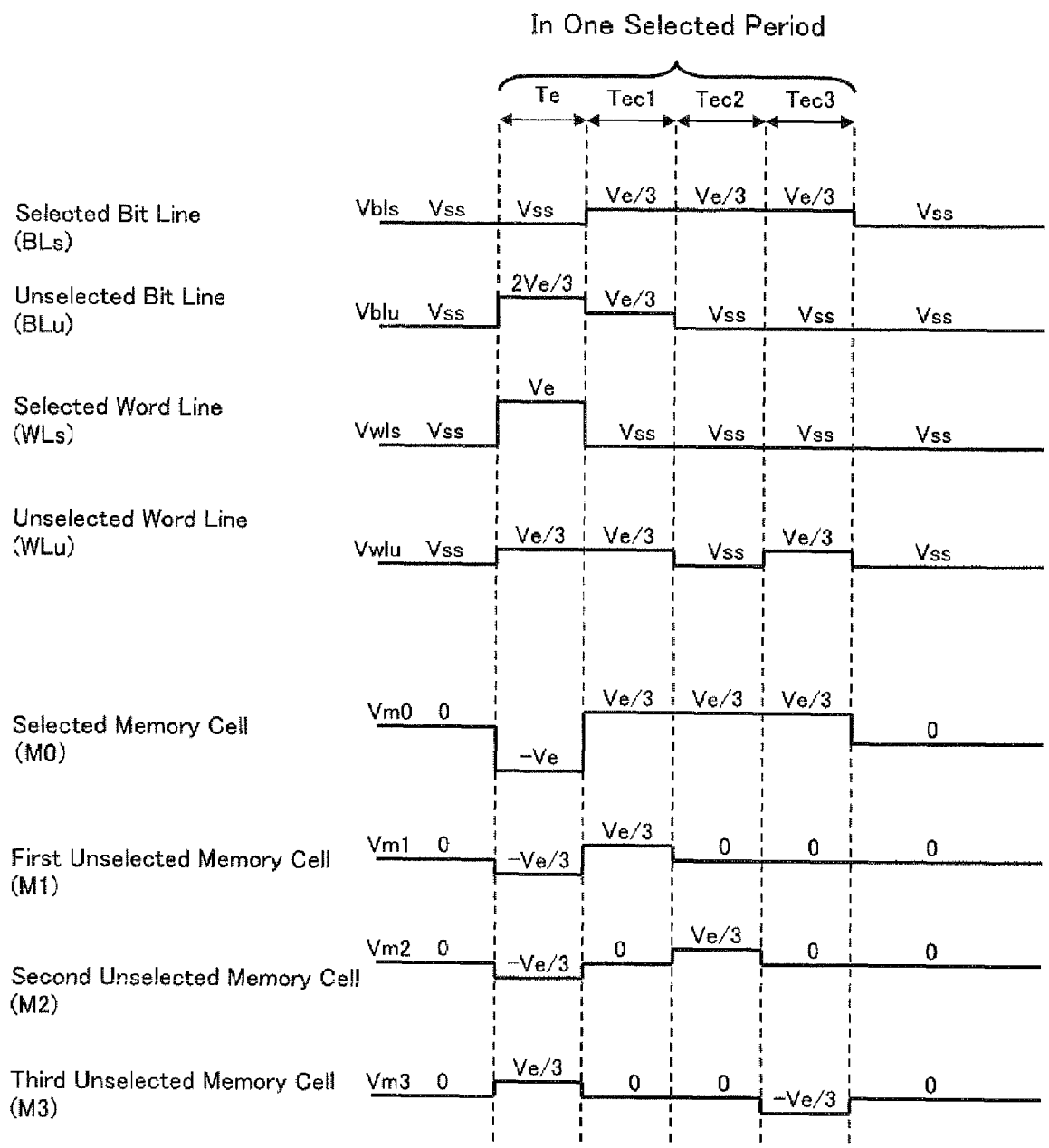
FIG. 21 is a timing chart showing one example of a voltage applying process to each word line and each bit line and a voltage applied state in each memory cell at the time of a data erasing action in a nonvolatile semiconductor memory device according to an Example 8 of the present invention.

FIG. 21 shows voltage changes of the voltage Vbls applied to the selected bit line BLs, the voltage Vblu applied to the unselected bit lines BLu, the voltage Vwls applied to the selected word line WLs, the voltage Vwlu applied to the unselected word lines WLu, the voltage Vm0 applied across the variable resistance element of the selected memory cell M0, the voltage Vm1 applied across the variable resistance element of each of the first unselected memory cells M1, the voltage Vm2 applied to both ends of the variable resistance element of each of the second unselected memory cells M2, and the voltage Vm3 applied across the variable resistance element of each of the third unselected memory cells M3, in the erasing period Te, the first erasing compensating period Tec1, the second erasing compensating period Tec2, and the third erasing compensating period Tec3. In addition, the voltage applied to each memory cell is based on a terminal (0V) connected to the word line side.

First, as shown in FIG. 21, in the erasing period Te, a column erasing voltage having the same voltage as the ground potential Vss is applied to the selected bit line BLs, a column erasing blocking voltage 2Ve/3 that is two thirds of the erasing supply voltage Ve is applied to the unselected bit lines BLu, a row erasing voltage Ve having the same voltage as the erasing supply voltage Ve is applied to the selected word line WLs, and a row erasing blocking voltage Ve/3 that is one third of the erasing supply voltage Ve is applied to the unselected word lines WLu. As a result, the erasing voltage (−Ve) that is the voltage difference (Vbls−Vwls) between the selected bit line BLs and the selected word line WLs is applied to the selected memory cell M0, the erasing blocking voltage (−Ve/3) that is one third of the erasing voltage (−Ve) and the voltage difference (Vblu−Vwls) between the unselected bit lines BLu and the selected word line WLs is applied to the first unselected memory cells M1, the erasing blocking voltage (−Ve/3) that is one third of the erasing voltage (−Ve) and the voltage difference (Vbls−Vwlu) between the selected bit line BLs and the unselected word lines WLu is applied to the second unselected memory cells M2, and a positive erasing blocking voltage Ve/3 that is the voltage difference (Vblu−Vwlu) between the unselected bit lines BLu and the unselected word lines WLu is applied to the third unselected memory cells M3. These applied voltages in the erasing period Te are shown in formulas 17 collectively.

As a result, in the erasing period Te, erasing is performed in the selected memory cell M0 while erasing is not performed for the first unselected memory cells M1 and the second unselected memory cells M2 and the third unselected memory cells M3 because the erasing blocking voltage insufficient for the erasing action is applied to them but the erasing disturbance is generated.

Formulas 17

$Vbls=Vss$(application of the column erasing voltage Vss)

$Vblu=2Ve/3$(application of the column erasing blocking voltage 2Ve/3)

$Vwls=Ve$(application of the row erasing voltage Ve)

$Vwlu=Ve/3$(application of the row erasing blocking voltage Ve/3)

$Vm0=-Ve$(erasing in the selected memory cell M0)

$Vm1=-Ve/3$(erasing disturbance in the first unselected memory cells M1)

$Vm2=-Ve/3$(erasing disturbance in the second unselected memory cells M2)

$Vm3=Ve/3$(erasing disturbance in the third unselected memory cells M3)

Then, in the first erasing compensating period Tec1, the erasing compensating voltage Vec" for compensating the erasing disturbance in the first unselected memory cells M1 generated in the erasing period Te is applied to the first unselected memory cells M1. More specifically as shown in FIG. 21, the voltage Ve/3 that is one third of the erasing supply voltage Ve is applied to the selected bit line BLs, the voltage Ve/3 that is one third of the erasing supply voltage Ve is applied to the unselected bit lines BLu, the ground potential Vss is applied to the selected word line WLs, and the voltage Ve/3 that is one third of the erasing supply voltage Ve is applied to the unselected word lines WLu. As a result, the voltage difference (Vbls−Vwls=Ve/3) between the selected bit line BLs and the selected word line WLs is applied to the selected memory cell M0, the erasing compensating voltage (Vec"=Ve/3) that is the voltage difference (Vblu−Vwls) between the unselected bit lines BLu and the selected word line WLs is applied to the first unselected memory cells M1, the voltage difference (Vbls−Vwlu=0V) between the selected bit line BLs and the unselected word lines WLu is applied to the second unselected memory cells M2, and the voltage difference (Vblu−Vwlu=0V) between the unselected bit lines BLu and the unselected word lines WLu is applied to the third unselected memory cells M3. These applied voltages in the first erasing compensating period Tec1 are shown in formulas 18 collectively.

As a result, in the first erasing compensating period Tec1, the erasing compensating voltage (Vec"=Ve/3) having the same voltage magnitude as the erasing blocking voltage (−Ve/3) applied in the erasing period Te and an opposite polarity to it is applied to the first unselected memory cells M1, and its resistance changed in the erasing period Te is brought to its original resistance state, so that the degree of the erasing disturbance generated in the first unselected memory cells M1 once can be reduced.

Formulas 18

$Vbls=Ve/3$ $Vblu=Ve/3$ $Vwls=Vss$ $Vwlu=Ve/3$ $Vm0=Ve/3$ $Vm1=Ve/3$(application of the erasing compensating voltage to the first unselected memory cells M1)

$Vm2=0[V]$ $Vm3=0[V]$

Then, in the second erasing compensating period Tec2, the erasing compensating voltage Vec″ for compensating the erasing disturbance in the second unselected memory cells M2 generated in the erasing period Te is applied to the second unselected memory cells M2. More specifically, as shown in FIG. 21, the voltage Ve/3 that is one third of the erasing supply voltage Ve is applied to the selected bit line BLs, the ground potential Vss is applied to the unselected bit lines BLu, the ground potential Vss is applied to the selected word line WLs, and the ground potential Vss is applied to the unselected word lines WLu. As a result, the voltage difference (Vbls−Vwls=Ve/3) between the selected bit line BLs and the selected word line WLs is applied to the selected memory cell M0, the voltage difference (Vblu−Vwls=0V) between the unselected bit lines BLu and the selected word line WLs is applied to the first unselected memory cells M1, the erasing compensating voltage (Vec″=Ve/3) that is the voltage difference (Vbls−Vwlu) between the selected bit line BLs and the unselected word lines WLu is applied to the second unselected memory cells M2, and the voltage difference (Vblu−Vwlu=0V) between the unselected bit lines BLu and the unselected word lines WLu is applied to the third unselected memory cells M3. These applied voltages in the second erasing compensating period Tec2 are shown in formulas 19 collectively.

As a result, in the second erasing compensating period Tec2, the erasing compensating voltage (Vec″=Ve/3) having the same voltage magnitude as the erasing blocking voltage (−Ve/3) applied in the erasing period Te and an opposite polarity to it is applied to the second unselected memory cells M2, and its resistance changed in the erasing period Te is brought to its original resistance state, so that the degree of the erasing disturbance generated in the second unselected memory cells M2 once can be reduced.

Formulas 19

$Vbls=Ve/3$ $Vblu=Vss$ $Vwls=Vss$ $Vwlu=Vss$ $Vm0=Ve/3$ $Vm1=0[V]$ $Vm2=Ve/3$ (application of the erasing compensating voltage to the second unselected memory cells M2)

$Vm3=0[V]$

Then, in the third erasing compensating period Tec3, the erasing compensating voltage (−Vec″) for compensating the erasing disturbance in the third unselected memory cells M3 generated in the erasing period Te is applied to the third unselected memory cells M3. More specifically, as shown in FIG. 21, the voltage Ve/3 that is one third of the erasing supply voltage Ve is applied to the selected bit line BLs, the ground potential Vss is applied to the unselected bit lines BLu, the ground potential Vss is applied to the selected word line WLs, and the voltage Ve/3 that is one third of the erasing supply voltage Ve is applied to the unselected word lines WLu. As a result, the voltage difference (Vbls−Vwls=Ve/3) between the selected bit line BLs and the selected word line WLs is applied to the selected memory cell M0, the voltage difference (Vblu−Vwls=0V) between the unselected bit lines BLu and the selected word line WLs is applied to the first unselected memory cells M1, the voltage difference (Vbls−Vwlu=0V) between the selected bit line BLs and the unselected word lines WLu is applied to the second unselected memory cells M2, and the erasing compensating voltage (−Vec″=−Ve/3) that is the voltage difference (Vblu−Vwlu) between the unselected bit lines BLu and the unselected word lines WLu is applied to the third unselected memory cells M3. These applied voltages in the third erasing compensating period Tec3 are shown in formulas 20 collectively.

As a result, in the third erasing compensating period Tec3, the erasing compensating voltage (−Vec″=−Ve/3) having the same voltage magnitude as the erasing blocking voltage (Ve/3) applied in the erasing period Te and an opposite polarity to it is applied to the third unselected memory cells M3, and its resistance changed in the erasing period Te is brought to its original resistance state, so that the degree of the erasing disturbance generated in the third unselected memory cells M3 once can be reduced.

Formulas 20

$Vbls=Ve/3$ $Vblu=Vss$ $Vwls=Vss$ $Vwlu=Ve/3$ $Vm0=Ve/3$ $Vm1=0[V]$ $Vm2=0[V]$ $Vm3=−Ve/3$ (application of the erasing compensating voltage to the third unselected memory cells M3)

As described above, according to the example 8, since four periods such as the erasing period Te, the first erasing compensating period Tec1, the second erasing compensating period Tec2, and the third erasing compensating period Tec3 are provided in one selected period every time the erasing action is generated, even when the erasing action is repeated, the erasing disturbance can be effectively prevented from being cumulatively progressed in the first to third unselected memory cells M1, M2 and M3. In addition, although the erasing compensating voltage (Ve/3) is applied to the selected memory cell M0 in the first to third erasing compensating periods Tec1 to Tec3, since it is applied only three times for one erasing action to the selected memory cell M0, that application is not accumulated, which is no problem.

In addition, according to the third embodiment, the absolute value of the erasing blocking voltage applied to the first to third unselected memory cells M1, M2 and M3 in the erasing period Te is one third of the erasing supply voltage Ve that is smaller than the erasing blocking voltage (the half of the erasing supply voltage Ve) in the first and second embodiments, the degree of erasing disturbance generated in the one erasing period Te in the first to third unselected memory cells M1, M2 and M3 can be reduced.

In addition, according to the example 8, the order of the four periods of the erasing period Te, the first erasing compensating period Tec1, the second erasing compensating period Tec2 and the third erasing compensating period Tec3 may be arbitrary. The erasing period Te may be provided after the first to third erasing compensating periods Tec1 to 3. In addition, the order of the first erasing compensating period Tec1, the second erasing compensating period Tec2 and the third erasing compensating period Tec3 may be changed occasionally.

In addition, in the example 8, by adjusting each length of the first erasing compensating period Tec1, the second erasing compensating period Tec2 and the third erasing compensating period Tec3 such that the erasing compensation can be most highly efficient, each length of the erasing period Te, the first erasing compensating period Tec1, the second erasing compensating period Tec2 and the third erasing compensating period Tec3 may not be always equal or the absolute values of the erasing compensating voltage Vec and the voltage (Ve/3) that is one third of the erasing supply voltage Ve may not be always equal.

Fourth Embodiment

Figure 22:
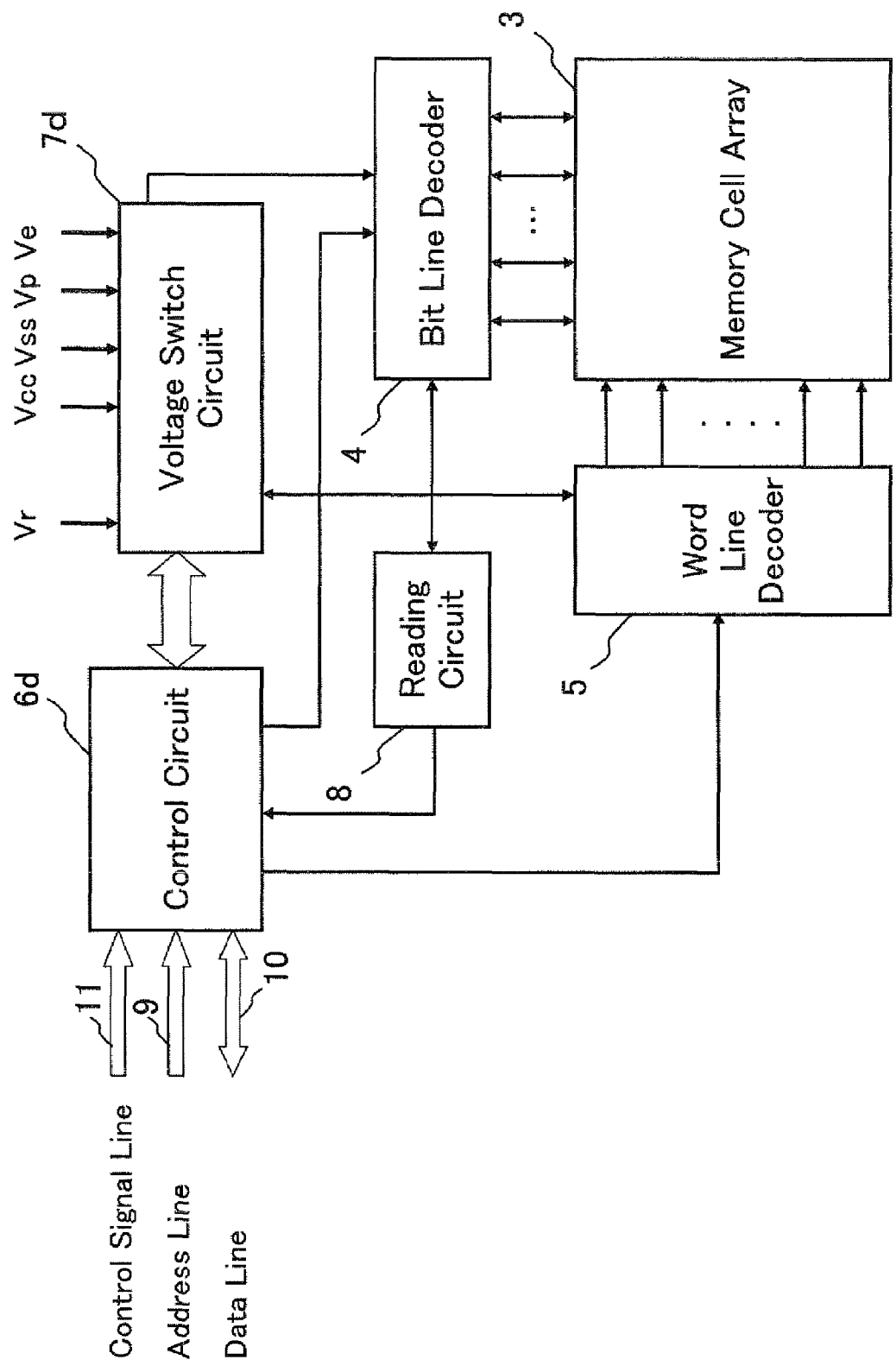
FIG. 22 is a block diagram schematically showing the constitution of a nonvolatile semiconductor memory device according to a fourth embodiment of the present invention.

FIG. 22 schematically shows one constitution example of the device of the present invention in a fourth embodiment. In addition, in FIG. 22, the same references are allotted to the components common to those in the device in the first to third embodiments and in the conventional nonvolatile semiconductor memory device in the following description. As shown in FIG. 22, the device comprises a bit line decoder 4, a word line decoder 5, a voltage switch circuit 7d, a reading circuit 8, and control circuit 6d in the periphery of a cross-point type memory cell array 3 in which 1R type memory cells (not shown) are arranged in the form of a matrix. Basically, it has the same constitution as the device of the present invention in the first embodiment provided with the memory cell array comprising 1R type memory cells shown in FIG. 10. In addition, the constitution of the memory cell array 3 is also the same as that of the memory cell array 3 in the device of the present invention in the first embodiment. The part overlapping with the part in the first embodiment will not be described in detail.

This embodiment is different from the first embodiment in a voltage applied from the voltage switch circuit 7d to the memory cell array 3 and its timing action, and the operation of the control circuit 6d for controlling the operation of the voltage switch circuit 7d. More specifically, the application of the programming compensating voltage Vpc to the first unselected memory cells M1 connected to the selected word line WLs and the unselected bit lines BLu, and the application of the programming compensating voltage VPc to the second unselected memory cells M2 connected to the unselected word lines WLu and the selected bit line BLs that are executed in the first programming compensating period Tpc1 and the second programming compensating period Tpc2 separately in the first embodiment are executed in the same programming compensating period TPc. In addition, it is different in that the application of the erasing compensating voltage Vec to the first unselected memory cells M1, and the application of the erasing compensating voltage Vec to the second unselected memory cells M2 that are executed in the first erasing compensating period Tec1 and the second erasing compensating period Tec2 separately in the first embodiment are executed in the same erasing compensating period Tec.

In addition, it is assumed that the programming voltage Vp and the erasing voltage (−Ve) applied to the selected memory cell M0 have almost the same absolute value and opposite polarities.

EXAMPLE 9

Next, a description will be made of a voltage pulse applying process from the voltage switch circuit 7d to each of word lines (the selected word line WLs and the unselected word lines WLu) and each of bit lines (the selected bit line BLs and the unselected bit lines BLu) of the memory cell array 3, in order to apply the programming voltage Vp to the selected memory cell M0, and to apply an programming compensating voltage Vpc to the first and second unselected memory cells M1 and M2 using one following example.

In an Example 9, a description will be made of a process in a case where the application of the programming voltage Vp to the selected memory cell M0 (programming period Tp), the application of the programming compensating voltage Vpc to the first and second unselected memory cells M1 and M2 (programming compensating period Tpc) are performed at the time of programming action in one selected period until the selection of the selected memory cell is switched to another selected memory cell, with reference to FIG. 23. In addition, it is to be noted that in the example 9 the programming compensating period Tpc is the same or almost the same length as the programming period Tp. That is, Tpc=Tp or Tpc≅Tp.

Figure 23:
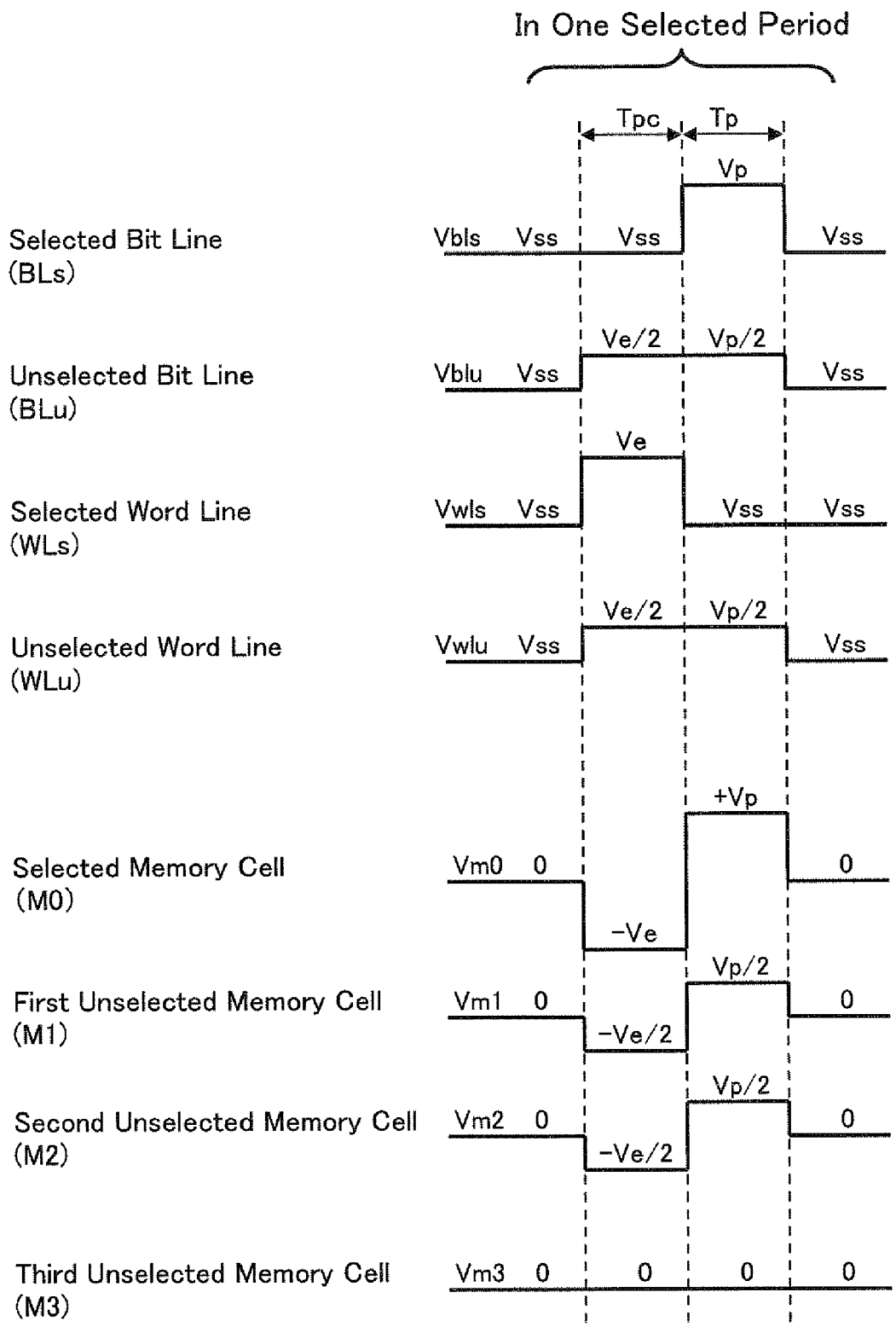
FIG. 23 is a timing chart showing one example of a voltage applying process to each word line and each bit line and a voltage applied state in each memory cell at the time of a data programming action in a nonvolatile semiconductor memory device according to an Example 9 of the present invention.

FIG. 23 shows voltage changes of a voltage Vbls applied to the selected bit line BLs, a voltage Vblu applied to the unselected bit lines BLu, a voltage Vwls applied to the selected word line WLs, a voltage Vwlu applied to the unselected word lines WLu, a voltage Vm0 applied across the variable resistance element of the selected memory cell M0, a voltage Vm1 applied across the variable resistance element of the first unselected memory cells M1, a voltage Vm2 applied across the variable resistance element of the second unselected memory cells M2, and a voltage Vm3 applied across the variable resistance element of the third unselected memory cells M3, in the programming period Tp and the programming compensating period Tpc. In addition, the voltage applied to each memory cell is based on a terminal (0V) connected to the word line side.

As shown in FIG. 23, the programming compensating period Tpc is set before the programming period Tp and the programming compensating action is performed prior to the programming action in one selected period.

First, a description will be made of the programming action to be performed later in the one selected period. As shown in FIG. 23, in the programming period Tp, a column programming voltage Vp having the same voltage as the programming voltage Vp is applied to the selected bit line BLs, a column programming blocking voltage Vp/2 that is the half of the programming voltage Vp is applied to the unselected bit lines BLu, a row programming voltage having the same voltage as the ground potential Vss is applied to the selected word line WLs, and a row programming blocking voltage Vp/2 that is the half of the programming voltage Vp is applied to the unselected word lines WLu. As a result, the programming voltage Vp that is the voltage difference (Vbls−Vwls) between the selected bit line BLs and the selected word line WLs is applied to the selected memory cell M0, the programming blocking voltage Vp/2 that is the half of the programming voltage Vp and the voltage difference (Vblu−Vwls) between the unselected bit lines BLu and the selected word line WLs is applied to the first unselected memory cells M1, the programming blocking voltage Vp/2 that is the half of the programming voltage Vp and the voltage difference (Vbls−Vwlu) between the selected bit line BLs and the unselected word lines WLu is applied to the second unselected memory cells M2, and 0V that is the voltage difference (Vblu−Vwlu) between the unselected bit lines BLu and the unselected word lines WLu is applied to the third unselected memory cells M3.

These applied voltages in the programming period Tp are shown in formulas 21 collectively (the same as the formulas 1 in the first embodiment).

As a result, in the programming period Tp, programming is performed in the selected memory cell M0 while programming is not performed for the first unselected memory cells M1 and the second unselected memory cells M2 because the programming blocking voltage insufficient for the programming action is applied to them but the programming disturbance is generated.

Formulas 21

$Vbls = Vp$ (application of the column programming voltage $Vp$)

$Vblu = Vp/2$ (application of the column programming blocking voltage $Vp/2$)

$Vwls = Vss$ (application of the row programming voltage $Vss$)

$Vwlu = Vp/2$ (application of the row programming blocking voltage $Vp/2$)

$Vm0 = Vp$ (programming of the selected memory cell M0)

$Vm1 = Vp/2$ (programming disturbance of the first unselected memory cells M1)

$Vm2 = Vp/2$ (programming disturbance of the second unselected memory cells M2)

$Vm3 = 0 [V]$

Next, a description will be made of the programming compensating action to be executed first in the one selected period. In the programming compensating period Tpc, the programming compensating voltage Vpc for compensating the programming disturbance for the first unselected memory cells M1 and the second unselected memory cells M2 to be generated in the following programming period Tp is applied at the same time in one action.

More specifically, as shown in FIG. 23, the ground potential Vss is applied to the selected bit line BLs, the column erasing blocking voltage Ve/2 that is the half of the erasing voltage Ve is applied to the unselected bit lines BLu, the erasing voltage Ve is applied to the selected word line WLs, and the row erasing blocking voltage Ve/2 is applied to the unselected word lines WLu.

As a result, the voltage difference (Vbls−Vwls=−Ve) between the selected bit line BLs and the selected word line WLs is applied to the selected memory cell M0, the programming compensating voltage (Vpc=−Ve/2) that is the voltage difference (Vblu−Vwls) between the unselected bit lines BLu and the selected word line WLs is applied to the first unselected memory cells M1, the voltage difference (Vbls−Vwlu=−Ve/2) between the selected bit line BLs and the unselected word lines WLu is applied to the second unselected memory cells M2, and the voltage difference (Vblu−Vwlu=0V) between the unselected bit lines BLu and the unselected word lines WLu is applied to the third unselected memory cells M3. These applied voltages in the programming compensating period Tpc are shown in formulas 22 collectively.

As a result, since the programming voltage Vp and the erasing voltage (−Ve) have the same or almost the same absolute value and different polarities, the programming compensating voltage (Vpc=−Ve/2) having the same voltage as the programming blocking voltage Vp/2 applied in the programming period Tp and an opposite polarity to it is applied to the first unselected memory cells M1 and the second unselected memory cells M2 in the programming compensating period Tpc, so that the resistance change caused in the programming period Tp is offset and the degree of programming disturbance generated in the first unselected memory cells M1 and the second unselected memory cells M2 can be reduced Formulas 22

$Vbls = Vss$ $Vblu = Ve/2$ $Vwls = Ve$ $Vwlu = Ve/2$ $Vm0 = -Ve$ $Vm1 = -Ve/2$ (application of the programming compensating voltage to the first unselected memory cells M1)

$Vm2 = -Ve/2$ (application of the programming compensating voltage to the second unselected memory cells M2)

$Vm3 = 0 [V]$

According to the fourth embodiment, before the programming action is performed in the programming period Tp, the programming compensating action is executed by performing the erasing action in the programming compensating Tpc, so that the programming disturbance is reduced. Therefore, it means that after the erasing action has been performed additionally for the selected memory cell M0 that is in the erased state and will be programmed, the programming action is performed to it. The effect in this case will be described based on experimental data hereinafter.

Figure 24:
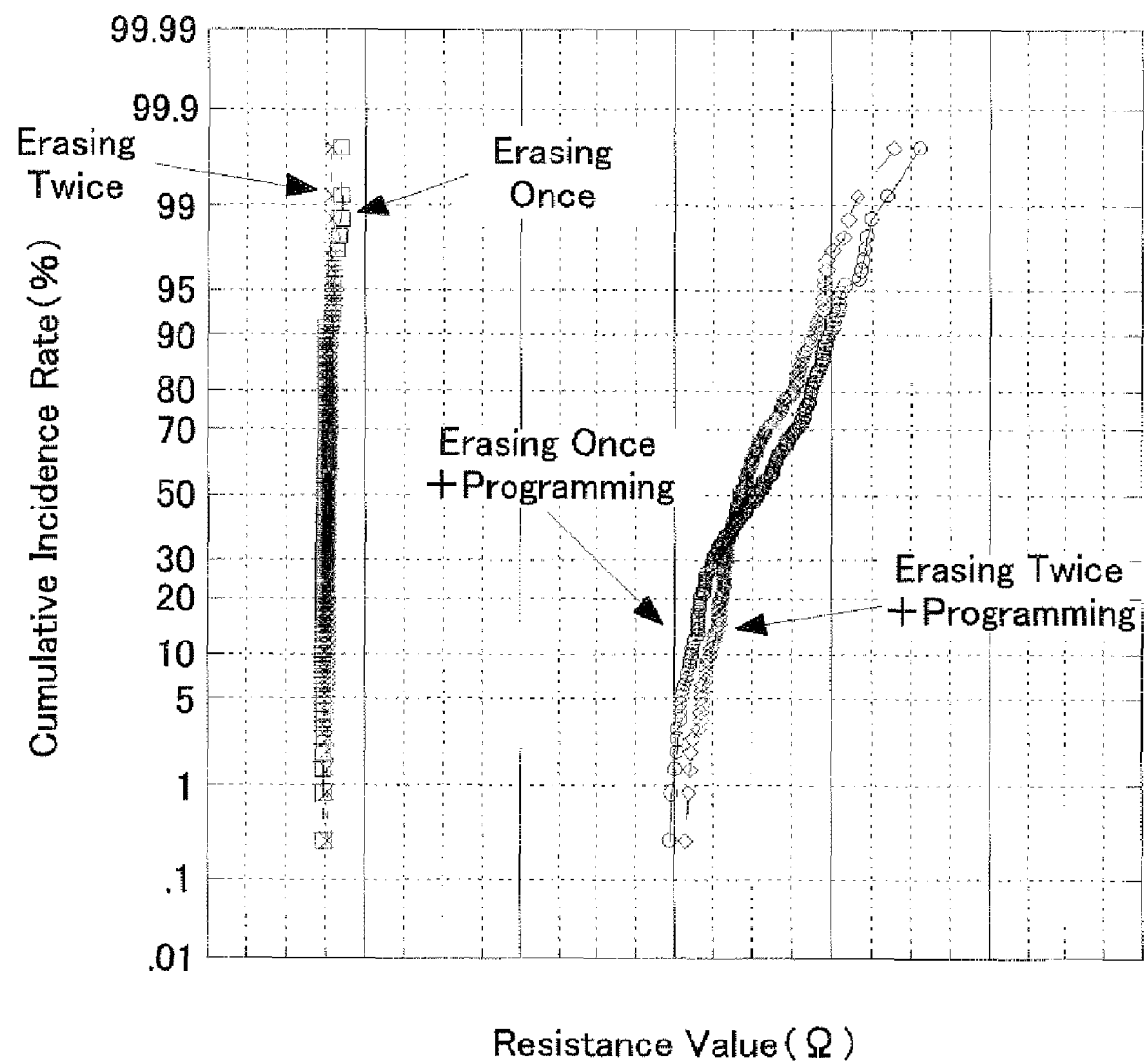
FIG. 24 is a view showing an experimental result provided by examining whether the following programming action is affected by one additional application of an erasing voltage to a memory cell in an erased state in a cross-point type memory cell array.

FIG. 24 shows an experimental result provided by examining whether the following programming action is affected or not by the additional application of the erasing voltage to the memory cell in the erased state. FIG. 24 shows the distribution of the resistance value of a memory cell to which an erasing voltage pulse was applied once (shown by □ in the drawing), the distribution of the resistance value of a memory cell to which the erasing voltage pulse was applied twice (shown by x in the drawing), the distribution of the resistance value of a memory cell to which the erasing voltage pulse was applied once and the programming was performed (shown by O in the drawing), and the distribution of the resistance value of a memory cell to which the erasing voltage pulse was applied twice and the programming was performed (shown by ◇ in the drawing). In addition, the vertical axis in FIG. 24 designates cumulative incidence rate.

It can be seen from FIG. 24 that even when the programming compensating action is performed by the erasing action before the programming action, the resistance value after the erasing is hardly changed and the following programming action is not affected by that.

In addition, according to the example 9, by adjusting the length of the programming compensating period Tpc such that the programming compensation can be most highly efficient, the programming period Tp and the programming compensating period Tpc may not be always equal and the absolute values of the programming compensating voltage (Vpc=−Ve/2) and the programming blocking voltage (Vp/2) need not be always equal.

EXAMPLE 10

Next, a description will be made of a voltage pulse applying process from the voltage switch circuit 7d to each of word lines (the selected word line WLs and the unselected word lines WLu) and each of bit lines (the selected bit line BLs and the unselected bit lines BLu) of the memory cell array 3, to apply the erasing voltage (−Ve) to the selected memory cell M0, and to apply the erasing compensating voltage Vec to the first and second unselected memory cells M1 and M2 using one following example.

In an Example 10, a description will be made of a process in a case where the application of the erasing voltage (−Ve) to the selected memory cell M0 (erasing period Te), and the application of the erasing compensating voltage Vec to the first and second unselected memory cells M1 and M2 (erasing compensating period Tec) are performed at the time of erasing action in one selected period until the selection of the selected memory cell is switched to another selected memory cell, with reference to FIG. 25. In addition, it is to be noted that in the example 10 the erasing compensating period Tec is the same or almost the same length as the erasing period Te. That is, Tec=Te or Tec≈Te.

Figure 25:
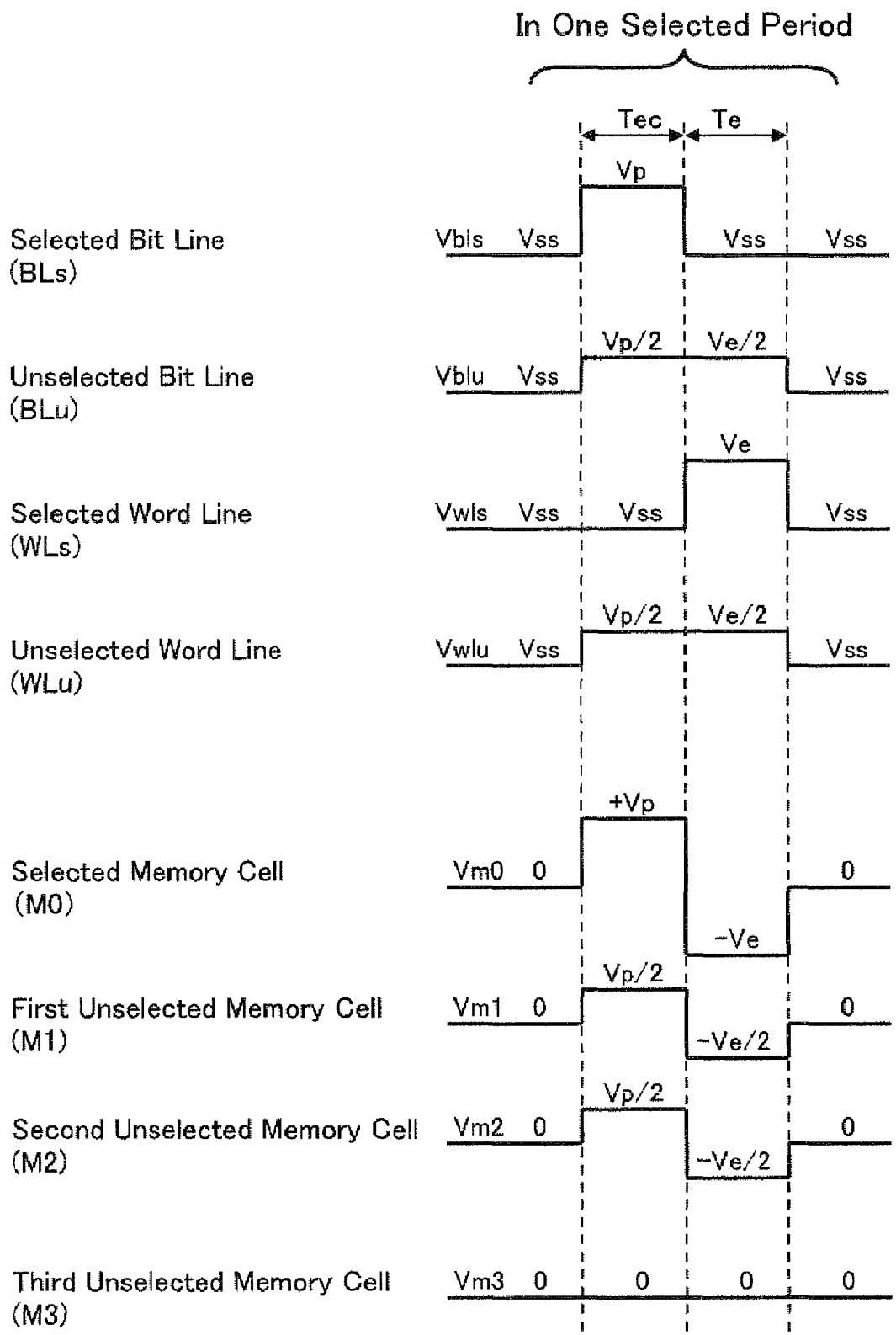
FIG. 25 is a timing chart showing one example of a voltage applying process to each word line and each bit line and a voltage applied state in each memory cell at the time of a data erasing action in a nonvolatile semiconductor memory device according to an Example 10 of the present invention.

FIG. 25 shows voltage changes of the voltage Vbls applied to the selected bit line BLs, the voltage Vblu applied to the unselected bit lines BLu, the voltage Vwls applied to the selected word line WLs, the voltage Vwlu applied to the unselected word lines WLu, the voltage Vm0 applied across the variable resistance element of the selected memory cell M0, the voltage Vm1 applied across the variable resistance element of the first unselected memory cells M1, the voltage Vm2 applied across the variable resistance element of each of the second unselected memory cells M2, and the voltage Vm3 applied across the variable resistance element of each of the third unselected memory cells M3, in the erasing period Te and the erasing compensating period Tec. In addition, the voltage applied to each memory cell is based on a terminal (0V) connected to the word line side.

As shown in FIG. 25, the erasing compensating period Tec is set before the erasing period Te and the erasing compensating action is performed prior to the erasing action in one selected period.

First, a description will be made of the erasing action to be performed later in the one selected period. As shown in FIG. 25, in the erasing period Te, a column erasing voltage having the same voltage as the ground voltage Vss is applied to the selected bit line BLs, a column erasing blocking voltage Ve/2 that is the half of the erasing supply voltage Ve is applied to the unselected bit lines BLu, a row erasing voltage Ve having the same voltage as the erasing supply voltage Ve is applied to the selected word line WLs, and a row erasing blocking voltage Ve/2 that is the half of the erasing supply voltage Ve is applied to the unselected word lines WLu. As a result, the erasing voltage (−Ve) that is the voltage difference (Vbls−Vwls) between the selected bit line BLs and the selected word line WLs is applied to the selected memory cell M0, the erasing blocking voltage (−Ve/2) that is the half of the erasing voltage (−Ve) and the voltage difference (Vblu−Vwls) between the unselected bit lines BLu and the selected word line WLs is applied to the first unselected memory cells M1, the erasing blocking voltage (−Ve/2) that is the half of the erasing voltage (−Ve) and the voltage difference (Vbls−Vwlu) between the selected bit line BLs and the unselected word lines WLu is applied to the second unselected memory cells M2, and 0V that is the voltage difference (Vblu−Vwlu) between the unselected bit lines BLu and the unselected word lines WLu is applied to the third unselected memory cells M3.

These applied voltages in the erasing period Te are shown in formulas 23 collectively (the same as the formulas 5 in the first embodiment).

As a result, in the erasing period Te, erasing is performed in the selected memory cell M0 while erasing is not performed for the first unselected memory cells M1 and the second unselected memory cells M2 because the erasing blocking voltage insufficient for the erasing action is applied to them but the erasing disturbance is generated.

Formulas 23

$Vbls = Vss$ (application of the column erasing voltage $Vss$)

$Vblu = Ve/2$ (application of the column erasing blocking voltage $Ve/2$)

$Vwls = Ve$ (application of the row erasing voltage $Ve$)

$Vwlu = Ve/2$ (application of the row erasing blocking voltage $Ve/2$)

$Vm0 = -Ve$ (erasing of the selected memory cell $M0$)

$Vm1 = -Ve/2$ (erasing disturbance in the first unselected memory cells $M1$)

$Vm2 = -Ve/2$ (erasing disturbance in the second unselected memory cells $M2$)

$Vm3 = 0\,[V]$

Next, a description will be made of the erasing compensating action to be executed first in the one selected period. In the erasing compensating period Tec, the erasing compensating voltage Vec for compensating the erasing disturbance for the first unselected memory cells M1 and the second unselected memory cells M2 to be generated in the following erasing period Te is applied at the same time in one action.

More specifically, as shown in FIG. 25, the programming voltage Vp is applied to the selected bit line BLs, the column programming blocking voltage Vp/2 that is the half of the programming voltage Vp is applied to the unselected bit lines BLu, the ground potential Vss is applied to the selected word line WLs, and the row programming blocking voltage Vp/2 is applied to the unselected word lines WLu.

As a result, the voltage difference (Vbls−Vwls=Vp) between the selected bit line BLs and the selected word line WLs is applied to the selected memory cell M0, the erasing compensating voltage (Vpc=Vp/2) that is the voltage difference (Vblu−Vwls) between the unselected bit lines BLu and the selected word line WLs is applied to the first unselected memory cells M1, the voltage difference (Vbls−Vwlu=Vp/2) between the selected bit line BLs and the unselected word lines WLu is applied to the second unselected memory cells M2, and the voltage difference (Vblu−Vwlu=0V) between the unselected bit lines BLu and the unselected word lines WLu is applied to the third unselected memory cells M3. These applied voltages in the erasing compensating period Tec are shown in formulas 24 collectively.

As a result, since the programming voltage Vp and the erasing voltage (−Ve) have approximately the same or the same absolute value and different polarities, the erasing compensating voltage (Vec=Vp/2) having the same voltage as the erasing blocking voltage (−Ve/2) applied in the erasing period Te and an opposite polarity to it is applied to the first unselected memory cells M1 and the second unselected memory cells M2 in the erasing compensating period Tec, so that the resistance change caused in the erasing period Te is offset and the degree of erasing disturbance generated in the first unselected memory cells M1 and the second unselected memory cells M2 can be reduced.

Formulas 24

$Vbls = Vp$ $Vblu = Vp/2$ $Vwls = Vss$ $Vwlu = Vp/2$ $Vm0 = Vp$ $Vm1 = Vp/2$ (application of the erasing compensating voltage to the first unselected memory cells M1)

$Vm2 = Vp/2$ (application of the erasing compensating voltage to the second unselected memory cells M2)

$Vm3 = 0 [V]$

According to the fourth embodiment, before the erasing action is performed in the erasing period Te, the erasing compensating action is executed by performing the programming action in the erasing compensating period Tec, so that the erasing disturbance is reduced. Therefore, it means that after the programming action has been performed additionally for the selected memory cell M0 that is in the programmed state and will be erased, the erasing action is performed for it. The effect in this point will be described based on experimental data hereinafter.

Figure 26:
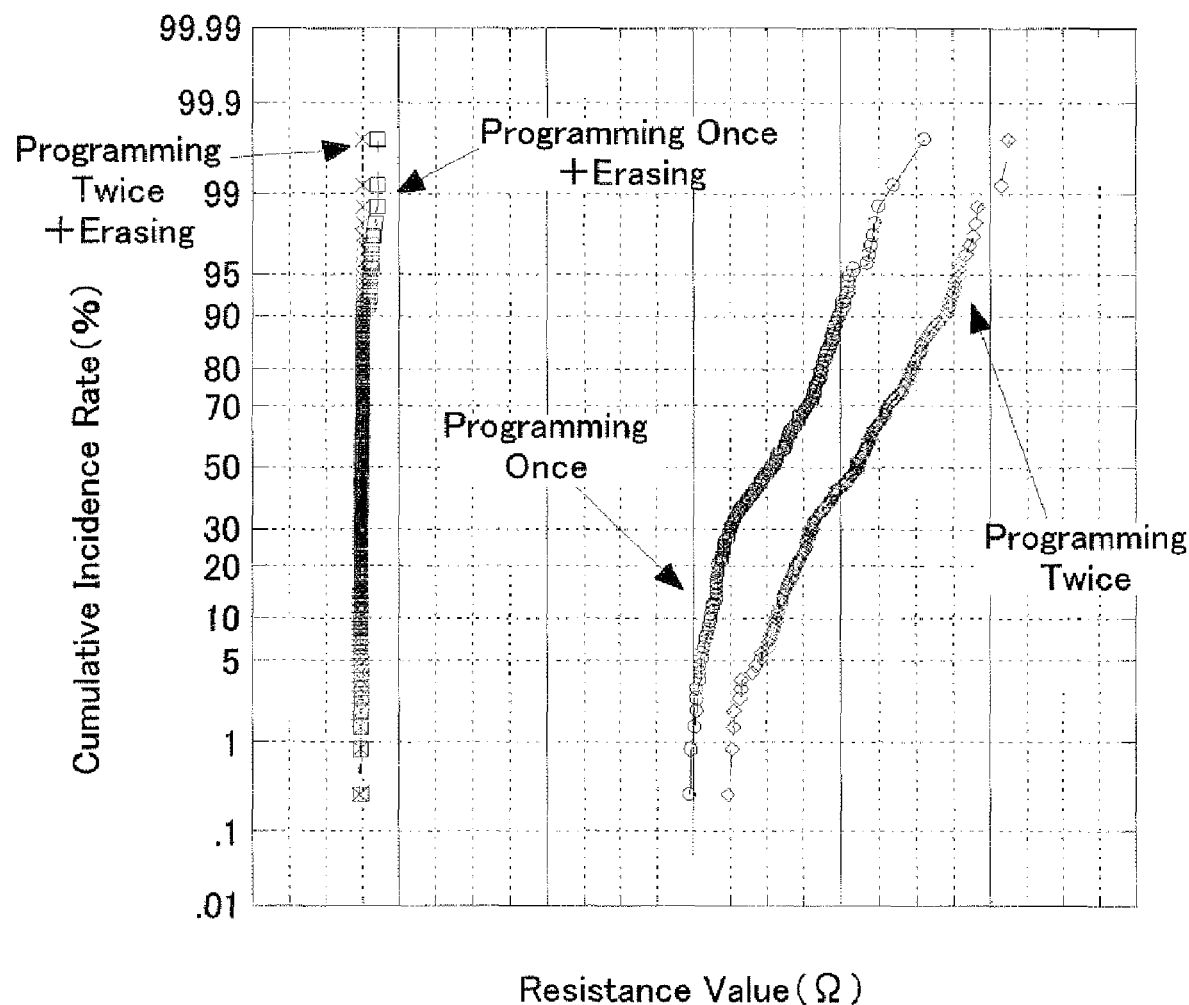
FIG. 26 is a view showing an experimental result provided by examining whether the following erasing action is affected by one additional application of a programming voltage to a memory cell in a programmed state in the cross-point type memory cell array.

FIG. 26 shows an experimental result provided by examining whether the following erasing action is affected or not by the additional application of the programming voltage to the memory cell in the programmed state. FIG. 26 shows the distribution of the resistance value of a memory cell to which an programming voltage pulse was applied once (shown by □ in the drawing), the distribution of the resistance value of a memory cell to which the programming voltage pulse was applied twice (shown by x in the drawing), the distribution of the resistance value of a memory cell to which the programming voltage pulse was applied once and the erasing was performed (shown by ○ in the drawing), and the distribution of the resistance value of a memory cell to which the programming voltage pulse was applied twice and the erasing was performed (shown by ◇ in the drawing). In addition, the vertical axis in FIG. 26 designates cumulative incidence rate.

It can be seen from FIG. 26 that even when the erasing compensating action is performed by the programming action before the erasing action, the resistance value after the programming is hardly changed and the following erasing action is not affected.

In addition, according to the example 10, by adjusting the length of the erasing compensating period Tec such that the erasing compensation can be most highly efficient, the erasing period Te and the erasing compensating period Tec may not be always equal and the absolute values of the erasing compensating voltage (Vec=Vp/2) and the erasing blocking voltage (−Ve/2) need not be always equal.

Other Embodiments

Next, other embodiments of the device of the present invention will be described.

(1) In the above each embodiment, the voltages applied to the selected word line WLs, the unselected word lines WLu, the selected bit line BLs, the unselected bit lines BLu in the programming period, the programming compensating periods, the erasing period, and the erasing compensating periods are relative voltages and not limited to the above embodiments and examples. That is, even when the voltage applied to the selected word line WLs, the unselected word lines WLu, the selected bit line BLs and the unselected bit lines BLu are increased or decreased by the same voltage, the voltage applied to the selected memory cell M0, the first to third unselected memory cells M1, M2 and M3 are not changed.

(2) Although the description has been made of the case where the first programming compensating period Tpc1 and the second programming compensating period Tpc2 and the third programming compensating period Tpc3 are almost the same or the same length as the programming period Tp in the example 7 of the third embodiment, the first programming compensating period Tpc1 and the second programming compensating period Tpc2 and the third programming compensating period Tpc3 may be shorter than the programming period Tp and the absolute value of the programming compensating voltage applied to the first to third unselected memory cells M1, M2 and M3 may be increased like in the example 5 of the second embodiment with respect to the example 1 of the first embodiment.

In addition, although the description has been made of the case where the first erasing compensating period Tec1 and the second erasing compensating period Tec2 and the third erasing compensating period Tec3 are almost the same or the same length as the erasing period Te in the example 8 of the third embodiment, the first erasing compensating period Tec1 and the second erasing compensating period Tec2 and the third erasing compensating period Tec3 may be shorter than the erasing period Te and the absolute value of the erasing compensating voltage applied to the first to third unselected memory cells M1, M2 and M3 may be increased like in the example 6 of the second embodiment with respect to the example 3 of the first embodiment.

Figure 27:
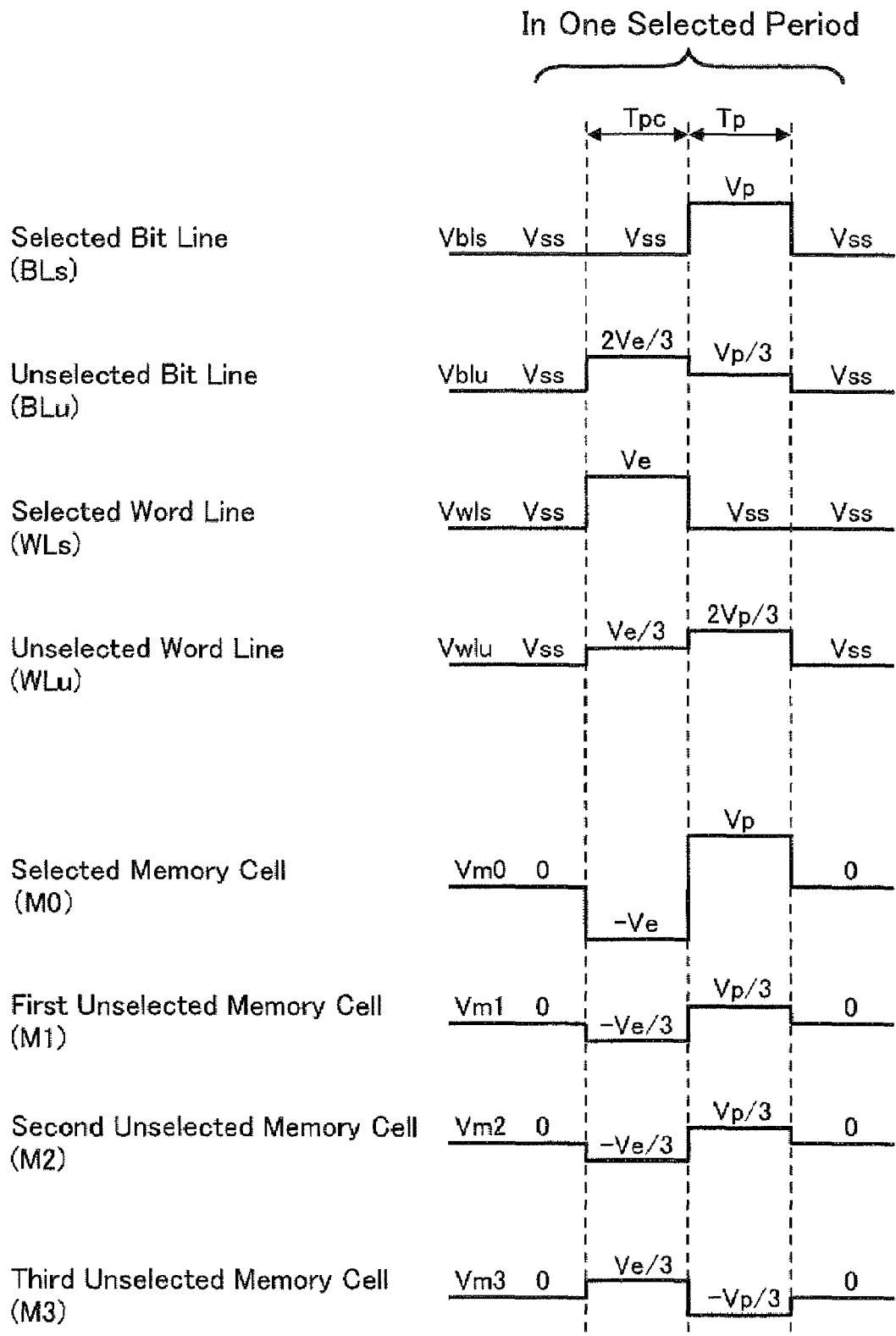
FIG. 27 is a timing chart showing one example of a voltage applying process to each word line and each bit line and a voltage applied state in each memory cell at the time of a data programming action in a nonvolatile semiconductor memory device according to another embodiment of the example 9 of the present invention.

(3) Although in the programming action in the programming period Tp, both the row programming blocking voltage Vp/2 and the column programming blocking voltage Vp/2 are the same half voltage of the programming voltage Vp and in the erasing action in the programming compensating period Tpc, both the row erasing blocking voltage Ve/2 and the column erasing blocking voltage Ve/2 are the same half voltage of the erasing voltage Ve in the example 9 of the fourth embodiment, voltage applying conditions of the programming action and erasing action may be the voltage applying condition of the programming action in the programming period Tp in the example 7 of the third embodiment and the voltage applying condition of the erasing action in the erasing period Te in the example 8 of the third embodiment, respectively. The voltage applying condition in this case is as shown in FIG. 27.

Figure 28:
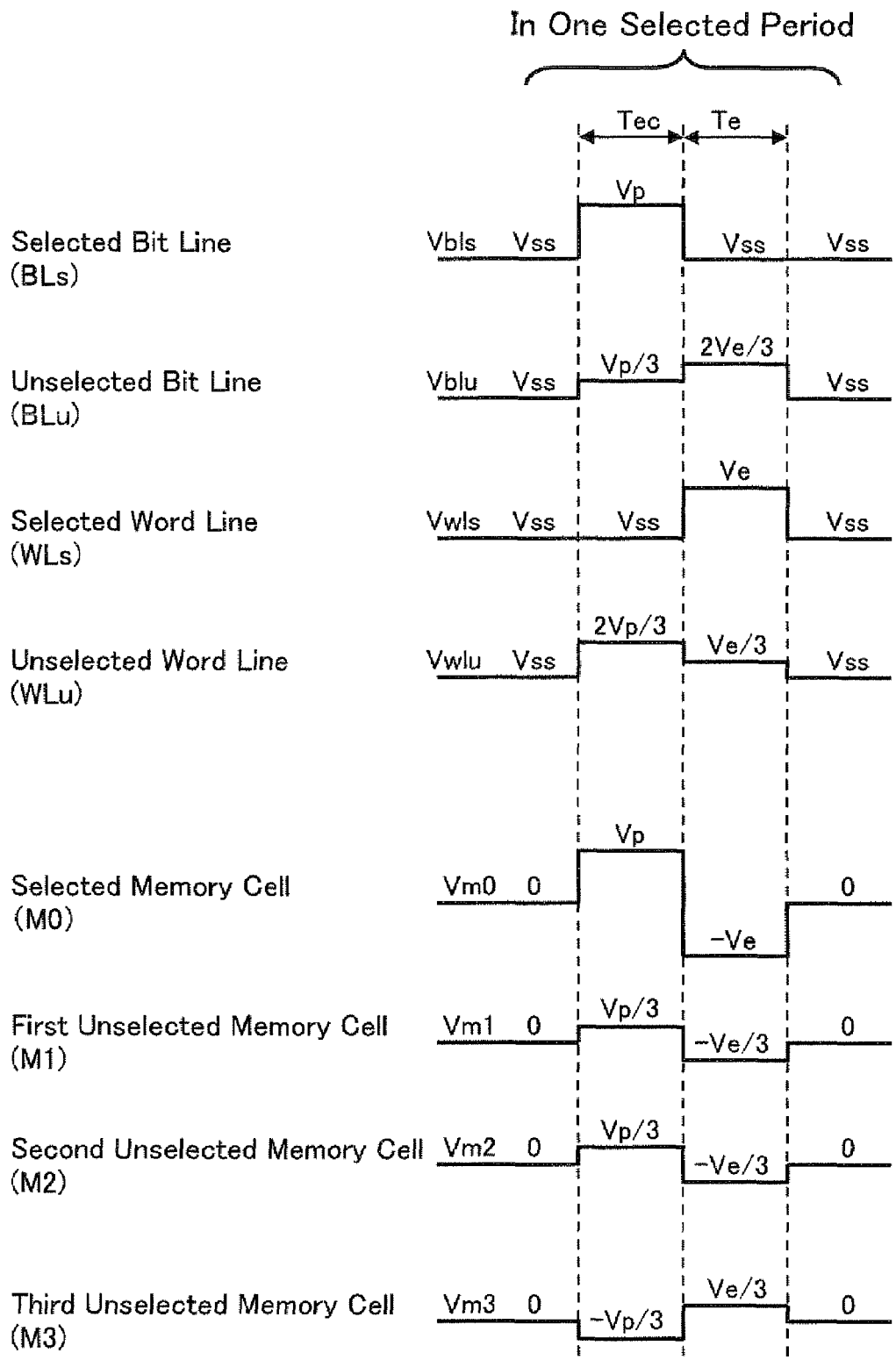
FIG. 28 is a timing chart showing one example of a voltage applying process to each word line and each bit line and a voltage applied state in each memory cell at the time of a data erasing action in a nonvolatile semiconductor memory device according to another embodiment of the example 10 of the present invention.

In addition, although in the erasing action in the erasing period Te, both the row erasing blocking voltage Ve/2 and the column erasing blocking voltage Ve/2 are the same half voltage of the erasing voltage Ve and in the programming action in the erasing compensating period Tec, both the row programming blocking voltage Vp/2 and the column programming blocking voltage Vp/2 are the same half voltage of the programming voltage Vp in the example 10 of the fourth embodiment, voltage applying conditions of the programming action and erasing action may be the voltage applying condition of the programming action in the programming period Tp in the example 7 of the third embodiment and the voltage applying condition of the erasing action in the erasing period Te in the example 8 of the third embodiment, respectively. The voltage applying condition in this case is as shown in FIG. 28.

INDUSTRIAL APPLICABILITY

The nonvolatile semiconductor memory device according to one or more embodiments of the present invention can be applied to a semiconductor memory device having a cross-point type memory cell array in which memory cells each having a variable resistance element storing information by the change of an electric resistance are arranged in a row direction and column direction, and it is advantageously used in preventing stored data from deteriorating due to programming and erasing actions for the memory cell array.

The invention claimed is:

1. A nonvolatile semiconductor memory device, comprising:
   a memory cell array including
      memory cells each having a variable resistance element storing information by a change of an electric resistance, the memory cells being in row and column directions,
      a plurality of word lines extending in the row direction, each word line connecting first ends of the memory cells in a same row, and
      a plurality of bit lines extending in the column direction, each bit line connecting second ends of the memory cells in a same column;
   a memory cell selecting circuit structured to select a word line and a bit line from the plurality of word lines and the plurality of bit lines such that a memory cell whose first and second ends connected to the selected word line and the selected bit line is selected; and
   a programming voltage applying circuit structured to apply
      a row programming voltage to the selected word line,
      a column programming voltage to the selected bit line,
      a row programming blocking voltage to unselected word lines, and
      a column programming blocking voltage to unselected bit lines
      so as to apply a programming voltage sufficient for programming the selected memory cell only, and
   wherein the programming voltage applying circuit is structured to apply a programming compensating voltage to each of unselected memory cells, the programming compensating voltage having an opposite polarity to that of a programming disturbance which is a voltage applied to each of the unselected memory cells while the programming voltage is applied to the selected memory cell.

2. The nonvolatile semiconductor memory device according to claim 1, wherein the programming voltage applying circuit applies the programming voltage to the selected memory cell and applies the programming compensating voltage to the unselected memory cells in a time-division manner in one selected period until the memory cell selecting circuit switches selection of the memory cell to another selected memory cell.

3. The nonvolatile semiconductor memory device according to claim 2, wherein the programming voltage applying circuit applies the programming compensating voltage to first unselected memory cells which are the unselected memory cells connected to the selected word line and to second unselected memory cells which are the unselected memory cells connected to the selected bit line, separately or at a time in a programming compensation period in the one selected period.

4. The nonvolatile semiconductor memory device according to claim 3, wherein the programming voltage applying circuit applies the programming voltage to the selected memory cell and applies the programming compensating voltage to the unselected memory cells in the one selected period by changing voltages applied to the selected word line and the selected bit line without changing voltages applied to the unselected word lines and the unselected bit lines.

5. The nonvolatile semiconductor memory device according to claim 2, wherein the row programming blocking voltage is substantially equal to the column programming blocking voltage are substantially equal to a voltage half way between the row programming voltage and the column programming voltage.

6. The nonvolatile semiconductor memory device according to claim 5, wherein the programming voltage applying circuit executes application of the programming compensating voltage to the unselected memory cells in the one selected period in a time-division manner the application of the programming compensating voltage being divided into application to first unselected memory cells each having the first and second ends connected to the selected word line and the unselected bit line, respectively, and application to second unselected memory cells each having the first and second ends connected to the unselected word line and the selected bit line, respectively.

7. The nonvolatile semiconductor memory device according to claim 2, wherein the row programming blocking voltage and the column programming blocking voltage are different from each other and are between the row programming voltage and the column programming voltage.

8. The nonvolatile semiconductor memory device according to claim 7, wherein
   one of the row programming blocking voltage and the column programming blocking voltage is higher than a lower one of the row programming voltage and the column programming voltage by one third of an absolute value of a voltage difference between the row programming voltage and the column programming voltage, and
   other of the row programming blocking voltage and the column programming blocking voltage is lower than a higher one of the row programming voltage and the column programming voltage by one third of the absolute value of voltage difference between the row programming voltage and the column programming voltage.

9. The nonvolatile semiconductor memory device according to claim 7, wherein the programming voltage applying circuit executes application of the programming compensating voltage to the unselected memory cells in the one selected period in a time-division manner, the application of the programming compensating voltage being divided into application to first unselected memory cells each having the first and second ends connected to the selected word line and unselected bit line, respectively, application to second unselected memory cells each having the first and second ends connected to the unselected word line and the selected bit line, respectively, and application to third unselected memory cells each having the first and second ends connected to the unselected word and bit lines, respectively.

10. The nonvolatile semiconductor memory device according to claim 1, wherein
   an absolute value of the programming compensating voltage is the same as that of a voltage applied to each of the unselected memory cells in accordance with application of the programming voltage to the selected memory cell, and an applying period of the programming voltage to the selected memory cell is substantially equal in length to that of the programming compensating voltage to each of the unselected memory cells.

11. The nonvolatile semiconductor memory device according to claim 1, wherein an absolute value of the programming compensating voltage is greater than that of a voltage applied to each of the unselected memory cells in accordance with application of the programming voltage to the selected memory cell, and an applying period of the programming voltage to the selected memory cell is longer than that of the programming compensating voltage to each of the unselected memory cells.

12. The nonvolatile semiconductor memory device according to claim 1, wherein the programming voltage applying circuit applies the programming compensating voltage to the unselected memory cells each having the first end connected to the selected word line and the unselected memory cells each having the second end connected to the selected bit line at the same time.

13. The nonvolatile semiconductor memory device according to claim 1, comprising:

an erasing voltage applying circuit structured to apply
a row erasing voltage to the selected word line,
a column erasing voltage to the selected bit line,
a row erasing blocking voltage to the unselected word lines, and
a column erasing blocking voltage to the unselected bit lines,
so as to apply a erasing voltage sufficient for erasing the selected memory cell only, wherein the erasing voltage applying circuit is structured to apply an erasing compensating voltage to each of the unselected memory cells, the erasing compensating voltage having an opposite polarity to that of an erasing disturbance which is a voltage applied to each of the unselected memory cells while the erasing voltage is applied to the selected memory cell.

14. The nonvolatile semiconductor memory device according to claim 13, wherein the erasing voltage applying circuit applies the erasing voltage to the selected memory cell and applies the erasing compensating voltage to the unselected memory cells in a time-division manner in one selected period until the memory cell selecting circuit switches selection of the memory cell to another selected memory cell.

15. The nonvolatile semiconductor memory device according to claim 14, wherein the erasing voltage applying circuit applies the erasing compensating voltage to first unselected memory cells which are the unselected memory cells connected to the selected word line and to second unselected memory cells which are the unselected memory cells connected to the selected bit line, separately or at a time in a erasing compensating period in the one selected period.

16. The nonvolatile semiconductor memory device according to claim 15, wherein the erasing voltage applying circuit applies the erasing voltage to the selected memory cell and applies the erasing compensating voltage to the unselected memory cells in the one selected period by changing voltages applied to the selected word line and the selected bit line without changing voltages applied to the unselected word lines and the unselected bit lines.

17. The nonvolatile semiconductor memory device according to claim 14, wherein the row erasing blocking voltage is substantially equal to the column erasing blocking voltage and are substantially equal to a voltage half way between the row erasing voltage and the column erasing voltage.

18. The nonvolatile semiconductor memory device according to claim 17, wherein the erasing voltage applying circuit executes application of the erasing compensating voltage to the unselected memory cells in the one selected period in a time-division manner, the application of the erasing compensating voltage being divided into application to first unselected memory cells each having the first and second ends connected to the selected word line and the unselected bit line, respectively, and application to second unselected memory cells each having the first and second ends connected to the unselected word line and the first selected bit line, respectively.

19. The nonvolatile semiconductor memory device according to claim 14, wherein the row erasing blocking voltage and the column erasing blocking voltage are different from each other and are between the row erasing voltage and the column erasing voltage.

20. The nonvolatile semiconductor memory device according to claim 19, wherein one of the row erasing blocking voltage and the column erasing blocking voltage is higher than a lower one of the row erasing voltage and the column erasing voltage by one third of an absolute value of voltage difference between the row erasing voltage and the column erasing voltage, and other of the row erasing blocking voltage and the column erasing blocking voltage is lower than a higher one of the row erasing voltage and the column erasing voltage by one third of the absolute value of voltage difference between the row erasing voltage and the column erasing voltage.

21. The nonvolatile semiconductor memory device according to claim 19, wherein the erasing voltage applying circuit executes application of the erasing compensating voltage to the unselected memory cells in a time-division manner in the one selected period, the application of the erasing compensating voltage being divided into application to first unselected memory cells each having the first and second ends connected to the selected word line and unselected bit line, respectively, application to second unselected memory cells each having the first and second ends connected to the unselected word line and the selected bit line, respectively, and application to third unselected memory cells each having the first and second ends connected to the unselected word and bit lines, respectively.

22. The nonvolatile semiconductor memory device according to claim 13, wherein an absolute value of the erasing compensating voltage is same as that of a voltage applied to each of the unselected memory cells in accordance with application of the erasing voltage to the selected memory cell, and an applying period of the erasing voltage to the selected memory cell is equal in length to that of the erasing compensating voltage to each of the unselected memory cells.

23. The nonvolatile semiconductor memory device according to claim 13, wherein an absolute value of the erasing compensating voltage is greater than that of a voltage applied to each of the unselected memory cells in accordance with application of the erasing voltage to the selected memory cell, and an applying period of the erasing voltage to the selected memory cell is longer than that of the erasing compensating voltage to each of the unselected memory cells.

24. The nonvolatile semiconductor memory device according to claim 13, wherein the erasing voltage applying circuit applies the erasing compensating voltage to the unselected memory cells each having the first end connected to the selected row line and the unselected memory cells each having the second end connected to the selected bit line at a same time.

25. The nonvolatile semiconductor memory device according to claim 1, wherein the variable resistance element is a metal oxide whose electric resistance is reversibly changed by application of an electric pulse.

* * * * *